(12) United States Patent
Yamazaki et al.

(10) Patent No.: US 12,490,475 B2
(45) Date of Patent: Dec. 2, 2025

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yoshihiro Komatsu, Kanagawa (JP); Toshikazu Ohno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 18/598,184

(22) Filed: Mar. 7, 2024

(65) Prior Publication Data
US 2024/0355932 A1 Oct. 24, 2024

Related U.S. Application Data

(63) Continuation of application No. 17/278,828, filed as application No. PCT/IB2019/058318 on Oct. 1, 2019, now Pat. No. 11,935,964.

(30) Foreign Application Priority Data

Oct. 12, 2018 (JP) ................. 2018-193074

(51) Int. Cl.
*H10D 30/67* (2025.01)
*H10D 84/00* (2025.01)
(Continued)

(52) U.S. Cl.
CPC ......... *H10D 30/6756* (2025.01); *H10D 84/00* (2025.01); *H10D 84/0128* (2025.01);
(Continued)

(58) Field of Classification Search
CPC .... H10D 30/6756; H10D 84/00; H10D 86/60; H10D 84/0128; H10D 84/038; H10D 86/423
See application file for complete search history.

(56) References Cited

U.S. PATENT DOCUMENTS 6,168,980 B1 * 1/2001 Yamazaki ........... H01L 21/3144
438/162
9,130,043 B2 9/2015 Akimoto
(Continued)

FOREIGN PATENT DOCUMENTS

| CN | 108352411 A | 7/2018 |
|----|-------------|--------|
| JP | 2005-123576 A | 5/2005 |

(Continued)

OTHER PUBLICATIONS

International Search Report (Application No. PCT/IB2019/058318) Dated Dec. 17, 2019.
(Continued)

*Primary Examiner* — Richard A Booth
(74) *Attorney, Agent, or Firm* — NIXON PEABODY LLP; Jeffrey L. Costellia

(57) ABSTRACT

A semiconductor device having high reliability is provided. The semiconductor device includes a transistor and an insulator placed so as to surround the transistor; the insulator has a barrier property against hydrogen; the transistor includes an oxide and a conductor, the conductor includes nitrogen and a metal; the conductor has a physical property of extracting hydrogen; the conductor includes a region having a hydrogen concentration higher than or equal to $2.0\times10^{19}$ atoms/cm$^3$ and lower than or equal to $1.0\times10^{21}$ atoms/cm$^3$; and at least part of hydrogen atoms included in the region is bonded to a nitrogen atom.

12 Claims, 25 Drawing Sheets

(51) Int. Cl.
*H10D 84/01* (2025.01)
*H10D 84/03* (2025.01)
*H10D 86/40* (2025.01)
*H10D 86/60* (2025.01)

(52) U.S. Cl.
CPC ......... *H10D 84/038* (2025.01); *H10D 86/423* (2025.01); *H10D 86/60* (2025.01)

(56) References Cited

U.S. PATENT DOCUMENTS

| | | | |
|---|---|---|---|
| 9,318,615 B2 | 4/2016 | Ohguro et al. | |
| 9,343,578 B2 | 5/2016 | Yamazaki et al. | |
| 9,502,434 B2 | 11/2016 | Tanaka et al. | |
| 9,698,276 B2 | 7/2017 | Yamazaki | |
| 9,780,220 B2 | 10/2017 | Maeda et al. | |
| 10,103,276 B2 | 10/2018 | Imazawa et al. | |
| 11,935,964 B2 * | 3/2024 | Yamazaki | H10D 86/60 |
| 2003/0193052 A1 | 10/2003 | Nakazawa et al. | |
| 2008/0191213 A1 | 8/2008 | Bae et al. | |
| 2010/0159639 A1 | 6/2010 | Sakata | |
| 2011/0079777 A1 | 4/2011 | Akimoto | |
| 2013/0099232 A1 | 4/2013 | Cho et al. | |
| 2014/0027764 A1 | 1/2014 | Yamazaki et al. | |
| 2014/0183529 A1 | 7/2014 | Yamazaki et al. | |
| 2014/0183530 A1 | 7/2014 | Yamazaki et al. | |
| 2014/0334596 A1 | 11/2014 | Kimura et al. | |
| 2015/0179814 A1 * | 6/2015 | Xianyu | H10D 30/6741 438/164 |
| 2015/0187948 A1 | 7/2015 | Misaki | |
| 2015/0303217 A1 | 10/2015 | Tanaka et al. | |
| 2015/0340508 A1 | 11/2015 | Akimoto | |
| 2015/0364513 A1 | 12/2015 | Takahashi et al. | |
| 2016/0035865 A1 | 2/2016 | Nagamatsu et al. | |
| 2016/0086792 A1 | 3/2016 | Shimomura et al. | |
| 2016/0155850 A1 | 6/2016 | Yamazaki | |
| 2016/0233235 A1 | 8/2016 | Miyairi et al. | |
| 2016/0276370 A1 | 9/2016 | Miyairi et al. | |
| 2018/0233594 A1 | 8/2018 | Imazawa et al. | |
| 2020/0075769 A1 | 3/2020 | Yamazaki et al. | |
| 2020/0227561 A1 | 7/2020 | Yamazaki | |
| 2020/0279951 A1 | 9/2020 | Hodo et al. | |
| 2020/0343244 A1 | 10/2020 | Onuki et al. | |
| 2021/0050052 A1 | 2/2021 | Okamoto et al. | |
| 2021/0167211 A1 | 6/2021 | Yamazaki et al. | |

FOREIGN PATENT DOCUMENTS

| | | |
|---|---|---|
| JP | 2011-097032 A | 5/2011 |
| JP | 2014-143408 A | 8/2014 |
| JP | 2014-143410 A | 8/2014 |
| JP | 2015-162633 A | 9/2015 |
| JP | 2015-195277 A | 11/2015 |
| JP | 2015-213164 A | 11/2015 |
| JP | 2016-111352 A | 6/2016 |
| KR | 2012-0081978 A | 7/2012 |
| KR | 2016-0144492 A | 12/2016 |
| KR | 2017-0086546 A | 7/2017 |
| TW | 201135929 | 10/2011 |
| TW | 201603128 | 1/2016 |
| TW | 201626567 | 7/2016 |
| WO | WO-2011/040213 | 4/2011 |
| WO | WO-2014/017406 | 1/2014 |
| WO | WO-2015/159179 | 10/2015 |
| WO | WO-2016/083952 | 6/2016 |
| WO | WO-2017/073097 | 5/2017 |
| WO | WO-2020/053697 | 3/2020 |
| WO | WO-2020/115604 | 6/2020 |

OTHER PUBLICATIONS

Written Opinion (Application No. PCT/IB2019/058318) Dated Dec. 17, 2019.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10, The Japan Society of Applied Physics.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

1471

1472

1473

1474

1475

1476

1477

1478

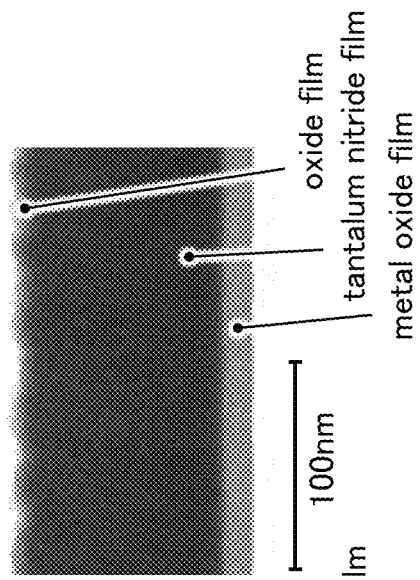
FIG. 21A
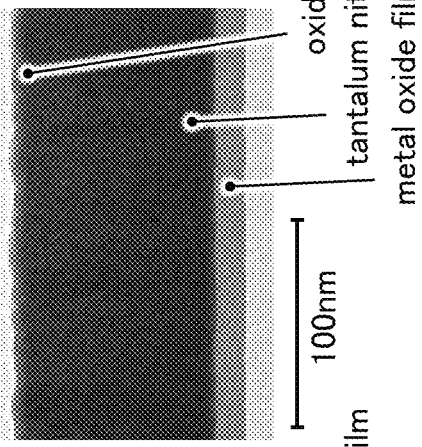
FIG. 21B
FIG. 21C
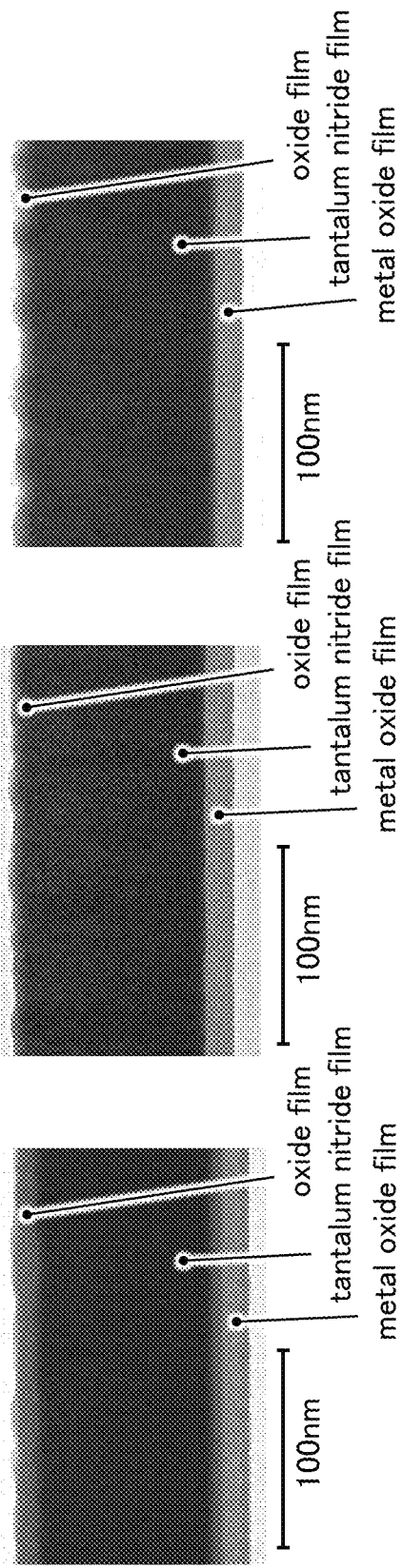
FIG. 21D
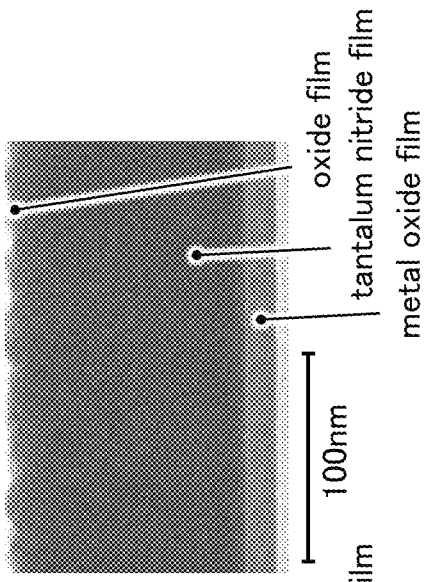
FIG. 21E
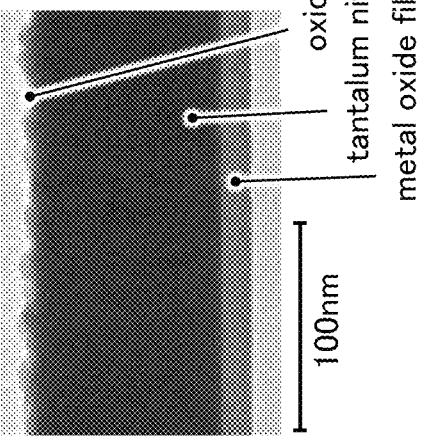

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique for forming a transistor with use of a semiconductor thin film formed over a substrate having an insulating surface has attracted attention. The transistor is applied to a wide range of electronic devices such as an integrated circuit (IC) or an image display device (also simply referred to as a display device). A silicon-based semiconductor material is widely known as a material for a semiconductor thin film that can be used in a transistor, and as another material, an oxide semiconductor has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2). Non-Patent Document 1 and Non-Patent Document 2 disclose a technique for manufacturing a transistor with use of an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

SUMMARY OF THE INVENTION

Problems to be Solved by the Invention

An object of one embodiment of the present invention is to provide a semiconductor device having high reliability. Another object of one embodiment of the present invention is to provide a semiconductor device having excellent electrical characteristics. Another object of one embodiment of the present invention is to provide a semiconductor device having a high on-state current. Another object of one embodiment of the present invention is to provide a semiconductor device that can be miniaturized or highly integrated. Another object of one embodiment of the present invention is to provide a semiconductor device having low power consumption.

Note that the description of these objects does not preclude the existence of other objects. Note that one embodiment of the present invention does not necessarily achieve all of these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a transistor and an insulator placed so as to surround the transistor; the insulator has a barrier property against hydrogen; the transistor includes an oxide and a conductor; the conductor includes nitrogen and a metal; the conductor has a physical property of extracting hydrogen; the conductor includes a region having a hydrogen concentration higher than or equal to $2.0 \times 10^{19}$ atoms/$cm^3$ and lower than or equal to $1.0 \times 10^{21}$ atoms/$cm^3$; and at least part of hydrogen atoms included in the region is bonded to a nitrogen atom.

One embodiment of the present invention is a semiconductor device including a transistor and an insulator placed so as to surround the transistor; the insulator has a barrier property against hydrogen; the transistor includes an oxide and a conductor; the oxide includes a channel formation region; the conductor includes nitrogen and a metal; the conductor has a physical property of extracting hydrogen; the conductor includes a region having a hydrogen concentration higher than that in the channel formation region; and at least part of hydrogen atoms included in the region is bonded to a nitrogen atom.

One embodiment of the present invention is a semiconductor device including a transistor, a conductor, and an insulator placed so as to surround the transistor and the conductor; the insulator has a barrier property against hydrogen; the transistor includes an oxide; the conductor includes nitrogen and a metal; the conductor has a physical property of extracting hydrogen; the conductor includes a region having a hydrogen concentration higher than or equal to $2.0 \times 10^{19}$ atoms/$cm^3$ and lower than or equal to $1.0 \times 10^{21}$ atoms/$cm^3$; and at least part of hydrogen atoms included in the region is bonded to a nitrogen atom.

One embodiment of the present invention is a semiconductor device including a plurality of transistors and an insulator placed so as to surround the plurality of transistors; the insulator has a barrier property against hydrogen; the transistors include an oxide and a conductor; the conductor includes nitrogen and a metal; the conductor has a physical property of extracting hydrogen; the conductor includes a region having a hydrogen concentration higher than or equal to $2.0 \times 10^{19}$ atoms/$cm^3$ and lower than or equal to $1.0 \times 10^{21}$ atoms/$cm^3$; and at least part of hydrogen atoms included in the region is bonded to a nitrogen atom.

In the above semiconductor device, heat treatment is preferably performed at higher than or equal to 350° C. and lower than or equal to 700° C. after the insulator is formed, so that hydrogen in the oxide is absorbed by the insulator.

In the above semiconductor device, the metal is preferably tantalum.

In the above semiconductor device, the insulator preferably includes nitrogen and silicon.

In the above semiconductor device, the oxide preferably includes indium, an element M (M is aluminum, gallium, yttrium, or tin), and zinc.

Another embodiment of the present invention is a semiconductor device including a first insulator, a first oxide over the first insulator, a second oxide, a second conductor, and a third conductor which are over the first oxide, a second insulator over the second oxide, a fourth conductor over the second insulator, and a third insulator over the fourth conductor; each of the first insulator and the third insulator has a barrier property against hydrogen; the third insulator includes a first region in contact with the first insulator; each of the second conductor and the third conductor includes nitrogen and a metal; each of the second conductor and the third conductor has a physical property of extracting hydrogen; each of the second conductor and the third conductor includes a second region having a hydrogen concentration higher than or equal to $2.0 \times 10^{19}$ atoms/cm$^3$ and lower than or equal to $1.0 \times 10^{21}$ atoms/cm$^3$; and at least part of hydrogen atoms included in the second region is bonded to a nitrogen atom.

In the above semiconductor device, the metal is preferably tantalum.

In the above semiconductor device, each of the first insulator and the third insulator preferably includes nitrogen and silicon.

In the above semiconductor device, the first oxide preferably includes indium, an element M (M is aluminum, gallium, yttrium, or tin), and zinc.

Effect of the Invention

According to one embodiment of the present invention, a semiconductor device having high reliability can be provided. According to another embodiment of the present invention, a semiconductor device having excellent electrical characteristics can be provided. According to another embodiment of the present invention, a semiconductor device having a high on-state current can be provided. According to another embodiment of the present invention, a semiconductor device that can be miniaturized or highly integrated can be provided. According to another embodiment of the present invention, a semiconductor device having low power consumption can be provided.

Note that the description of these effects does not preclude the existence of other effects. Note that one embodiment of the present invention does not necessarily have all of these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 21A to FIG. 21E are cross-sectional STEM images of samples in Example.

MODE FOR CARRYING OUT THE INVENTION

Figure 1A:
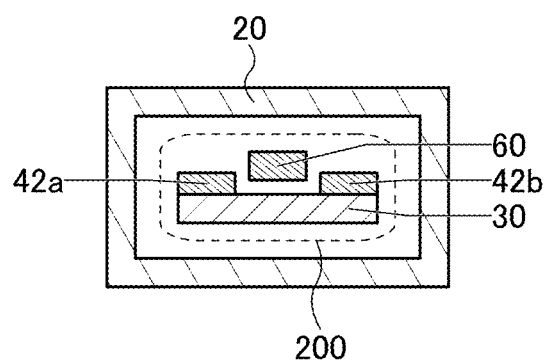
FIG. 1A to FIG. 1C are schematic views illustrating a semiconductor device according to the present invention.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

Note that in the drawings, the size, the layer thickness, or the region is exaggerated for clarity in some cases. Therefore, the size, the layer thickness, or the region is not limited to the illustrated scale. Note that the drawings schematically show ideal examples, and embodiments of the present invention are not limited to shapes, values, or the like shown in the drawings. For example, in the actual manufacturing process, a layer, a resist mask, or the like might be unintentionally reduced in size by treatment such as etching, which is not reflected in the drawings in some cases for easy understanding. In the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

In this specification and the like, the ordinal numbers such as first and second are used for convenience and do not denote the order of steps or the stacking order of layers. Therefore, for example, description can be made when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is disclosed in the drawings or the texts. Here, X and Y denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Functions of a source and a drain might be switched when a transistor of opposite polarity is employed or a direction of current is changed in circuit operation. Therefore, the terms "source" and "drain" can be interchanged with each other in this specification and the like in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions are not necessarily the same. In other words, the channel length of one transistor is not fixed to one value in some cases. Thus, in this specification and the like, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification and the like, the channel width is any one of the values, the maximum value, the minimum value, or the average value in a channel formation region.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. For example, oxygen vacancies are formed in an oxide semiconductor in some cases by entry of impurities.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that a drain current per micrometer of channel width flowing through a transistor when no potential is applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

In this embodiment, a structure of a semiconductor device of one embodiment of the present invention will be described with reference to FIG. 1A to FIG. 1C.

FIG. 1A is a cross-sectional schematic view of the semiconductor device of one embodiment of the present invention. The semiconductor device of one embodiment of the present invention includes a transistor 200 and an insulator 20 placed so as to surround the transistor 200.

Note that a structure in which the insulator 20 surrounds the transistor 200 refers to a structure in which the insulator 20 is provided so as to be positioned on at least part of a top surface of the transistor 200, at least part of a side surface thereof, and at least part of a bottom surface thereof. In particular, the insulators 20 are further preferably provided to face each other with the transistor 200 interposed therebetween. For example, it is preferable that the insulators 20 be placed over and under the insulator 20 at the center, or that the insulators 20 be placed on the right and left of the insulator 20 at the center.

FIG. 1A illustrates the structure in which the insulator 20 surrounds the outer surface of the transistor 200 entirely; however, the structure is not limited thereto. The insulator 20 may include a region not overlapping with part of the transistor 200. In addition, another component may be positioned between the insulator 20 and the transistor 200. Examples of another component include a conductor connected to the transistor 200 and an insulator protecting the transistor 200.

The transistor 200 also includes an oxide 30, a conductor 42 (a conductor 42*a* and a conductor 42*b*) in contact with part of the oxide 30, and a conductor 60 including a region that overlaps with the oxide 30. The oxide 30 includes a channel formation region of the transistor 200. The conductor 60 functions as a gate electrode of the transistor 200, and the conductor 42 functions as a source electrode or a drain electrode of the transistor 200.

In the transistor 200, a metal oxide functioning as a semiconductor (hereinafter, also referred to as an oxide semiconductor) is preferably used as the oxide 30 including the channel formation region. When the metal oxide is used in a channel formation region of a transistor, a transistor having high field-effect mobility can be achieved. In addition, a transistor having high reliability can be achieved.

The transistor using the metal oxide in the channel formation region has an extremely low leakage current (off-state current) in a non-conduction state; thus, a semiconductor device with low power consumption can be provided. The metal oxide can be deposited by a sputtering method or the like, and thus can be used for a transistor included in a highly integrated semiconductor device. Note that details of the metal oxide (the oxide semiconductor) will be described later.

Entry of impurities into the metal oxide forms defect states or oxygen vacancies ($V_O$) in some cases. Thus, when impurities enter a channel formation region of the metal oxide, the electrical characteristics of a transistor using the metal oxide are likely to vary and its reliability is degraded in some cases.

The above-described defect states include trap states in some cases. Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, a reduction in the impurity concentration in the metal oxide is effective in stabilizing the electrical characteristics of the transistor. In addition, in order to reduce the impurity concentration in the metal oxide, the impurity concentration in an adjacent film is also preferably reduced. Examples of impurities in the metal oxide include hydrogen, nitrogen, an alkali metal, an alkaline earth metal, iron, nickel, and silicon.

In particular, hydrogen contained in a metal oxide reacts with oxygen bonded to a metal atom to be water, and thus forms oxygen vacancies in the metal oxide in some cases. When the channel formation region in the metal oxide includes oxygen vacancies, the transistor is likely to have normally-on characteristics. Moreover, a defect caused by entry of hydrogen into an oxygen vacancy (also denoted as $V_OH$) functions as a donor and generates an electron serving as a carrier in some cases. In other cases, bonding of part of hydrogen to oxygen bonded to a metal atom generates an electron serving as a carrier. Thus, a transistor using a metal oxide containing a high concentration of hydrogen is likely to have normally-on characteristics.

Thus, the conductor 42 (the conductor 42a and the conductor 42b) is preferably formed using a conductive material with a property that allows hydrogen to be easily diffused into the conductor 42, further preferably a conductive material with a property that allows hydrogen in the oxide 30 to be easily diffused into the conductor 42. When hydrogen in the oxide 30 is diffused into the conductor 42, the hydrogen concentration in the oxide 30 is reduced and the transistor 200 can have stable electrical characteristics. Note that in this specification and the like, ease of diffusion of hydrogen in an oxide into a conductor is sometimes expressed by a phrase "the conductor is likely to extract (absorb) hydrogen in the oxide".

As a conductor with the above conductive material, for example, a conductive metal nitride is preferably used. Examples of the metal nitride include a nitride containing tantalum, a nitride containing titanium, a nitride containing molybdenum, a nitride containing tungsten, a nitride containing tantalum and aluminum, and a nitride containing titanium and aluminum. In one embodiment of the present invention, a nitride containing tantalum is particularly preferable. The nitride containing tantalum preferably satisfies a composition formula TaNx (x is a real number greater than 0 and less than or equal to 1.67). The nitride containing tantalum may contain oxygen. Thus, the nitride containing tantalum includes metal tantalum, tantalum nitride, tantalum nitride oxide, tantalum oxynitride, or the like.

When the above metal nitride is used for the conductor 42, hydrogen in the oxide 30 is diffused into the conductor 42 in a heat treatment step after the formation of a conductive film to be the conductor 42, whereby the hydrogen concentration in the oxide 30 can be reduced.

Hydrogen diffused into the metal nitride sometimes remains in the metal nitride. Part of hydrogen diffused into the metal nitride is bonded as a hydrogen atom to a nitrogen atom in the metal nitride. The hydrogen atom bonded to the nitrogen atom is unlikely to be diffused and easily remains in the metal nitride. In other words, hydrogen is absorbed (gettered) by the metal nitride in some cases.

Note that since hydrogen in the oxide 30 is absorbed by the conductor 42 in the above heat treatment, the conductor 42 has a region where the hydrogen concentration is higher than that before the heat treatment. Specifically, in the case where the heat treatment step after the formation of the conductive film to be the conductor 42 is performed at higher than or equal to 350° C. and lower than or equal to 700° C., the conductor 42 has a region where the hydrogen concentration obtained by SIMS is higher than or equal to $1\times10^{19}$ atoms/cm$^3$ and lower than or equal to $1\times10^{22}$ atoms/cm$^3$, higher than or equal to $1.5\times10^{19}$ atoms/cm$^3$ and lower than or equal to $5\times10^{21}$ atoms/cm$^3$, or higher than or equal to $2\times10^{19}$ atoms/cm$^3$ and lower than or equal to $1\times10^{21}$ atoms/cm$^3$.

In other cases, hydrogen in the oxide 30 passes through the conductor 42 and is released to a structure body provided around the conductor 42, a component positioned between the transistor 200 and the insulator 20, or the like.

Note that the above metal nitride can be used for any conductor other than the conductor 42. For example, in the case where a component positioned between the conductor 60 and the oxide 30 has a property that allows hydrogen to be easily diffused, the above metal nitride may be used for the conductor 60. Alternatively, the above metal nitride may be used for both the conductor 42 and the conductor 60. Note that in the case where the transistor 200 has a structure in which the above metal nitride is used for the conductor 60 and a low-resistance region is formed in the oxide 30, the transistor 200 does not necessarily include the conductor 42 in some cases.

Furthermore, the transistor 200 is preferably surrounded by an insulator that has a function of inhibiting diffusion of hydrogen (e.g., at least one of hydrogen atoms, hydrogen molecules, and the like). That is, the insulator is preferably used as the insulator 20. The use of the insulator as the insulator 20 can inhibit hydrogen contained in a structure body provided outside the insulator 20 from entering the oxide 30. Thus, a transistor that has stable electrical characteristics with a small variation in electrical characteristics and improved reliability can be provided.

The hydrogen concentration in the insulator 20 is preferably low. A lower hydrogen concentration in the insulator 20 can inhibit entry of hydrogen into the oxide 30.

An insulating material used for the insulator 20 preferably has a function of inhibiting diffusion of oxygen in addition to a function of inhibiting diffusion of hydrogen. When such an insulating material is used for the insulator 20, oxygen contained in a component of the transistor 200 can be inhibited from being released to the outside of the insulator 20 and hydrogen contained in the structure body provided outside the insulator 20 can be inhibited from entering the oxide 30. Thus, a transistor that has stable electrical characteristics with a small variation in electrical characteristics and improved reliability can be provided.

For example, silicon nitride is preferably used for the insulator 20. Silicon nitride is preferable because of having a function of inhibiting hydrogen diffusion. In addition, the insulator 20 is preferably deposited by a sputtering method. Specifically, the insulator 20 is deposited using a silicon target and a mixed gas of argon and nitrogen as a sputtering gas. Since hydrogen is not used for the deposition of the insulator 20, the hydrogen concentration in the insulator 20 can be reduced. Alternatively, an insulator containing an oxide of one or both of aluminum and hafnium, or the like may be used as the insulator 20.

Although the insulator 20 shown in FIG. 1A is a single layer, the insulator 20 may have a stacked-layer structure, e.g., a stack including an insulating material capable of supplying oxygen to the oxide 30 and an insulating material having a function of inhibiting hydrogen diffusion. The insulator 20 having such a stacked-layer structure allows oxygen to be supplied to the oxide 30, reduces oxygen vacancies in the oxide 30, and inhibits hydrogen contained in the structure body provided outside the insulator 20 from entering the oxide 30. The insulator 20 may have a stack including an insulating material having a function of inhibiting oxygen diffusion and an insulating material having a function of inhibiting hydrogen diffusion. The insulator 20 having such a stacked-layer structure can inhibit oxygen contained in the component of the transistor 200 from being released to the outside of the insulator 20, and inhibit hydrogen contained in the structure body provided outside the insulator 20 from entering the oxide 30. Thus, a transistor that has stable electrical characteristics with a small variation in electrical characteristics and improved reliability can be provided.

As the insulating material that is capable of supplying oxygen to the oxide 30 or has a function of inhibiting oxygen diffusion, for example, aluminum oxide is preferably used, and aluminum oxide deposited by a sputtering method is further preferably used. As a manufacturing method of the insulator 20 having a stacked-layer structure, for example, aluminum oxide is formed by a sputtering method so as to surround the transistor 200, and silicon nitride is formed by a sputtering method so as to surround the aluminum oxide.

Figure 1B:
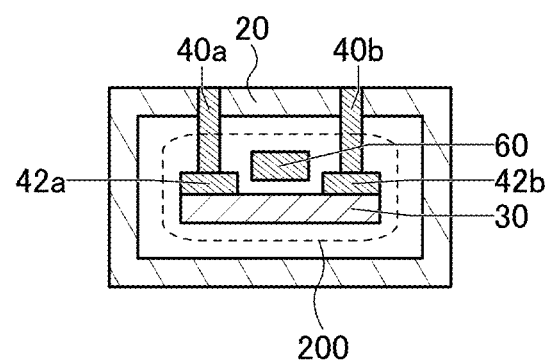

As shown in FIG. 1B, the semiconductor device of one embodiment of the present invention may include the insulator 20, the transistor 200, and a conductor 40 (a conductor 40a and a conductor 40b). The conductor 40 is electrically connected to the transistor 200 and functions as a plug.

The metal nitride may be provided in a region that is surrounded by the insulator 20 and is in the vicinity of the transistor 200. For example, the metal nitride may be used for the conductor 40. The use of the metal nitride for the conductor 40 allows hydrogen in the oxide 30 to be diffused into the conductor 40 and can reduce the hydrogen concentration in the oxide 30. Note that hydrogen diffused into the conductor 40 is released to the outside of the insulator 20 in some cases.

Note the in the case where hydrogen in the oxide 30 is diffused into metal nitride through a component positioned between the oxide 30 and the metal nitride, the metal nitride provided in the region that is surrounded by the insulator 20 and is in the vicinity of the transistor 200 is not necessarily in contact with the oxide 30 or the transistor 200.

FIG. 1A and FIG. 1B show the structure in which the insulator 20 surrounds one transistor 200; however, One embodiment of the present invention is not limited thereto. The insulator 20 may surround a plurality of transistors 200 as shown in FIG. 1C.

Although the insulator 20 is a single layer in FIG. 1A and FIG. 1B, one embodiment of the present invention is not limited thereto. The insulator 20 may include a plurality of insulators. For example, the insulator 20 may include an insulator 20a and an insulator 20b as shown in FIG. 1C. Any of the insulating materials that can be used for the insulator 20 can be used for the insulator 20a and the insulator 20b. Note that the insulator 20a and the insulator 20b may include the same material or different materials.

Figure 1C:
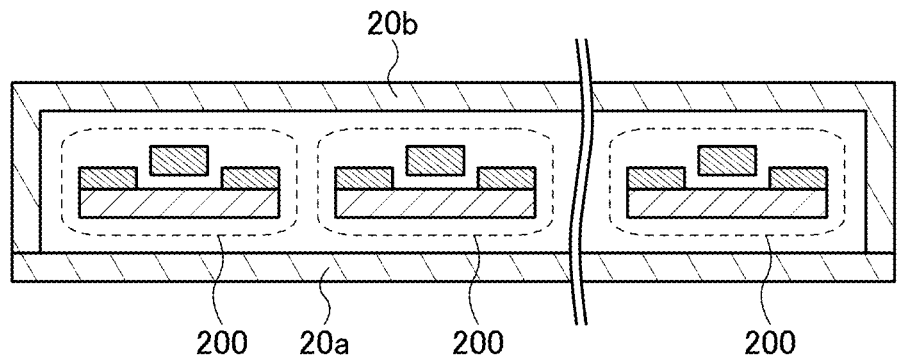

As a manufacturing method of the semiconductor device shown in FIG. 1C, the insulator 20a is formed, a plurality of transistors 200 are formed over the insulator 20a, and the insulator 20b is formed over the plurality of transistors 200.

Through the above, a semiconductor device having low power consumption can be provided. A highly integrated semiconductor device can be provided. A semiconductor device that has stable electrical characteristics with a small variation in electrical characteristics and improved reliability can be provided. A semiconductor device including a transistor with a low off-state current can be provided.

Embodiment 2

In this embodiment, an example of a semiconductor device including the transistor 200 of one embodiment of the present invention will be described with reference to FIG. 2A to FIG. 12C.

<Structure Example of Semiconductor Device>

Figure 2A:
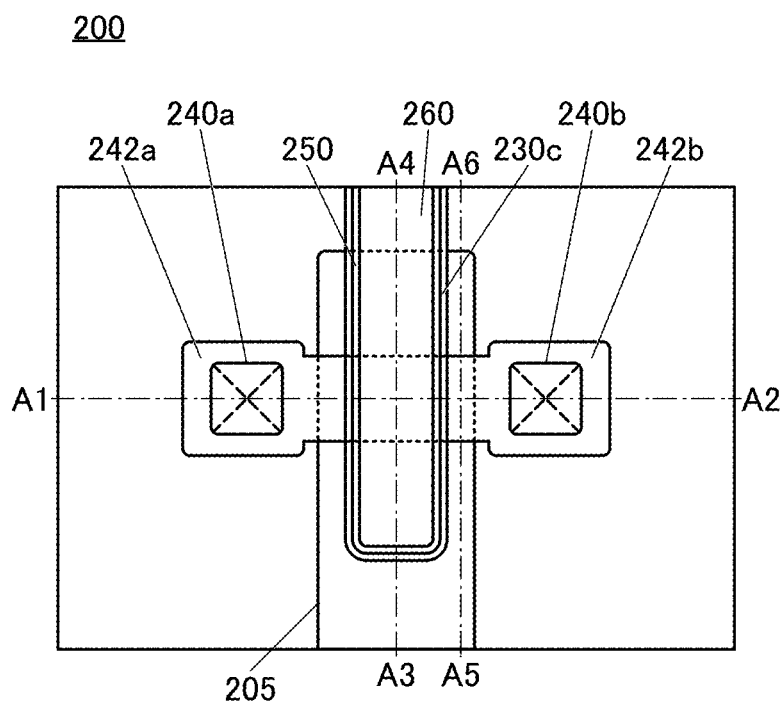
FIG. 2A is a top view of a semiconductor device according to one embodiment of the present invention.
Figure 2C:
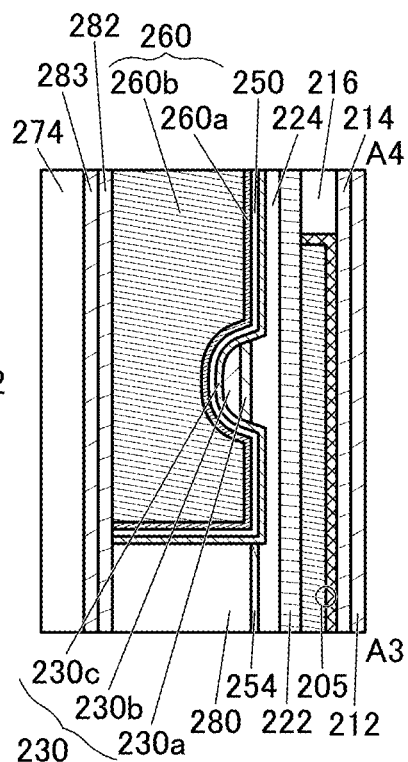
FIG. 2B to FIG. 2D are cross-sectional views of the semiconductor device according to one embodiment of the present invention.
Figure 2B:
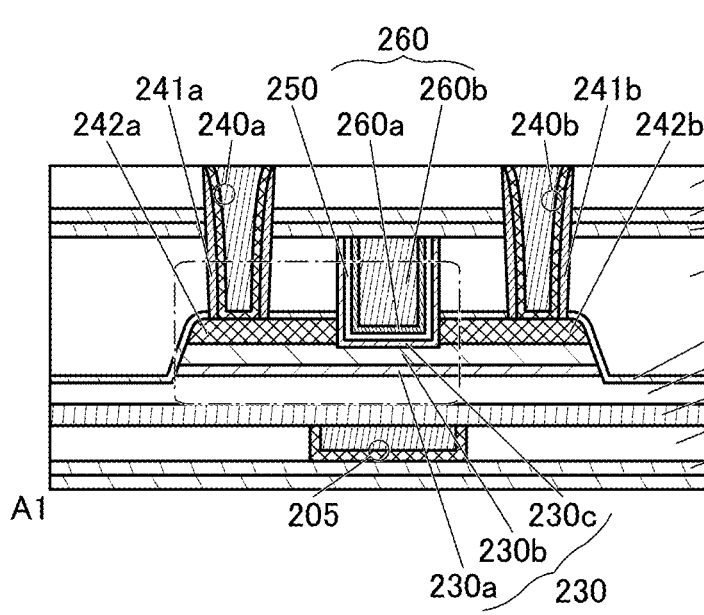
Figure 2D:
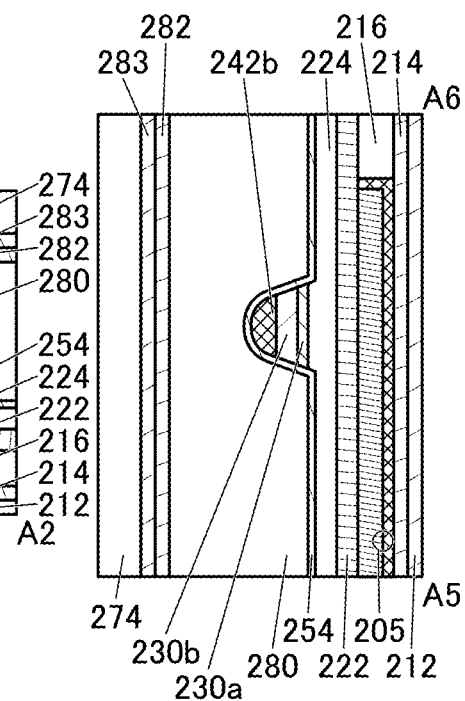

FIG. 2A to FIG. 2D are a top view and cross-sectional views of the semiconductor device including the transistor 200 of one embodiment of the present invention. FIG. 2A is a top view of the semiconductor device. FIG. 2B, FIG. 2C, and FIG. 2D are cross-sectional views of the semiconductor device. Here, FIG. 2B is a cross-sectional view of a portion indicated by a dashed-dotted line A1-A2 in FIG. 2A, and is a cross-sectional view in the channel length direction of the transistor 200. FIG. 2C is a cross-sectional view of a portion indicated by a dashed-dotted line A3-A4 in FIG. 2A, and is a cross-sectional view in the channel width direction of the transistor 200. FIG. 2D is a cross-sectional view of a portion indicated by dashed-dotted line A5-A6 in FIG. 2A. Note that for clarity of the drawing, some components are not illustrated in the top view of FIG. 2A.

The semiconductor device of one embodiment of the present invention includes the transistor 200, and an insulator 212, an insulator 214, an insulator 216, an insulator 280, an insulator 282, an insulator 283, and an insulator 274 that function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with side surfaces of the conductor 240 functioning as a plug.

In contact with an inner wall of an opening in the insulator 280, the insulator 282, the insulator 283, the insulator 274, and the like, the insulator 241a is provided. In contact with its side surface, a first conductor of the conductor 240a is provided, and a second conductor of the conductor 240a is further provided on the inner side. Also in contact with an inner wall of an opening in the insulator 280, the insulator 282, the insulator 283, the insulator 274, and the like, the insulator 241b is provided. In contact with its side surface, a first conductor of the conductor 240b is provided, and a second conductor of the conductor 240b is further provided on the inner side. Here, a top surface of the conductor 240 and a top surface of the insulator 274 can be substantially level with each other. Note that in the drawings, the transistor 200 has a structure in which the first conductor of the conductor 240 and the second conductor of the conductor 240 are stacked; however, the present invention is not limited thereto. For example, the conductor 240 may have a single layer or a stacked-layer structure of three or more layers. In the case where a structure body has a stacked-layer structure, layers may be distinguished by ordinal numbers corresponding to the formation order.

[Transistor 200]

As shown in FIG. 2A to FIG. 2D, the transistor 200 includes a conductor 205 placed over a substrate (not illustrated) so as to be embedded in the insulator 216; an insulator 222 placed over the insulator 216 and the conductor 205; an insulator 224 placed over the insulator 222; an oxide 230 (an oxide 230a, an oxide 230b, and an oxide 230c) placed over the insulator 224; an insulator 250 placed over the oxide 230c; a conductor 260 (a conductor 260a and a conductor 260b) placed over the insulator 250; a conductor 242a and a conductor 242b in contact with part of a top surface of the oxide 230b; and an insulator 254 placed in contact with part of a top surface of the insulator 224, a side surface of the oxide 230a, a side surface of the oxide 230b, a side surface and a top surface of the conductor 242a, and a side surface and a top surface of the conductor 242b.

The oxide 230 shown in FIG. 2A to FIG. 2D corresponds to the oxide 30 shown in FIG. 1A and FIG. 1B. The conductor 242a and the conductor 242b shown in FIG. 2A, FIG. 2B, and FIG. 2D respectively correspond to the conductor 42a and the conductor 42b shown in FIG. 1A and FIG. 1B. The conductor 260 shown in FIG. 2A to FIG. 2C corresponds to the conductor 60 shown in FIG. 1A and FIG. 1B. The conductor 240a and the conductor 240b shown in FIG. 2A and FIG. 2B respectively correspond to the conductor 40a and the conductor 40b shown in FIG. 1B.

The oxide 230 preferably includes the oxide 230a placed over the insulator 224, the oxide 230b placed over the oxide 230a, and the oxide 230c that is placed over the oxide 230b and is at least partly in contact with the top surface of the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the transistor 200 has a structure in which three layers of the oxide 230a, the oxide 230b, and the oxide 230c are stacked in the oxide 230; however, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxide 230a, the oxide 230b, and the oxide 230c may have a stacked-layer structure.

For example, as the oxide 230, a metal oxide such as an In-M-Zn oxide containing indium (In), an element M, and zinc (Zn) (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide 230.

A conductor 242 (the conductor 242a and the conductor 242b) is provided over the oxide 230b. The thickness of the conductor 242 is, for example, greater than or equal to 1 nm and less than or equal to 50 nm, preferably greater than or equal to 2 nm and less than or equal to 25 nm. The conductor 260 functions as a first gate (also referred to as a top gate) electrode of the transistor 200, and the conductor 242a and the conductor 242b function as a source electrode and a drain electrode of the transistor 200.

The metal nitride described in the above embodiment, in particular, a nitride containing tantalum, is preferably used for the conductor 242 (the conductor 242a and the conductor 242b). The use of the metal nitride for the conductor 242 can reduce the hydrogen concentration in the oxide 230.

Figure 3A:
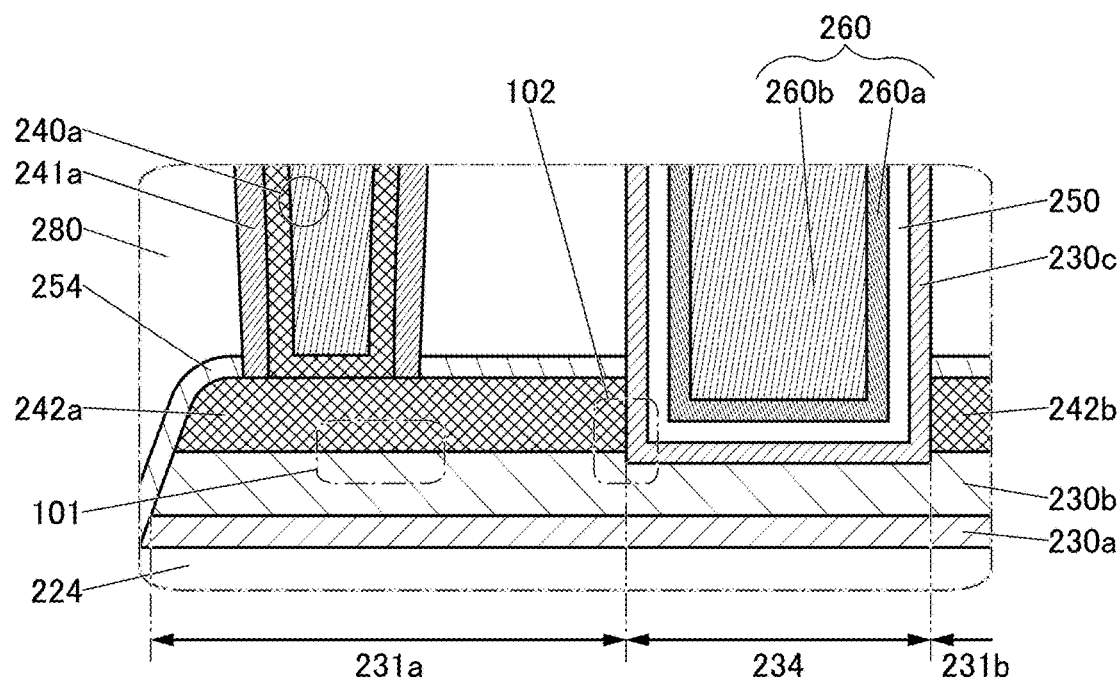
FIG. 3A and FIG. 3B are cross-sectional views of a semiconductor device according to one embodiment of the present invention.

FIG. 3A shows an enlarged view of a region surrounded by a dashed dotted line in FIG. 2B. As shown in FIG. 3A, the oxide 230 includes a region 234 functioning as a channel formation region of the transistor 200 and a region 231 (a region 231a and a region 231b) functioning as a source region and a drain region of the transistor 200.

Although FIG. 3A shows a structure in which the region 231 and the region 234 are formed in the oxide 230b, one embodiment of the present invention is not limited thereto; for example, the region 231 or the region 234 may be formed in the oxide 230a and the oxide 230b, may be formed in the oxide 230b and the oxide 230c, or may be formed in the oxide 230a, the oxide 230b, and the oxide 230c.

Also in FIG. 3A, a boundary between the region 231 and the region 234 is illustrated as being substantially perpendicular to the bottom surface of the oxide 230b; however, this embodiment is not limited thereto. For example, in some cases, the region 234 extends toward the conductor 240 around the surface of the oxide 230b and is narrowed around the bottom surface of the oxide 230b.

In the case where a metal oxide is used as the oxide 230, the contact between the conductor 242 (the conductor 242a and the conductor 242b) and the oxide 230 may allow oxygen in the oxide 230 to be diffused into the conductor 242, resulting in oxidation of the conductor 242. It is highly probable that oxidation of the conductor 242 lowers the conductivity of the conductor 242. Note that diffusion of oxygen in the oxide 230 into the conductor 242 can be rephrased as absorption of oxygen in the oxide 230 by the conductor 242.

When oxygen in the oxide 230 is diffused into the conductor 242 (the conductor 242a and the conductor 242b), another layer is sometimes formed between the conductor 242a and the oxide 230b, and between the conductor 242b and the oxide 230b. The layer contains more oxygen than the conductor 242 does, and thus the layer is assumed to have an insulating property. In this case, a three-layer structure of the conductor 242, the layer, and the oxide 230b can be regarded as a three-layer structure of a metal, an insulator, and a semiconductor and is sometimes referred to as an MIS (Metal-Insulator-Semiconductor) structure or a diode-junction structure having an MIS structure as its main part.

Note that the layer is not necessarily formed between the conductor 242 and the oxide 230b; for example, the layer is sometimes formed between the conductor 242 and the oxide 230c, between the conductor 242 and the oxide 230b, and between the conductor 242 and the oxide 230c.

When oxygen in the oxide 230 is diffused into the conductor 242, an oxygen-deficient region is sometimes formed between the layer and the oxide 230b or in the vicinity of the layer of the oxide 230b. The region is a region containing a large amount of oxygen vacancies. In this case, an impurity (e.g., hydrogen) entering oxygen vacancies serves as a donor to increase the carrier concentration, so that a low-resistance region might be formed in part of the region.

Note that the region 231a and the region 231b each include at least part of the above region. Thus, the region 231 is a low-resistance region with a high carrier concentration. The region 234 has a lower carrier concentration than the region 231.

As the thickness of the layer becomes large, it is highly possible that carrier transfer between the conductor 242 and the oxide 230 is inhibited. In addition, as the thickness of the layer becomes large, the oxygen-deficient region is enlarged. These are highly likely to cause variations in electrical characteristics of the transistor, a reduction in reliability of the transistor, and the like.

The metal nitride described in the above embodiment, in particular, a nitride containing tantalum, is suitable for the conductor 242 because it is a conductive material with a property that does not easily allow oxygen diffusion as well as a property that easily allows hydrogen diffusion. When the nitride containing tantalum is used for the conductor 242, hydrogen in the oxide 230 is diffused into the conductor 242 in a heat treatment step after the formation of a conductive film to be the conductor 242, whereby the hydrogen concentration in the oxide 230 can be reduced. Furthermore, it is possible to prevent a layer from being formed between the conductor 242 and the oxide 230 or inhibit the layer from having increased thickness. In addition, the amount of oxygen extracted from the oxide 230b can be reduced even when heat treatment is performed; thus, the transistor 200 is stable at high temperatures (what is called thermal budget) in a manufacturing process. Note that when oxygen in an oxide is unlikely to be diffused into a conductor, the following expressions are sometimes used: "the conductor is not easily oxidized", "the conductor is resistant to oxidation", and the like.

When a nitride containing tantalum is used for the conductor 242, in a region 101 shown in FIG. 3A, hydrogen in the oxide 230 is diffused from the region 231 in the oxide 230 into the conductor 242, so that the hydrogen concentration in the region 231 can be reduced. The reduction in the hydrogen concentration in the region 231 allows hydrogen in the region 234 to be diffused into the region 231. Thus, the hydrogen concentration in the region 234 can be reduced.

In a region 102 shown in FIG. 3A, hydrogen in the region 234 is diffused into the conductor 242 through the oxide 230c in some cases. Thus, the hydrogen concentration in the region 234 can be reduced.

The oxygen-deficient region described above is a region containing a large amount of oxygen vacancies. In the oxide 230 containing a metal oxide, hydrogen in an oxygen vacancy is less likely to diffuse than hydrogen bonded to an oxygen atom or hydrogen existing between lattices. Accordingly, the region 231 including an oxygen-deficient region contains a larger amount of hydrogen that is less likely to diffuse than the region 234 does. That is, hydrogen in the region 234 is more likely to diffuse into the conductor 242 than hydrogen in the region 231. Hence, the hydrogen concentration in the region 234 is lower than the hydrogen concentration in the region 231 in some cases.

When a nitride containing tantalum is used for the conductor 242, a thin layer can be formed between the conductor 242 and the oxide 230b. Specifically, the thickness of the layer can be greater than or equal to 0.1 nm and less than or equal to 4 nm, preferably greater than or equal to 0.5 nm and less than or equal to 3 nm. Consequently, hydrogen in the oxide 230 is diffused into the conductor 242 through the layer, so that the hydrogen concentration in the region 234 can be reduced.

As a result, the hydrogen concentration in the oxide 230 can be reduced. Thus, the transistor 200 can have favorable electrical characteristics and reliability.

The aforementioned layer contains tantalum and oxygen and thus has an insulating property in some cases. In that case, an MIS structure is configured with the conductor 242, the layer, and the oxide 230. Such a structure prevents the conductor 242 and the oxide 230 from being in contact with each other and thus can inhibit deterioration of the interface between the conductor 242 and the oxide 230 due to heat treatment. Moreover, the small thickness of the layer makes current to flow easily between the conductor 242 and the oxide 230, so that the reliability of the transistor can be improved.

Figure 3B:
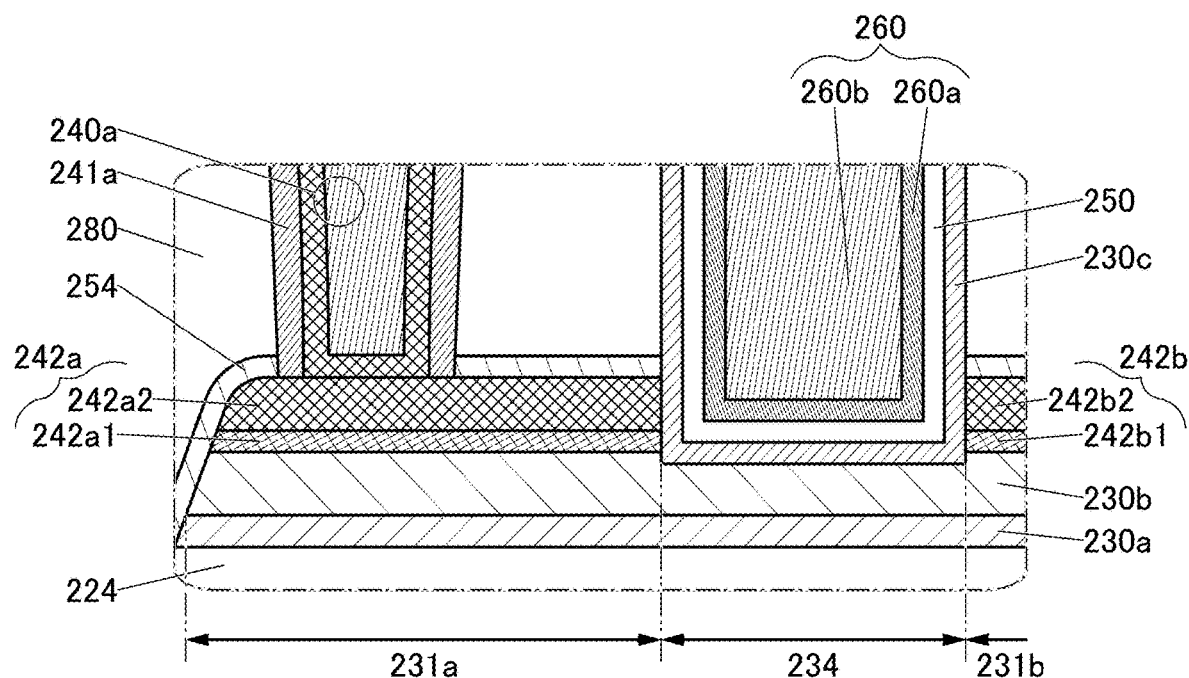

The conductor 242 (the conductor 242a and the conductor 242b) preferably has a stacked-layer structure of two or more layers. For example, the conductor 242 preferably has a stacked-layer structure of two layers in which a conductor 242a1 and a conductor 242b1 are placed on a side in contact with the oxide 230b, and a conductor 242a2 and a conductor 242b2 are placed over the conductor 242a1 and the conductor 242b1, respectively, as shown in FIG. 3B.

A lower layer of the conductor 242 (the conductor 242a1 and the conductor 242b1) is preferably formed using a conductive material having such properties that hydrogen is easily absorbed (extracted) and oxidation is not easily caused, for example. It is further preferable to use a conductive material having such properties that hydrogen in the oxide 230 is easily diffused into the lower layer of the conductor 242 and oxygen in the oxide 230 is not easily diffused into the lower layer of the conductor 242. Thus, hydrogen in the oxide 230 is diffused into the lower layer of the conductor 242, so that the hydrogen concentration in the oxide 230 is reduced and the transistor 200 can have stable electrical characteristics. Furthermore, it is possible to inhibit the oxidation of the lower layer of the conductor 242 and a reduction in the conductivity of the conductor 242.

An upper layer of the conductor 242 (the conductor 242a2 and the conductor 242b2) is preferably formed using a conductive material with higher conductivity than that of the lower layer of the conductor 242 (the conductor 242a1 and the conductor 242b1). Alternatively, the upper layer of the conductor 242 is preferably formed using a conductive material with lower resistivity than that of the lower layer of the conductor 242. As a result, a semiconductor device with reduced wiring delay can be fabricated.

Note that the upper layer of the conductor 242 may have such a property that hydrogen is easily absorbed. Accordingly, hydrogen absorbed by the lower layer of the conductor 242 is also diffused into the upper layer of the conductor 242, so that the hydrogen concentration in the oxide 230 can be further reduced. As a result, the transistor 200 can have stable electric characteristics.

Here, for the lower layer of the conductor 242 (the conductor 242a1 and the conductor 242b1) and the upper layer of the conductor 242 (the conductor 242a2 and the conductor 242b2), conductive materials that have the same constituent element and have different chemical compositions are preferably used. In this case, the lower layer of the conductor 242 and the upper layer of the conductor 242 can be deposited successively without being exposed to an atmospheric environment. By the deposition without exposure to the atmosphere, impurities or moisture from the atmospheric environment can be prevented from being attached onto the surface of the lower layer of the conductor 242, so that the vicinity of the interface between the lower layer of the conductor 242 and the upper layer of the conductor 242 can be kept clean.

For example, a nitride containing tantalum with a high atomic ratio of nitrogen to tantalum is preferably used for the lower layer of the conductor 242, and a nitride containing tantalum with a low atomic ratio of nitrogen to tantalum is preferably used for the upper layer of the conductor 242.

The high atomic ratio of nitrogen to tantalum in a nitride containing tantalum can inhibit oxidation of the nitride containing tantalum. In addition, the oxidation resistance of the nitride containing tantalum can be improved. Moreover, the diffusion of oxygen into the nitride containing tantalum can be inhibited. Hence, the nitride containing tantalum with a high atomic ratio of nitrogen to tantalum is preferably used for the lower layer of the conductor 242. It is thus possible to prevent a layer from being formed between the lower layer of the conductor 242 and the oxide 230 or reduce the thickness of the layer. Note that the oxidation resistance of the nitride containing tantalum is described later.

The low atomic ratio of nitrogen to tantalum in a nitride containing tantalum can reduce the resistivity of the nitride. Hence, the nitride containing tantalum with a low atomic ratio of nitrogen to tantalum is preferably used for the upper layer of the conductor 242. As a result, a semiconductor device with reduced wiring delay can be fabricated.

Note that the boundary between the upper layer and the lower layer of the conductor 242 is difficult to clearly detect in some cases. In the case where a nitride containing tantalum is used for the conductor 242, the tantalum concentration and the nitrogen concentration detected in each layer may gradually change within each layer and may also change continuously (or in a gradation manner) in a region between the upper layer and the lower layer. That is, the atomic ratio of nitrogen to tantalum is preferably higher in the region of the conductor 242 that is closer to the region 231. Thus, the atomic ratio of nitrogen to tantalum in a region positioned below the conductor 242 is preferably higher than the atomic ratio of nitrogen to tantalum in a region positioned above the conductor 242.

In the example shown above, conductive materials having the same constituent element and having different chemical compositions are used for the lower layer of the conductor 242 (the conductor 242a1 and the conductor 242b1) and the upper layer of the conductor 242 (the conductor 242a2 and the conductor 242b2); however, one embodiment of the present invention is not limited thereto, and the lower layer of the conductor 242 and the upper layer of the conductor 242 may be formed using different conductive materials.

According to the above, a semiconductor device having high reliability can be provided. A semiconductor device having excellent electrical characteristics can be provided. A semiconductor device that can be miniaturized or highly integrated can be provided. A semiconductor device having low power consumption can be provided.

<Specific Structure of Semiconductor Device>

The detailed structure of the semiconductor device including the transistor 200 of one embodiment of the present invention will be described below.

The insulator 212, the insulator 214, the insulator 254, the insulator 282, and the insulator 283 preferably function as insulating barrier films, each of which inhibits diffusion of impurities such as water and hydrogen from the substrate side or above the substrate into the transistor 200. Accordingly, an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom are preferably used for the insulator 212, the insulator 214, the insulator 254, the insulator 282, and the insulator 283. Alternatively, it is preferable to use an insulating material having a function of inhibiting diffusion of oxygen (e.g., at least one of an oxygen atom, an oxygen molecule, and the like).

Note that in this specification, a function of inhibiting diffusion of impurities or oxygen means a function of inhibiting diffusion of any one or all of the impurities and the oxygen. In addition, a film having a function of inhibiting diffusion of hydrogen or oxygen is sometimes referred to as a film through which hydrogen or oxygen does not pass easily, a film having low permeability of hydrogen or oxygen, a film having a barrier property against hydrogen or oxygen, a barrier film against hydrogen or oxygen, or the like. A barrier film having conductivity is sometimes referred to as a conductive barrier film.

Figure 12A:
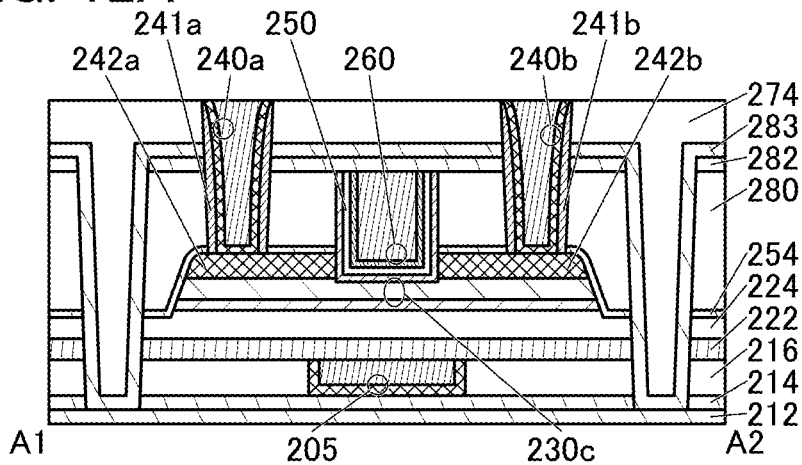
FIG. 12A to FIG. 12C are cross-sectional views showing a semiconductor device according to one embodiment of the present invention.

Here, a cross-sectional view of a semiconductor device including the transistor 200 is shown in FIG. 12A. As shown in FIG. 12A, for example, an opening may be formed in the insulator 214, the insulator 216, the insulator 222, the insulator 224, the insulator 254, the insulator 280, and the insulator 282, providing a structure in which the insulator 212 is in contact with the insulator 283. This structure enables the transistor 200 to be surrounded by the insulator 212 and the insulator 283. Furthermore, when the insulator that can be used as the insulator 20 described in the above embodiment is used as the insulator 212 and the insulator 283, impurities such as water and hydrogen can be inhibited from being diffused into the transistor 200 from the substrate side through the insulator 212 and the insulator 283. The insulator 283 is preferably deposited by a CVD method or an ALD method. The CVD method and the ALD method are each a deposition method achieving good coverage, and thus can prevent formation of disconnection or the like due to unevenness.

For example, silicon nitride or the like is preferably used for the insulator 212 and the insulator 283, and aluminum oxide or the like is preferably used for the insulator 214, the insulator 254, and the insulator 282. That is, the insulator that can be used as the insulator 20 described in the above embodiment may be used as the insulator 212 and the insulator 283. Thus, impurities such as water and hydrogen can be inhibited from being diffused into the transistor 200 side from the substrate side through the insulator 212. Alternatively, oxygen contained in the insulator 224 and the like can be inhibited from being diffused into the substrate side through the insulator 212. Furthermore, impurities such as water and hydrogen can be inhibited from being diffused into the transistor 200 side from the insulator 280 and the like, which are placed above the insulator 254, through the insulator 254. In this manner, the transistor 200 is preferably surrounded by the insulator 212, the insulator 214, the insulator 254, the insulator 282, and the insulator 283 having a function of inhibiting diffusion of oxygen and impurities such as water and hydrogen.

The resistivities of the insulator 212 and the insulator 283 are preferably low in some cases. For example, by setting the resistivities of the insulator 212 and the insulator 283 to approximately $1\times10^{13}$ Ωcm, the insulator 212 and the insulator 283 can sometimes reduce charge up of the conductor 205, the conductor 242, or the conductor 260 in treatment using plasma or the like in the manufacturing process of a semiconductor device. The resistivities of the insulator 212 and the insulator 283 are preferably higher than or equal to $1\times10^{10}$ Ωcm and lower than or equal to $1\times10^{15}$ Ωcm.

The insulator 216, the insulator 280, and the insulator 274 preferably have a lower permittivity than the insulator 214. When a material with a low permittivity is used for an interlayer film, the parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate for the insulator 216, the insulator 280, and the insulator 274.

The insulator 216 and the insulator 280 each preferably include a region that has a low hydrogen concentration and contains oxygen in excess of that in the stoichiometric composition (hereinafter also referred to as an excess-oxygen region), or preferably contain oxygen that is released by heating (hereinafter also referred to as excess oxygen). For example, silicon oxide deposited by a sputtering method is preferably used for the insulator 216 and the insulator 280. Thus, entry of hydrogen into the oxide 230 can be inhibited; alternatively, oxygen can be supplied to the oxide 230 to reduce oxygen vacancies in the oxide 230. Thus, a transistor that has stable electrical characteristics with a small variation in electrical characteristics and improved reliability can be provided.

Note that the insulator 216 may have a stacked-layer structure. For example, in the insulator 216, an insulator similar to the insulator 214 may be provided at least in a portion in contact with a side surface of the conductor 205. With such a structure, oxidation of the conductor 205 due to oxygen contained in the insulator 216 can be inhibited. Alternatively, a reduction in the amount of oxygen contained in the insulator 216 due to the conductor 205 can be inhibited.

The conductor 205 sometimes functions as a second gate (also referred to as bottom gate) electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current when a potential applied to the conductor 260 is 0 V can be lower in the case where a negative potential is applied to the conductor 205 than in the case where the negative potential is not applied to the conductor 205.

The conductor 205 is placed so as to overlap with the oxide 230 and the conductor 260. Furthermore, the conductor 205 is preferably provided to be embedded in the insulator 214 or the insulator 216.

Note that as shown in FIG. 2B, the conductor 205 is preferably provided larger than the channel formation region in the oxide 230. In particular, as shown in FIG. 2C, the conductor 205 preferably extends to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging (referred to as charge up) in treatment using plasma after the formation of the conductor 205 in the manufacturing process. Note that one embodiment of the present invention is not limited thereto.

The conductor 205 only needs to overlap with at least the oxide 230 positioned between the conductor 242a and the conductor 242b.

When the above-described structure is included, the channel formation region of the oxide 230 can be electrically surrounded by the electric field of the conductor 260 functioning as the first gate electrode and the electric field of the conductor 205 functioning as the second gate electrode.

As shown in FIG. 2D, a side surface and the periphery of the oxide 230b, which are in contact with the conductor 242a and the conductor 242b functioning as a source electrode and a drain electrode, are in contact with the insulator 254. In the case where an oxide is used for the insulator 254, oxygen in the insulator 254 might be supplied to the side surface and the periphery of the oxide 230b, or oxygen on the side surface and the periphery of the oxide 230b might be prevented from being diffused into the insulator 254. Thus, the side surface and the periphery of the oxide 230b can be of I-type, like the channel formation region. Note that in this specification and the like, "I-type" can be equated with "highly purified intrinsic" described above.

In this specification and the like, the following transistor structure is referred to as a surrounded channel (S-channel) structure: a channel formation region is electrically surrounded by the electric fields of the first gate electrode and the second gate electrode; and the side surface and the periphery of the oxide 230, which are in contact with the conductor 242a and the conductor 242b functioning as a source electrode and a drain electrode, are of I-type like the channel formation region. Note that the S-channel structure disclosed in this specification and the like is different from a Fin-type structure and a planar structure. When the S-channel structure is employed, the resistance to a short-channel effect can be enhanced, that is, a transistor in which a short-channel effect is less likely to occur can be obtained.

Furthermore, as shown in FIG. 2C, the conductor 205 extends to function as a wiring as well. However, without limitation thereto, a structure where a conductor functioning as a wiring is provided below the conductor 205 may be employed. The conductor 205 does not necessarily have to be provided in each transistor. For example, the conductor 205 may be shared by a plurality of transistors.

Note that in the drawings, the transistor 200 has a structure in which a first conductor of the conductor 205 and a second conductor of the conductor 205 are stacked; however, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, it is preferable to use a conductive material having a function of inhibiting diffusion of oxygen (e.g., at least one of oxygen atoms, oxygen molecules, and the like).

When a conductive material having a function of inhibiting diffusion of oxygen is used for the first conductor of the conductor 205, a reduction in the conductivity of the second conductor of the conductor 205 due to oxidation can be inhibited. As a conductive material having a function of inhibiting diffusion of oxygen, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked-layer structure of the above conductive material and titanium or titanium nitride.

The insulator 222 and the insulator 224 function as a gate insulator.

The insulator 222 preferably functions as a barrier insulating film that inhibits diffusion of impurities such as water and hydrogen into the transistor 200 from the substrate side. For example, the insulator 222 preferably has lower hydrogen permeability than the insulator 224. By surrounding the insulator 224, the oxide 230, and the like with the insulator 222 and the insulator 254, diffusion of impurities such as water and hydrogen into the transistor 200 from the outside can be inhibited.

Figure 12B:
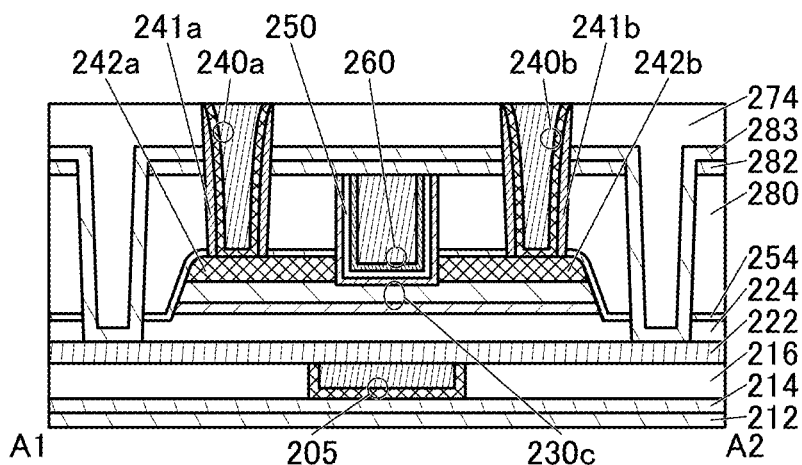

In the case where the insulator 222 has a function of inhibiting diffusion of hydrogen, for example, as shown in FIG. 12B, an opening may be formed in the insulator 224, the insulator 254, the insulator 280, and the insulator 282, providing a structure in which the insulator 222 is in contact with the insulator 283. This structure enables the oxide 230 to be surrounded by the insulator 222 and the insulator 283. Furthermore, when the insulator that can be used for the insulator 20 described in the above embodiment is used as the insulator 283, impurities such as water and hydrogen can be inhibited from being diffused into the oxide 230 from the substrate side through the insulator 222 and the insulator 283. The insulator 283 is preferably deposited by a CVD method or an ALD method. The CVD method and the ALD method are each a deposition method achieving good coverage, and thus can prevent formation of disconnection due to unevenness.

Furthermore, it is preferable that the insulator 222 have a function of inhibiting diffusion of oxygen (e.g., at least one of an oxygen atom, an oxygen molecule, and the like) (or be less likely to transmit the above oxygen). For example, the insulator 222 preferably has lower oxygen permeability than the insulator 224. The insulator 222 preferably has a function of inhibiting diffusion of oxygen and impurities, in which case diffusion of oxygen contained in the oxide 230 into a layer below the insulator 222 can be reduced. Furthermore, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulators, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as a gate insulator, a gate potential during operation of the transistor can be reduced while the physical thickness of the gate insulator is maintained.

The insulator 224, which is in contact with the oxide 230, preferably releases oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating is preferably used. An oxide film that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably in the range of 100° C. to 700° C., or 100° C. to 400° C.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 preferably has a stacked-layer structure of oxides that differ in the atomic ratio of metal atoms. Specifically, the atomic ratio of the element M to the constituent metal elements in the metal oxide used for the oxide 230$a$ is preferably greater than the atomic ratio of the element M to the constituent metal elements in the metal oxide used for the oxide 230$b$. Moreover, the atomic ratio of the element M to In in the metal oxide used for the oxide 230$a$ is preferably greater than the atomic ratio of the element M to In in the metal oxide used for the oxide 230$b$. Furthermore, the atomic ratio of In to the element M in the metal oxide used for the oxide 230$b$ is preferably greater than the atomic ratio of In to the element M in the metal oxide used for the oxide 230$a$. A metal oxide that can be used for the oxide 230$a$ or the oxide 230$b$ can be used for the oxide 230$c$.

Specifically, as the oxide 230$a$, a metal oxide with In:Ga:Zn=1:3:4 [atomic ratio] or 1:1:0.5 [atomic ratio] is used. As the oxide 230$b$, a metal oxide with In:Ga:Zn=1:1:1 [atomic ratio] or In:Ga:Zn=4:2:3 [atomic ratio] is used. As the oxide 230$c$, a metal oxide with In:Ga:Zn=1:3:4 [atomic ratio], Ga:Zn=2:1 [atomic ratio], or Ga:Zn=2:5 [atomic ratio] is used. When the metal oxide is deposited by a sputtering method, the aforementioned atomic ratio is not limited to the atomic ratio of the deposited metal oxide and may be the atomic ratio of a sputtering target used for depositing the metal oxide.

The oxide 230$b$ preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. As a result, oxygen extraction from the oxide 230b can be reduced even when heat treatment is performed; thus, the transistor 200 is stable with respect to high temperatures (what is called thermal budget) in a manufacturing process.

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. At this time, the oxide 230b serves as a main carrier path.

Here, the electron affinity or the conduction band minimum can be obtained from an energy gap and an ionization potential, which is the difference between a vacuum level and the energy of valence band maximum. The ionization potential can be measured using, for example, an ultraviolet photoelectron spectroscopy (UPS) apparatus. The energy gap can be measured using, for example, a spectroscopic ellipsometer.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used for the oxide 230a and the oxide 230c.

When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics.

The oxide 230c may have a stacked-layer structure of two or more layers. For example, the oxide 230c may include a first oxide and a second oxide placed over the first oxide.

The first oxide of the oxide 230c preferably contains at least one of the metal elements contained in the metal oxide used as the oxide 230b, and further preferably contains all of these metal elements. For example, it is preferable that an In—Ga—Zn oxide be used for the first oxide of the oxide 230c, and an In—Ga—Zn oxide, a Ga—Zn oxide, or gallium oxide be used for the second oxide of the oxide 230c. Accordingly, the density of defect states at the interface between the oxide 230b and the first oxide of the oxide 230c can be decreased. The second oxide of the oxide 230c is preferably a metal oxide that inhibits diffusion or passage of oxygen, compared to the first oxide of the oxide 230c. Providing the second oxide of the oxide 230c between the insulator 250 and the first oxide of the oxide 230c can inhibit diffusion of oxygen contained in the insulator 280 into the insulator 250. Therefore, the oxygen is more likely to be supplied to the oxide 230b through the first oxide of the oxide 230c.

Specifically, a metal oxide with In:Ga:Zn=4:2:3 [atomic ratio] is used for the first oxide of the oxide 230c and a metal oxide with In:Ga:Zn=1:3:4 [atomic ratio], Ga:Zn=2:1 [atomic ratio], or Ga:Zn=2:5 [atomic ratio], or gallium oxide is used for the second oxide of the oxide 230c. Accordingly, the density of defect states at the interface between the first oxide of the oxide 230c and the second oxide of the oxide 230c can be decreased.

When the atomic ratio of In to the metal element of the main component in the metal oxide used for the second oxide of the oxide 230c is smaller than the atomic ratio of In to the metal element of the main component in the metal oxide used for the first oxide of the oxide 230c, the diffusion of In into the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

An oxide having a function of inhibiting passage of oxygen may be placed between the conductor 242 (the conductor 242a and the conductor 242b) and the oxide 230b. When the oxide is placed between the oxide 230b and the conductor 242 functioning as the source electrode and the drain electrode, the conductor 242 is not in contact with the oxide 230, so that oxygen in the oxide 230 can be inhibited from being absorbed by the conductor 242. Thus, the electrical resistance between the conductor 242 and the oxide 230b can be reduced. Such a structure can improve the electrical characteristics of the transistor 200 and the reliability of the transistor 200.

A metal oxide containing the element M may be used for the above oxide. In particular, aluminum, gallium, yttrium, or tin is preferably used as the element M. The concentration of the element M in the above oxide is preferably higher than that in the oxide 230b. Alternatively, gallium oxide may be used for the above oxide. A metal oxide such as an In-M-Zn oxide may be used for the above oxide. Specifically, the atomic ratio of the element M to In in the metal oxide used for the above oxide is preferably greater than the atomic ratio of the element M to In in the metal oxide used for the oxide 230b. The thickness of the above oxide is preferably larger than or equal to 0.5 nm and smaller than or equal to 5 nm, further preferably larger than or equal to 1 nm and smaller than or equal to 3 nm, and still further preferably larger than or equal to 1 nm and smaller than or equal to 2 nm. The above oxide preferably has crystallinity. In the case where the above oxide has crystallinity, release of oxygen from the oxide 230 can be favorably inhibited. When the above oxide has a hexagonal crystal structure, for example, release of oxygen from the oxide 230 can sometimes be inhibited.

As shown in FIG. 2B, the insulator 254 is preferably in contact with the top surface and the side surface of the conductor 242a, the top surface and the side surface of the conductor 242b, the side surfaces of the oxide 230a and the oxide 230b, and part of the top surface of the insulator 224. With such a structure, the insulator 280 is isolated from the insulator 224, the oxide 230a, and the oxide 230b by the insulator 254.

Like the insulator 222, the insulator 254 preferably has a function of inhibiting diffusion of one or both of hydrogen and oxygen. For example, the insulator 254 preferably has a function of further inhibiting diffusion of one or both of hydrogen and oxygen as compared to the insulator 224 and the insulator 280. Thus, diffusion of hydrogen contained in the insulator 280 into the oxide 230a and the oxide 230b can be inhibited. Furthermore, by surrounding the insulator 224, the oxide 230, and the like with the insulator 222 and the insulator 254, diffusion of impurities such as water and hydrogen into the insulator 224 and the oxide 230 from the outside can be inhibited. Consequently, the transistor 200 can have favorable electrical characteristics and reliability.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region into the oxide 230 through the insulator 224. Here, with the insulator 254 having a function of inhibiting upward oxygen diffusion, oxygen can be prevented from being diffused from the oxide 230 into the insulator 280. Moreover, with the insulator 222 having a function of inhibiting downward oxygen diffusion, oxygen can be prevented from being diffused from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited using an atomic layer deposition (ALD) method. An ALD method is a deposition method achieving good coverage, and thus can prevent formation of disconnection due to unevenness of the insulator 254.

An insulator containing aluminum nitride may be used as the insulator 254, for example. Accordingly, a film having an excellent insulating property and high thermal conductivity can be obtained, and thus dissipation of heat generated in driving the transistor 200 can be increased. Alternatively, silicon nitride, silicon nitride oxide, or the like can be used.

An oxide containing gallium may also be used for the insulator 254, for example. An oxide containing gallium is preferable because it sometimes has a function of inhibiting diffusion of one or both of hydrogen and oxygen. Note that gallium oxide, gallium zinc oxide, indium gallium zinc oxide, or the like can be used as an oxide containing gallium. Note that in the case where indium gallium zinc oxide is used for the insulator 254, the atomic ratio of gallium to indium is preferably large. When the atomic ratio is increased, the insulating property of the oxide can be high.

The insulator 254 can have a multilayer structure of two or more layers. When the insulator 254 has a stacked-layer structure of two layers, the lower layer and the upper layer of the insulator 254 can be formed by any of the above methods; the lower layer and the upper layer of the insulator 254 may be formed by the same method or different methods. For example, as the insulator 254, the lower layer of the insulator 254 may be formed by a sputtering method in an oxygen-containing atmosphere and then the upper layer of the insulator 254 may be formed by an ALD method. An ALD method is a deposition method achieving good coverage, and thus can prevent formation of disconnection due to unevenness of the first layer.

The above material can be used for the lower layer and the upper layer of the insulator 254, and the lower layer and the upper layer of the insulator 254 may be formed using the same material or different materials. For example, a stacked-layer structure of silicon oxide, silicon oxynitride, silicon nitride oxide, or silicon nitride and an insulator having a function of inhibiting passage of oxygen and impurities such as hydrogen may be employed. As the insulator having a function of inhibiting passage of oxygen and impurities such as hydrogen, an insulator containing an oxide of one or both of aluminum and hafnium can be used, for example.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator that releases oxygen by heating is provided as the insulator 250 in contact with the top surface of the oxide 230c, oxygen can be efficiently supplied to the channel formation region of the oxide 230b and oxygen vacancies in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. In addition, oxidation of the conductor 260 due to oxygen from the insulator 250 can be inhibited.

Note that the metal oxide functions as part of the gate insulator in some cases. Therefore, in the case where silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide has a function of part of the first gate electrode in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. It is also possible to use indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

The conductor 260 preferably includes the conductor 260a and the conductor 260b positioned over the conductor 260a. For example, the conductor 260a is preferably positioned so as to cover a bottom surface and a side surface of the conductor 260b.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

The metal nitride described in the above embodiment may be used for the conductor 260.

Although the conductor 260 has a two-layer structure of the conductor 260a and the conductor 260b in FIG. 2B and FIG. 2C, the conductor 260 may have a single-layer structure or a stacked-layer structure of three or more layers.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

Moreover, as shown in FIG. 2B, a top surface of the conductor 260 is substantially aligned with a top surface of the insulator 250 and the top surface of the oxide 230c.

As shown in FIG. 2C, in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved. When the bottom surface of the insulator 222 is a reference and the difference between the level of the bottom surface of the conductor 260 in a region where the conductor 260 does not overlap with the oxide 230a and the oxide 230b and the level of the bottom surface of the oxide 230b is T1, T1 is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 280 is provided over the insulator 224, the oxide 230, and the conductor 242 with the insulator 254 therebetween. In addition, the top surface of the insulator 280 may be planarized.

The insulator 280 functioning as an interlayer film preferably has a low permittivity. When a material with a low permittivity is used for an interlayer film, the parasitic capacitance generated between wirings can be reduced. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using, for example, a material similar to that for the insulator 216. Note that the insulator 280 may have a stacked-layer structure of two or more layers.

It is preferable that, as shown in FIG. 2B, the insulator 282 be in contact with the top surfaces of the conductor 260, the insulator 250, and the oxide 230c and the insulator 283 be in contact with a top surface of the insulator 282. This can inhibit entry of impurities such as hydrogen contained in the insulator 274 and the like into the insulator 250. Thus, adverse effects on the electrical characteristics of the transistor and the reliability of the transistor can be inhibited.

The insulator 274 is preferably provided over the insulator 283. Like the insulator 216 or the like, the insulator 274 preferably has a low permittivity. As in the insulator 224 and the like, the concentration of impurities such as water and hydrogen in the insulator 274 is preferably reduced.

The conductor 240a and the conductor 240b are placed in the openings formed in the insulator 274, the insulator 283, the insulator 282, the insulator 280, and the insulator 254. The conductor 240a and the conductor 240b are provided to face each other with the conductor 260 interposed therebetween. Note that the level of the top surfaces of the conductor 240a and the conductor 240b may be on the same surface as the top surface of the insulator 274.

Note that the insulator 241a is provided in contact with a side wall of the opening in the insulator 274, the insulator 283, the insulator 282, the insulator 280, and the insulator 254, and the conductor 240a is formed in contact with its side surface. The conductor 242a is positioned on at least part of the bottom portion of the opening, and thus the conductor 240a is in contact with the conductor 242a. Similarly, the insulator 241b is provided in contact with a side wall of the opening in the insulator 274, the insulator 283, the insulator 282, the insulator 280, and the insulator 254, and the conductor 240b is formed in contact with its side surface. The conductor 242b is positioned on at least part of the bottom portion of the opening, and thus the conductor 240b is in contact with the conductor 242b.

For the conductor 240a and the conductor 240b, a conductive material containing tungsten, copper, or aluminum as its main component is preferably used.

The conductor 240a and the conductor 240b may each have a stacked-layer structure. Note that in the drawings, the transistor 200 has a structure in which the conductor 240a and the conductor 240b each have a stacked-layer structure of two layers; however, the present invention is not limited thereto. For example, the conductor 240 may be provided as a single layer or to have a stacked-layer structure of three or more layers.

In the case where the conductor 240a and the conductor 240b have a stacked-layer structure, a conductive material having a function of inhibiting passage of impurities such as water and hydrogen is preferably used for a conductor that is in contact with the conductor 242 and in contact with the insulator 254, the insulator 280, the insulator 282, the insulator 283, and the insulator 274 with the insulator 241 therebetween. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 274 can be inhibited from being diffused into the oxide 230 through the conductor 240a and the conductor 240b.

For the insulator 241a and the insulator 241b, for example, an insulator such as silicon nitride, aluminum oxide, or silicon nitride oxide may be used. Since the insulator 241a and the insulator 241b are provided in contact with the insulator 254, impurities such as water and hydrogen contained in the insulator 280 or the like can be inhibited from being diffused into the oxide 230 through the conductor 240a and the conductor 240b. In particular, silicon nitride is suitable because of having a high blocking property against hydrogen. In addition, oxygen contained in the insulator 280 can be prevented from being absorbed by the conductor 240a and the conductor 240b.

Although not shown, an insulator having resistivity higher than or equal to $1.0 \times 10^{13}$ Ωcm and lower than or equal to $1.0 \times 10^{15}$ Ωcm, preferably higher than or equal to $5.0 \times 10^{13}$ Ωcm and lower than or equal to $5.0 \times 10^{14}$ Ωcm is preferably provided so as to cover the above conductor. It is preferable that an insulator having the above resistivity be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

Although not shown, a conductor functioning as a wiring may be placed in contact with the top surface of the conductor 240a and the top surface of the conductor 240b. A conductive material containing tungsten, copper, or aluminum as its main component is preferably used for the conductor functioning as a wiring. The conductor may have a stacked-layer structure, and for example, may be a stack including any of the above conductive materials and titanium or titanium nitride. Note that the conductor may be formed so as to be embedded in an opening provided in an insulator.

Figure 12C:
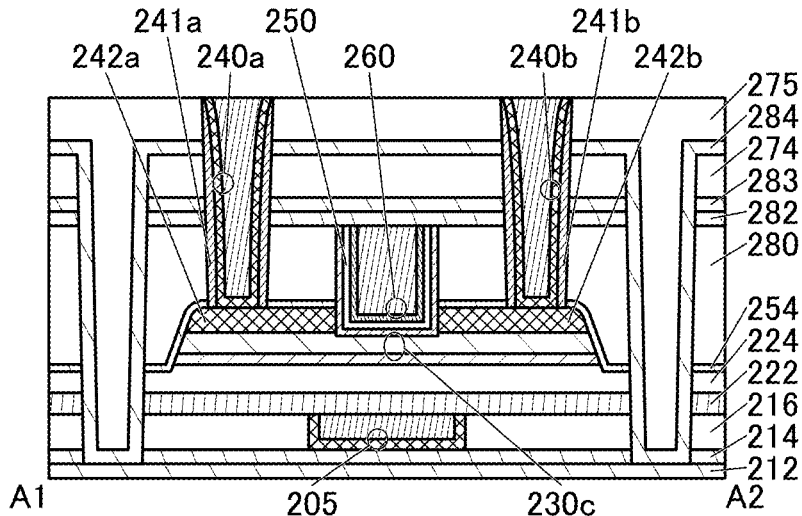

As shown in FIG. 12C, an insulator 284 may be provided over the insulator 274 and an insulator 275 may be provided over the insulator 284.

The insulator 284 is provided over the insulator 274 and in an opening formed in the insulator 214, the insulator 216, the insulator 222, the insulator 224, the insulator 254, the insulator 280, the insulator 282, the insulator 283, and the insulator 274, providing a structure in which the insulator 212 is in contact with the insulator 284. This structure enables the transistor 200 to be surrounded by the insulator 212 and the insulator 284. Furthermore, when the insulator that can be used as the insulator 20 described in the above embodiment is used as the insulator 212 and the insulator 284, impurities such as water and hydrogen can be inhibited from being diffused into the transistor 200 side from the substrate side through the insulator 212 and the insulator 284. The insulator 284 is preferably deposited by a CVD method or an ALD method. The CVD method and the ALD method are each a deposition method achieving good coverage, and thus can prevent formation of disconnection due to unevenness.

Any of the insulating materials that can be used for the insulator 274 can be used for the insulator 275. Note that in the case of the structure shown in FIG. 12C, the insulator 283 is not necessarily provided.

In the case where a conductor functioning as a wiring is placed in contact with the top surface of the conductor 240a and the top surface of the conductor 240b, the insulator 284 may be provided over the conductor and in an opening reaching the insulator 212, providing a structure in which the insulator 284 is in contact with the insulator 212.

<Constituent Materials of Semiconductor Device>

Constituent materials that can be used for a semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon or germanium and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as the gate insulator, the voltage during operation of the transistor can be reduced while the physical thickness of the gate insulator is maintained. By contrast, when a material with a low dielectric constant is used for the insulator functioning as the interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

When a transistor using an oxide semiconductor is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, a structure in which the oxide 230 is in contact with silicon oxide or silicon oxynitride including a region containing oxygen released by heating enables oxygen vacancies included in the oxide 230 to be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, tungsten nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that maintain the conductivity even when absorbing oxygen. A semiconductor having high electric conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that in the case where an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as a semiconductor is preferably used. A metal oxide that can be used as the oxide 230 of the present invention is described below.

As the metal oxide, it is preferable to use a metal oxide having a band gap of 2 eV or more, further preferably 2.5 eV or more. The use of a metal oxide having a wide band gap as the oxide 230 can reduce the off-state current of the transistor. With the use of such a transistor, a semiconductor device with low power consumption can be provided.

The metal oxide preferably contains at least indium or zinc. In particular, indium and zinc are preferably contained. Moreover, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can also be referred to as an (In, M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (a metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide is described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

A metal oxide with a low carrier concentration is preferably used for the transistor. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state.

The highly purified intrinsic or substantially highly purified intrinsic metal oxide has a low density of defect states and accordingly has a low density of trap states in some cases.

A defect in which hydrogen has entered an oxygen vacancy can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 230, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 230, the carrier concentration of the metal oxide functioning as a channel formation region is preferably lower than or equal to $1 \times 10^{18}$ cm$^{-3}$, further preferably lower than $1 \times 10^{17}$ cm$^{-3}$, further preferably lower than $1 \times 10^{16}$ cm$^{-3}$, further preferably lower than $1 \times 10^{13}$ cm$^{-3}$, and still further preferably lower than $1 \times 10^{16}$ Ωcm$^{-3}$. Note that the lower limit of the carrier concentration of the metal oxide functioning as the channel formation region is not particularly limited and can be, for example, $1 \times 10^{-9}$ cm$^{-3}$.

<Method for Manufacturing Semiconductor Device>

Next, a method for manufacturing a semiconductor device including the transistor 200 of one embodiment of the present invention, which is shown in FIG. 2A to FIG. 2D, will be described with reference to FIG. 4A to FIG. 11C.

FIG. 4A, FIG. 5A, FIG. 6A, FIG. 7A, FIG. 8A, FIG. 9A, FIG. 10A, and FIG. 11A are top views. FIG. 4B, FIG. 5B, FIG. 6B, FIG. 7B, FIG. 8B, FIG. 9B, FIG. 10B, and FIG. 11B are cross-sectional views corresponding to portions indicated by dashed-dotted lines A1-A2 in FIG. 4A, FIG. 5A, FIG. 6A, FIG. 7A, FIG. 8A, FIG. 9A, FIG. 10A, and FIG. 11A, respectively, and are also cross-sectional views of the transistor 200 in the channel length direction. Furthermore, FIG. 4C, FIG. 5C, FIG. 6C, FIG. 7C, FIG. 8C, FIG. 9C, FIG. 10C, and FIG. 11C are cross-sectional views corresponding to portions indicated by dashed-dotted lines A3-A4 in FIG. 4A, FIG. 5A, FIG. 6A, FIG. 7A, FIG. 8A, FIG. 9A, FIG. 10A, and FIG. 11A, respectively, and are also cross-sectional views of the transistor 200 in the channel width direction. Note that for simplification of the drawing, some components are not illustrated in the top views of FIG. 4A, FIG. 5A, FIG. 6A, FIG. 7A, FIG. 8A, FIG. 9A, FIG. 10A, and FIG. 11A.

First, a substrate (not illustrated) is prepared, and the insulator 212 is deposited over the substrate. The insulator 212 can be deposited by a sputtering method, a chemical vapor deposition (CVD) method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (e.g., a transistor and a capacitor), and the like included in a semiconductor device might be charged up by receiving electric charge from plasma. In that case, accumulated electric charge might break the wiring, the electrode, the element, and the like included in the semiconductor device. By contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with good coverage, and low-temperature deposition. The ALD method includes a PEALD (Plasma Enhanced ALD) method using plasma. The use of plasma is sometimes preferable because deposition at lower temperature is possible. Note that a precursor used in the ALD method sometimes contains impurities such as carbon. For that reason, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, the CVD method and the ALD method are deposition methods that enable favorable step coverage almost regardless of the shape of an object. In particular, the ALD method enables excellent step coverage and excellent thickness uniformity and can be suitably used to cover a surface of an opening portion with a high aspect ratio, for example. On the other hand, the ALD method has a relatively low deposition rate, and thus is preferably used in combination with another deposition method with a high deposition rate, such as the CVD method, in some cases.

Each of the CVD method and the ALD method enables the composition of an obtained film to be controlled with a flow rate ratio of source gases. For example, by the CVD method or the ALD method, a film with a certain composition can be formed depending on the flow rate ratio of the source gases. Moreover, with the CVD method or the ALD method, by changing the flow rate ratio of the source gases while forming a film, a film whose composition is continuously changed can be formed. In the case of forming a film while changing the flow rate ratio of source gases, as compared with the case of forming a film with the use of a plurality of deposition chambers, the time taken for the film formation can be shortened because the time taken for transfer and pressure adjustment is not required. Thus, the productivity of the semiconductor device can be increased in some cases.

In this embodiment, for the insulator 212, silicon nitride is deposited by a CVD method. When an insulator through which copper is less likely to pass, such as silicon nitride, is used as the insulator 212 in such a manner, even in the case where a metal that is likely to diffuse, such as copper, is used for a conductor in a layer (not illustrated) below the insulator 212, diffusion of the metal into a layer above the insulator 212 through the insulator 212 can be inhibited. The use of an insulator through which impurities such as water and hydrogen are less likely to pass can inhibit diffusion of impurities such as water and hydrogen into a layer below the insulator 212.

Next, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxynitride is deposited by a CVD method.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the first conductor of the conductor 205 is formed. The conductive film preferably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, as the conductive film to be the first conductor of the conductor 205, a tantalum nitride film is formed by a sputtering method and a titanium nitride film is formed over the tantalum nitride. With the use of such a metal nitride for the first conductor of the conductor 205, even when a metal that easily diffuses, such as copper, is used for the second conductor of the conductor 205 described later, the metal can be prevented from diffusing outward through the first conductor of the conductor 205.

Next, a conductive film to be the second conductor of the conductor 205 is formed over the conductive film to be the first conductor of the conductor 205. The conductive film can be formed by a plating method, a sputtering method, a CVD method, an MBE method, a PLD method, an ALD method, or the like. In this embodiment, a tungsten film is formed as the conductive film.

Next, CMP (Chemical Mechanical Polishing) treatment is performed to partly remove the conductive film to be the first conductor of the conductor 205 and the conductive film to be the second conductor of the conductor 205 to expose the insulator 216. As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIG. 4A to FIG. 4C).

Note that after the conductor 205 is formed, part of the second conductor of the conductor 205 may be removed, a groove may be formed in the second conductor of the conductor 205, a conductive film may be formed over the conductor 205 and the insulator 216 so as to fill the groove, and CMP treatment may be performed. By the CMP treatment, part of the conductive film is removed to expose the insulator 216. Note that part of the second conductor of the conductor 205 is preferably removed by a dry etching method or the like.

Through the above steps, the conductor 205 including the conductive film, which has a flat top surface, can be formed. The improvement in planarity of the top surfaces of the insulator 216 and the conductor 205 can improve the crystallinity of the oxide 230a, the oxide 230b, and the oxide 230c. Note that the conductive film is preferably formed using a material similar to that for the first conductor of the conductor 205 or the second conductor of the conductor 205.

Although the conductor 205 is formed so as to be embedded in the opening in the insulator 216 in the above description, this embodiment is not limited thereto. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Next, the insulator 222 is deposited over the insulator 216 and the conductor 205. The insulator 222 can be deposited by a sputtering method, a CVD method, an MBE method, a PLD method, an ALD method, or the like. In this embodiment, hafnium oxide or aluminum oxide is deposited as the insulator 222 by an ALD method.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, silicon oxynitride is deposited by a CVD method for the insulator 224.

Here, plasma treatment containing oxygen may be performed under reduced pressure so that an excess-oxygen region can be formed in the insulator 224. For the plasma treatment containing oxygen, an apparatus including a power source for generating high-density plasma using microwaves is preferably used, for example. Alternatively, a power source for applying a high frequency such as an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration of the coverage with an oxide deposited later and a decrease in the yield of the semiconductor device in some cases. The deposition of aluminum oxide over the insulator 224 by a sputtering method is preferred because oxygen can be added to the insulator 224.

Figure 4A:
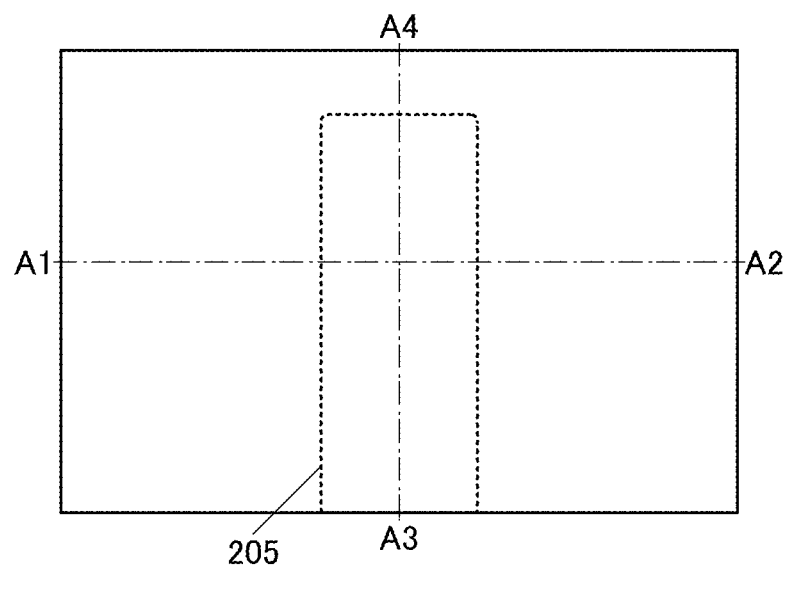
FIG. 4A is a top view showing a method for manufacturing a semiconductor device according to one embodiment of the present invention.
Figure 4C:
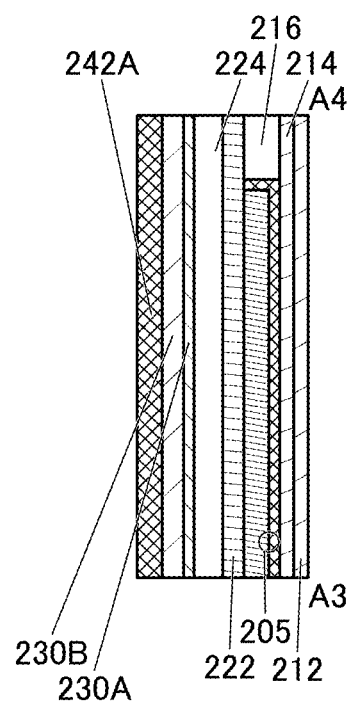
FIG. 4B and FIG. 4C are cross-sectional views showing the method for manufacturing a semiconductor device according to one embodiment of the present invention.
Figure 4B:
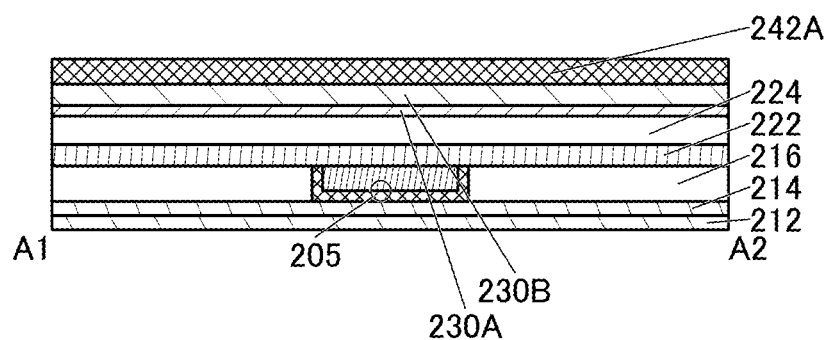

Next, an oxide film 230A and an oxide film 230B are deposited in this order over the insulator 224 (see FIG. 4B and FIG. 4C). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be formed by a sputtering method, a CVD method, an MBE method, a PLD method, an ALD method, or the like.

For example, in the case where the oxide film 230A and the oxide film 230B are formed by a sputtering method, oxygen or a mixed gas of oxygen and a rare gas is used as a sputtering gas. Increasing the proportion of oxygen contained in the sputtering gas can increase the amount of excess oxygen in the formed oxide films. In the case where the oxide films are formed by a sputtering method, the above In-M-Zn oxide target or the like can be used.

In particular, when the oxide film 230A is formed, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. A transistor using an oxygen-excess oxide semiconductor for its channel formation region can have relatively high reliability. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor using an oxygen-deficient oxide semiconductor for its channel formation region can have relatively high field-effect mobility. Furthermore, when the deposition is performed while the substrate is heated, the crystallinity of the oxide film can be improved.

In this embodiment, the oxide film 230A is formed by a sputtering method using an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is formed to have characteristics required for the oxide 230 by selecting the deposition condition and the atomic ratio as appropriate.

Note that the insulator 222, the insulator 224, the oxide film 230A, and the oxide film 230B are preferably deposited without exposure to the air. For example, a multi-chamber deposition apparatus may be used.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, the conductive film 242A is formed over the oxide film 230B. The conductive film 242A can be formed by a sputtering method, a CVD method, an MBE method, a PLD method, an ALD method, or the like (see FIG. 4B and FIG. 4C). Note that heat treatment may be performed before the formation of the conductive film 242A. This heat treatment may be performed under reduced pressure, and the conductive film 242A may be successively formed without exposure to the air. The treatment can remove moisture and hydrogen adsorbed onto the surface of the oxide film 230B and the like, and further can reduce the moisture concentration and the hydrogen concentration in the oxide film 230A and the oxide film 230B. The heat treatment is preferably performed at a temperature higher than or equal to 100° C. and lower than or equal to 400° C. In this embodiment, the heat treatment is performed at 200° C.

Figure 5A:
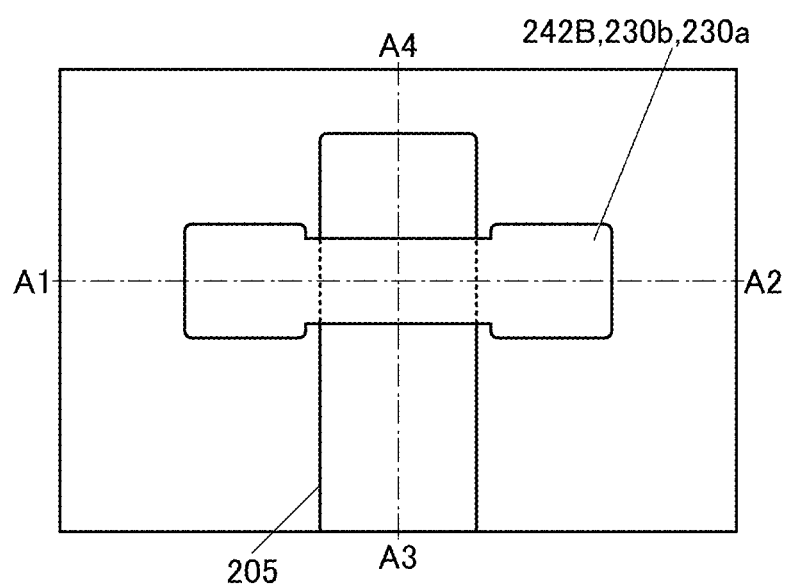
FIG. 5A is a top view showing a method for manufacturing a semiconductor device according to one embodiment of the present invention.
Figure 5C:
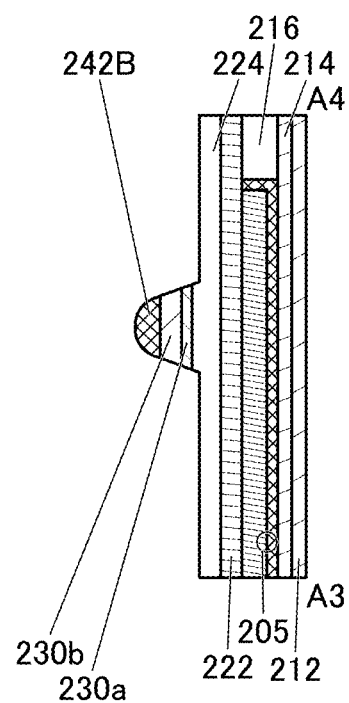
FIG. 5B and FIG. 5C are cross-sectional views showing the method for manufacturing a semiconductor device according to one embodiment of the present invention.
Figure 5B:
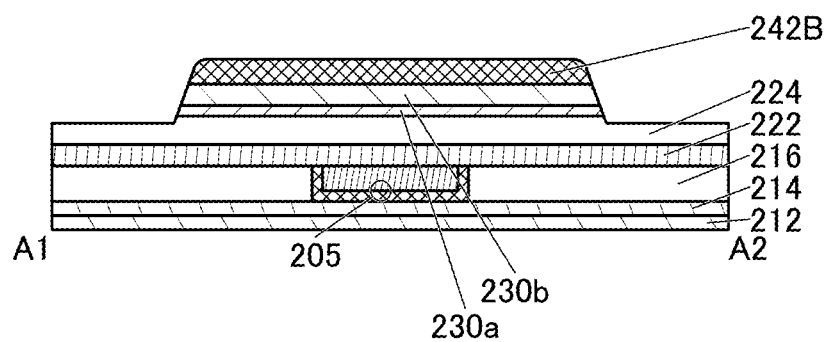

Next, the oxide film 230A, the oxide film 230B, and the conductive film 242A are processed into island shapes by a lithography method to form the oxide 230a, the oxide 230b, and a conductive layer 242B (see FIG. 5A to FIG. 5C). A dry etching method or a wet etching method can be used for the processing. Processing by a dry etching method is suitable for microfabrication. The oxide film 230A, the oxide film 230B, and the conductive film 242A may be processed under different conditions. Note that in this step, the thickness of the insulator 224 in a region that does not overlap with the oxide 230a is reduced in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 242, forming a resist mask thereover, and then etching the hard mask material. The etching of the conductive film to be the conductor 242 may be performed after removal of the resist mask or with the resist mask remaining. In the latter case, the resist mask sometimes disappears during the etching. The hard mask may be removed by etching after the etching of the conductive film to be the conductor 242. Meanwhile, the hard mask is not necessarily removed when the hard mask material does not affect the following process or can be utilized in the following process.

Here, the oxide 230a, the oxide 230b, and the conductive layer 242B are formed so as to at least partly overlap with the conductor 205. It is preferable that the side surfaces of the oxide 230a, the oxide 230b, and the conductive layer 242B be substantially perpendicular to a top surface of the insulator 222. When the side surfaces of the oxide 230a, the oxide 230b, and the conductive layer 242B are substantially perpendicular to the top surface of the insulator 222, a plurality of transistors 200 can be provided in a smaller area and at a higher density. Alternatively, a structure may be employed in which the angle formed by the side surfaces of the oxide 230a, the oxide 230b, and the conductive layer 242B and the top surface of the insulator 222 is a small angle. In that case, the angle formed by the side surfaces of the oxide 230a, the oxide 230b, and the conductive layer 242B and the top surface of the insulator 222 is preferably greater than or equal to 60° and less than 70°. With such a shape, coverage with the insulator 254 and the like can be improved in a later step, so that defects such as voids can be reduced.

There is a curved surface between the side surface of the conductive layer 242B and a top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm, for example. When the end portions are not angular, the coverage with films in later deposition steps is improved.

Figure 6A:
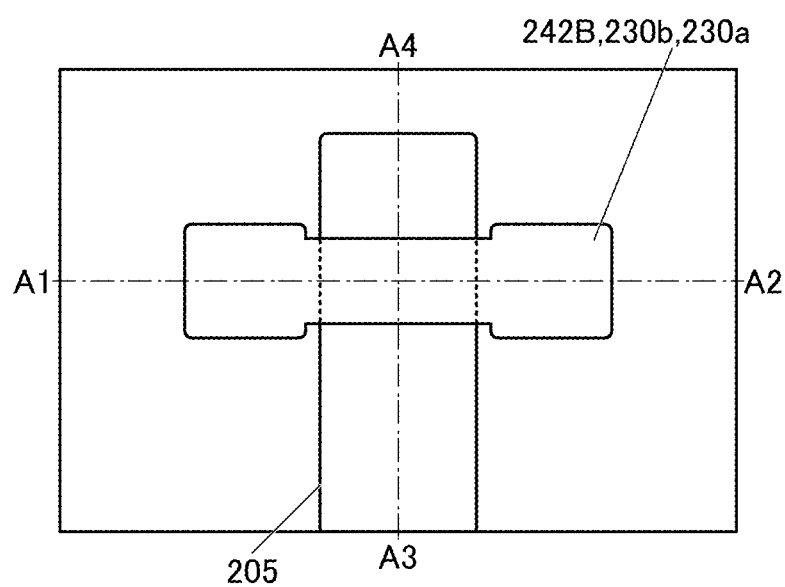
FIG. 6A is a top view showing a method for manufacturing a semiconductor device according to one embodiment of the present invention.
Figure 6C:
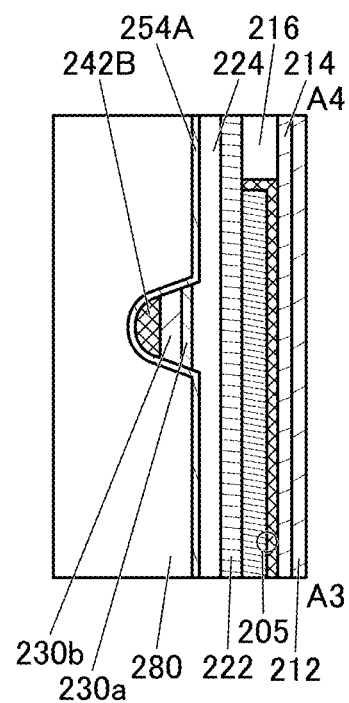
FIG. 6B and FIG. 6C are cross-sectional views showing the method for manufacturing a semiconductor device according to one embodiment of the present invention.
Figure 6B:
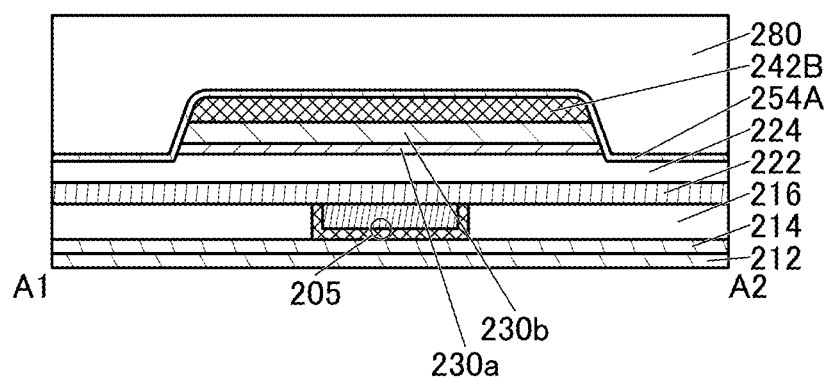

Next, an insulating film 254A is formed over the insulator 224, the oxide 230a, the oxide 230b, and the conductive layer 242B (see FIG. 6B and FIG. 6C).

The insulating film 254A can be deposited by a sputtering method, a CVD method, an MBE method, a PLD method, an ALD method, or the like. As the insulating film 254A, an insulating film having a function of inhibiting passage of oxygen is preferably used. For example, an aluminum oxide film, a silicon nitride film, a silicon oxide film, or a gallium oxide film is formed by a sputtering method or an ALD method. Alternatively, an aluminum oxide film may be formed by a sputtering method and another aluminum oxide film may be formed over the aluminum oxide film by an ALD method.

Next, an insulating film to be the insulator 280 is formed over the insulating film 254A.

The insulating film can be formed by a sputtering method, a CVD method, an MBE method, a PLD method, an ALD method, or the like. In this embodiment, as the insulating film, a silicon oxide film is formed by a CVD method or a sputtering method.

The insulating film to be the insulator 280 may have a multilayer structure. For example, the insulating film may have a structure in which a silicon oxide film is formed by a sputtering method and another silicon oxide film is formed thereover by a CVD method, a PEALD method, or a thermal ALD method.

Note that heat treatment may be performed before the formation of the insulating film to be the insulator 280. The heat treatment may be performed under reduced pressure, and the insulating film may be successively formed without exposure to the air. The treatment can remove moisture and hydrogen adsorbed onto the surface of the insulating film 254A and the like, and further can reduce the moisture concentration and the hydrogen concentration in the oxide 230a, the oxide 230b, and the insulating film 254A. The conditions for the above-described heat treatment can be used.

Subsequently, the insulating film to be the insulator 280 is subjected to CMP treatment, so that the insulator 280 having a flat top surface is formed (see FIG. 6B and FIG. 6C).

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, and the oxide 230a to divide $V_OH$ in the insulator 280, the oxide 230b, and the oxide 230a into oxygen vacancy ($V_O$) and hydrogen (H). Some hydrogen divided at this time is bonded to oxygen contained in the insulator 280 and is removed as water molecules in some cases. Some hydrogen is gettered by the conductor 242 through the insulator 254 in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in the following step after the formation of the insulator 280, heat treatment, or the like.

Figure 7A:
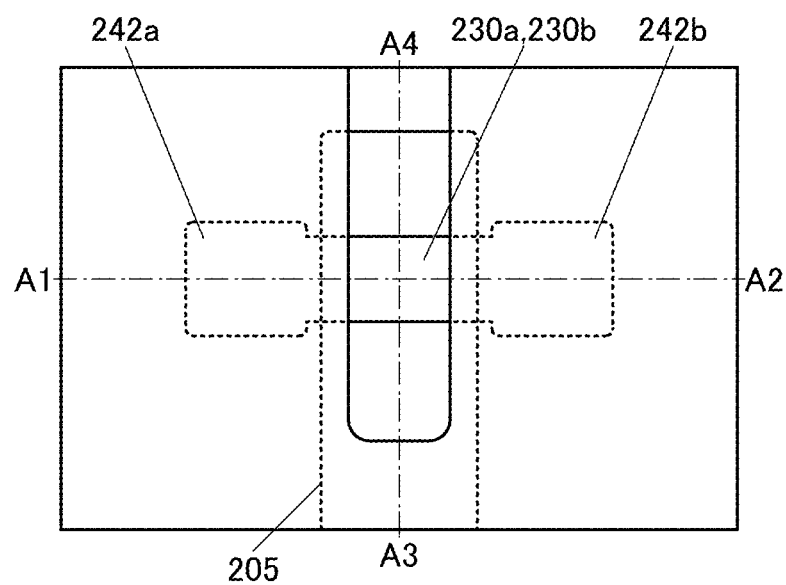
FIG. 7A is a top view showing a method for manufacturing a semiconductor device according to one embodiment of the present invention.
Figure 7C:
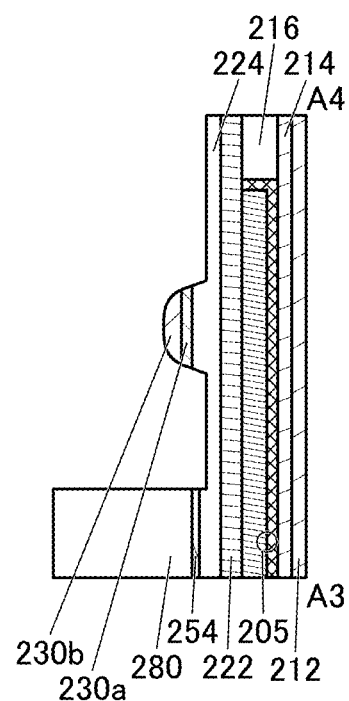
FIG. 7B and FIG. 7C are cross-sectional views showing the method for manufacturing a semiconductor device according to one embodiment of the present invention.
Figure 7B:
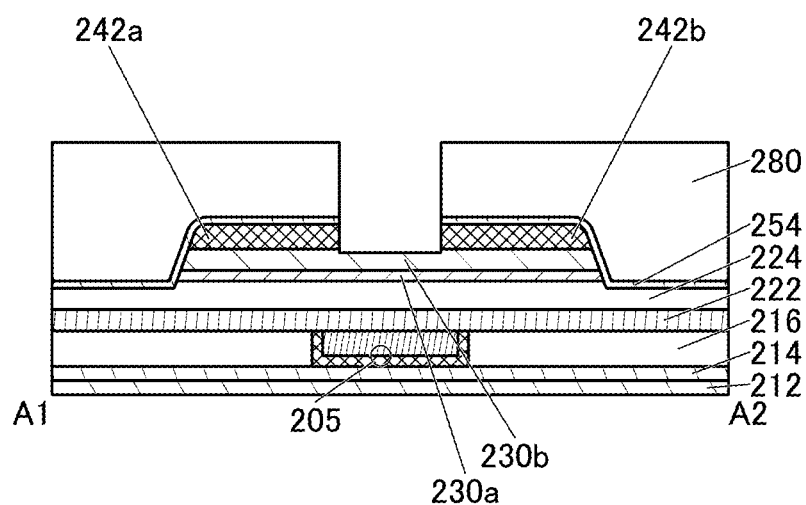

Then, part of the insulator 280, part of the insulating film 254A, and part of the conductive layer 242B are processed to form an opening reaching the oxide 230b (see FIG. 7A and FIG. 7C). The opening is preferably formed so as to overlap with the conductor 205. The conductor 242a, the conductor 242b, and the insulator 254 are formed by the formation of the opening. At this time, the thickness of the oxide 230b in a region overlapping with the opening might be reduced.

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

In some cases, the treatment such as the dry etching performed thus far causes impurities due to an etching gas or the like to be attached to the surfaces or diffused to the inside of the oxide 230a, the oxide 230b, and the like. Examples of the impurities include fluorine and chlorine.

In order to remove the above impurities and the like, cleaning treatment is performed. Examples of the cleaning method include wet cleaning using a cleaning solution and the like, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

After the etching or the cleaning, heat treatment may be performed. The heat treatment may be performed at a temperature higher than or equal to 100° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment may be performed in an oxygen atmosphere. This provides oxygen to the oxide 230a and the oxide 230b, and reduces oxygen vacancies. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

Figure 8A:
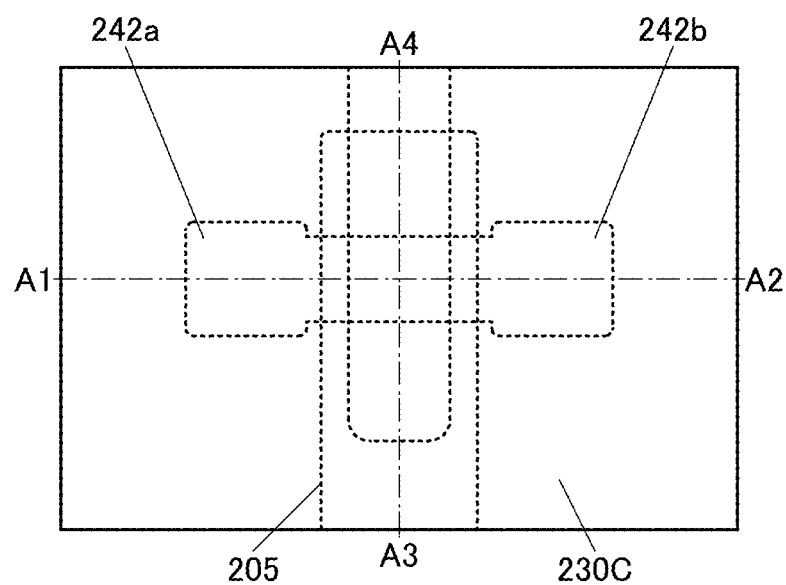
FIG. 8A is a top view showing a method for manufacturing a semiconductor device according to one embodiment of the present invention.
Figure 8C:
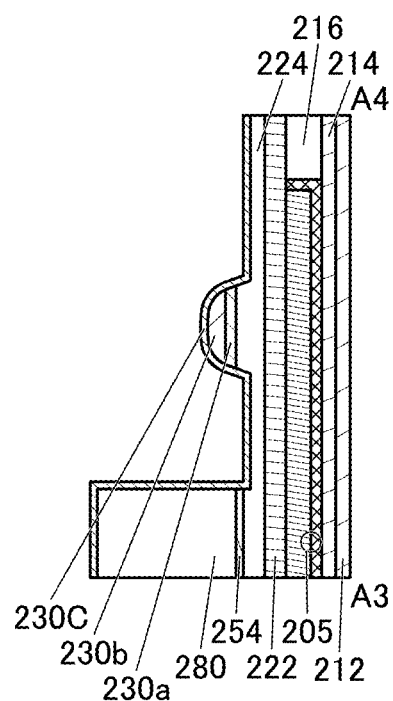
FIG. 8B and FIG. 8C are cross-sectional views showing the method for manufacturing a semiconductor device according to one embodiment of the present invention.
Figure 8B:
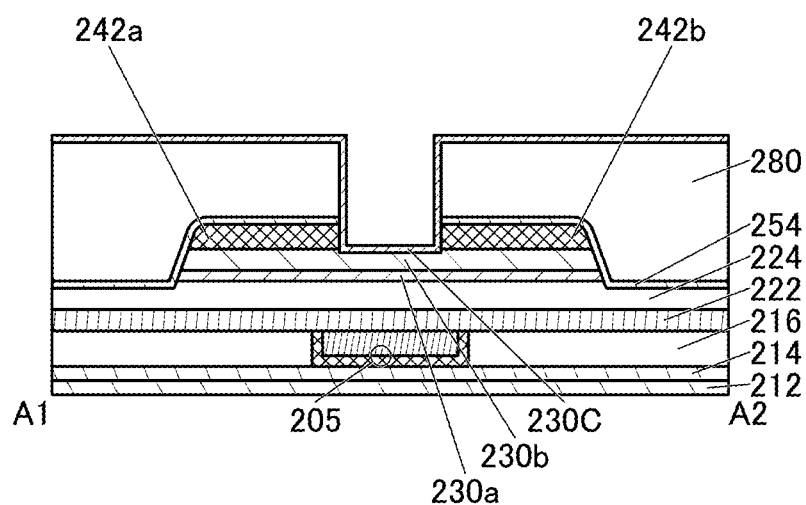
Figure 9A:
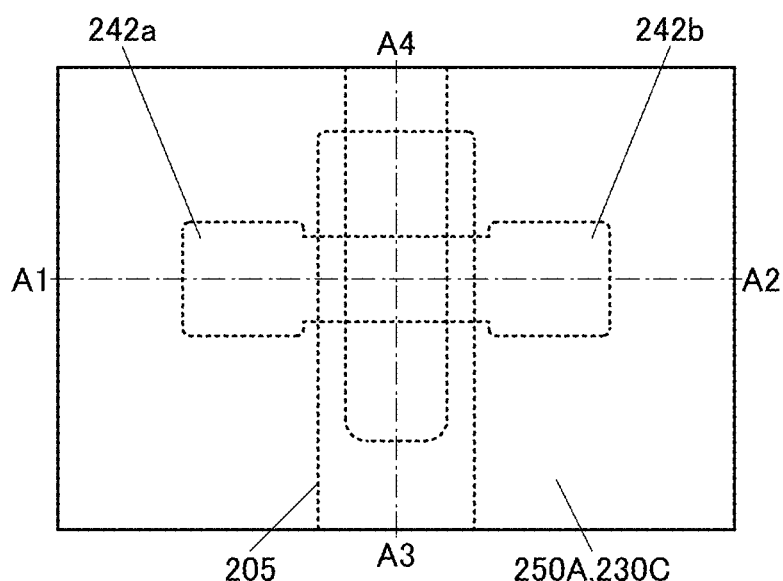
FIG. 9A is a top view showing a method for manufacturing a semiconductor device according to one embodiment of the present invention.
Figure 9C:
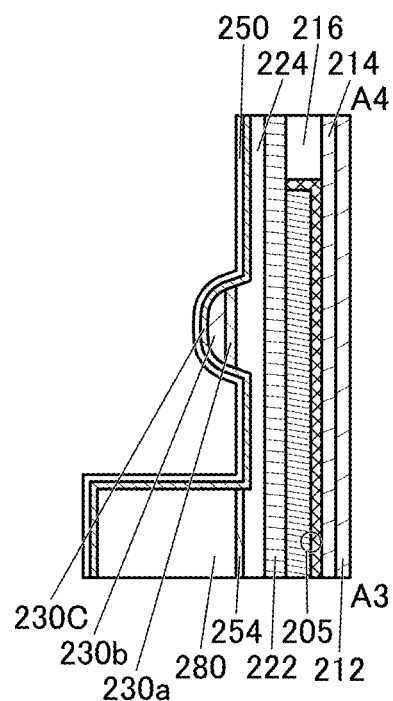
FIG. 9B and FIG. 9C are cross-sectional views showing the method for manufacturing a semiconductor device according to one embodiment of the present invention.
Figure 9B:
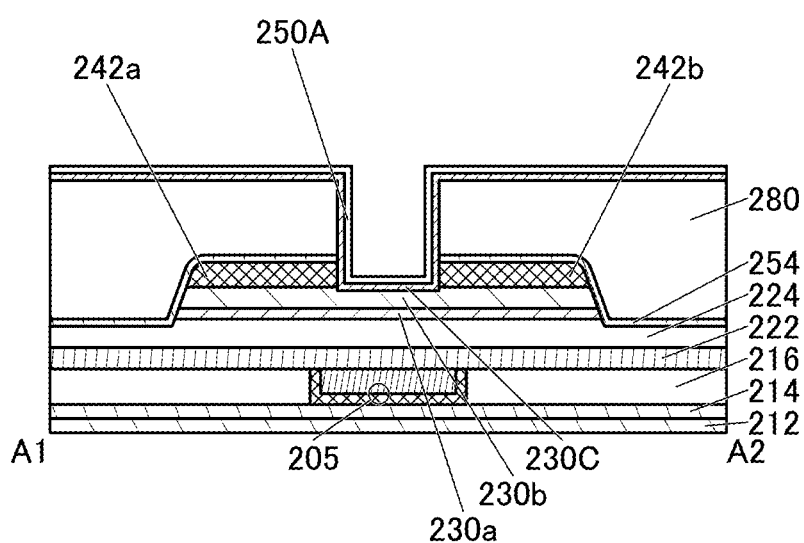
Figure 10A:
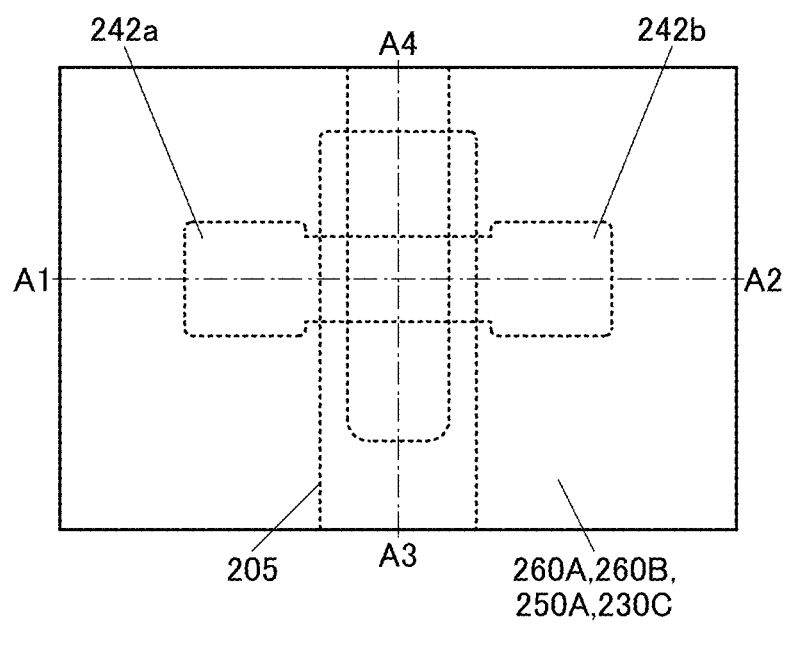
FIG. 10A is a top view showing a method for manufacturing a semiconductor device according to one embodiment of the present invention.
Figure 10C:
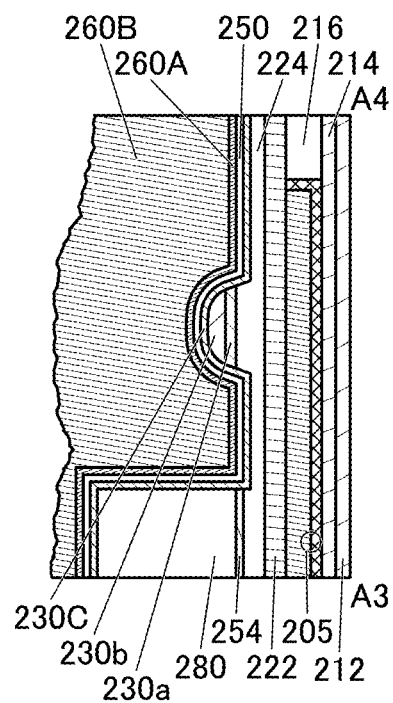
FIG. 10B and FIG. 10C are cross-sectional views showing the method for manufacturing a semiconductor device according to one embodiment of the present invention.
Figure 10B:
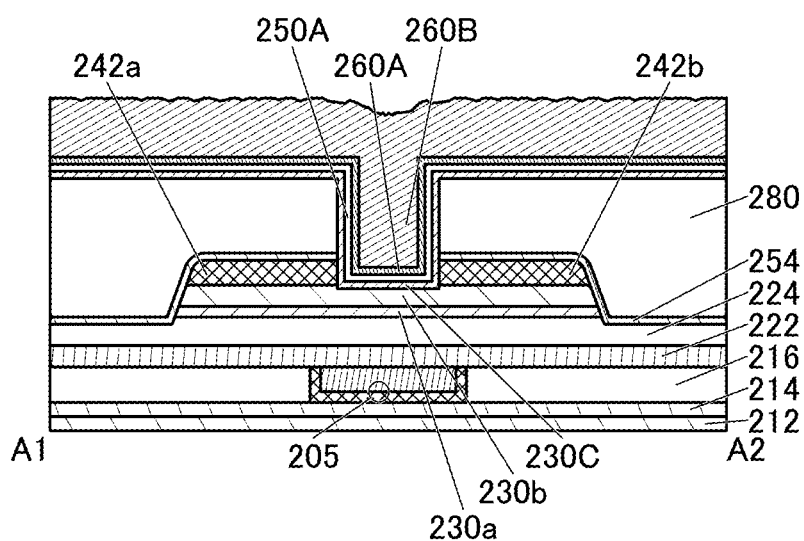

Next, heat treatment may be performed; the heat treatment may be performed under reduced pressure, and an oxide film 230C may be successively formed without exposure to the air (see FIG. 8A to FIG. 8C). The treatment can remove moisture and hydrogen adsorbed onto the surface of the oxide 230b and the like, and further can reduce the moisture concentration and the hydrogen concentration in the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be formed by a sputtering method, a CVD method, an MBE method, a PLD method, an ALD method, or the like. The atomic ratio of Ga to In in the oxide film 230C is preferably greater than the atomic ratio of Ga to In in the oxide film 230B. In this embodiment, the oxide film 230C is formed by a sputtering method using an In—Ga—Zn oxide target with In:Ga:Zn=1:3:4 [atomic ratio].

Note that the oxide film 230C may have a stacked-layer structure. For example, deposition may be performed by a sputtering method using an In—Ga—Zn oxide target with In:Ga:Zn=4:2:4.1 [atomic ratio], and then successively performed using an In—Ga—Zn oxide target with In:Ga:Zn=1:3:4 [atomic ratio].

In the formation of the oxide film 230C, part of oxygen contained in the sputtering gas is sometimes supplied to the oxide 230a and the oxide 230b. In other cases, in the formation of the oxide film 230C, part of oxygen contained in the sputtering gas is supplied to the insulator 280. Therefore, the proportion of oxygen contained in the sputtering gas for the oxide film 230C is preferably higher than or equal to 70%, further preferably higher than or equal to 80%, still further preferably 100%.

Next, heat treatment may be performed. Heat treatment may be performed under reduced pressure, and an insulating film 250A may be successively formed without exposure to the air (see FIG. 9A to FIG. 9C). The treatment can remove moisture and hydrogen adsorbed onto the surface of the oxide film 230C and the like, and further can reduce the moisture concentration and the hydrogen concentration in the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. In this embodiment, as the insulating film 250A, a silicon oxynitride film is formed by a CVD method. Note that the deposition temperature at the time of the formation of the insulating film 250A is preferably higher than or equal to 350° C. and lower than 450° C., particularly preferably approximately 400° C. When the insulating film 250A is formed at 400° C., an insulating film having few impurities can be formed.

Microwave treatment may be performed after the formation of the insulating film 250A. For the microwave treatment, the conditions for the above-described microwave treatment can be used. Performing the microwave treatment improves the film quality of the insulating film 250A, thereby inhibiting diffusion of hydrogen, water, impurities, and the like. Accordingly, hydrogen, water, impurities, and the like can be inhibited from diffusing into the oxide 230 through the insulator 250 in the following step after the formation of a conductive film to be the conductor 260 or the following treatment such as heat treatment.

Next, a conductive film 260A and a conductive film 260B are formed in this order. The conductive film 260A and the conductive film 260B can be formed by a sputtering method, a CVD method, an MBE method, a PLD method, an ALD method, or the like. In this embodiment, the conductive film 260A is formed by an ALD method, and the conductive film 260B is formed by a CVD method (see FIG. 10A to FIG. 10C).

Figure 11A:
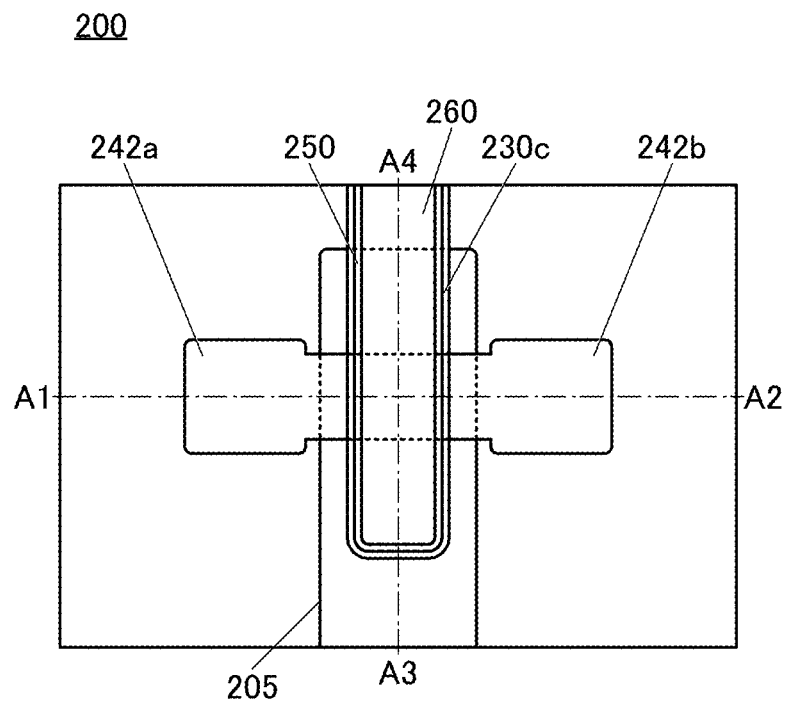
FIG. 11A is a top view showing a method for manufacturing a semiconductor device according to one embodiment of the present invention.
Figure 11C:
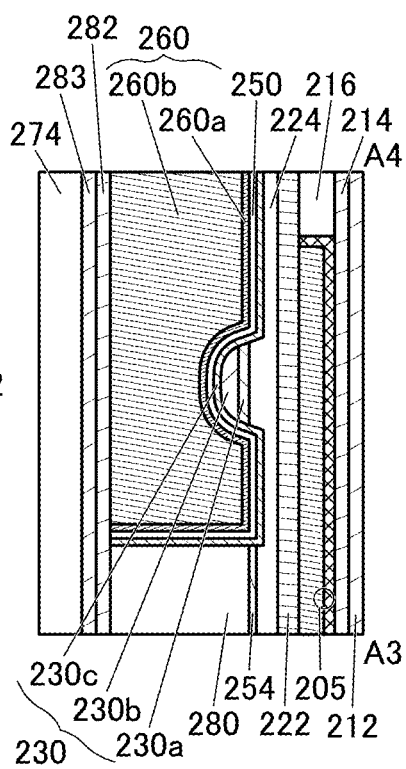
FIG. 11B and FIG. 11C are cross-sectional views showing the method for manufacturing a semiconductor device according to one embodiment of the present invention.
Figure 11B:
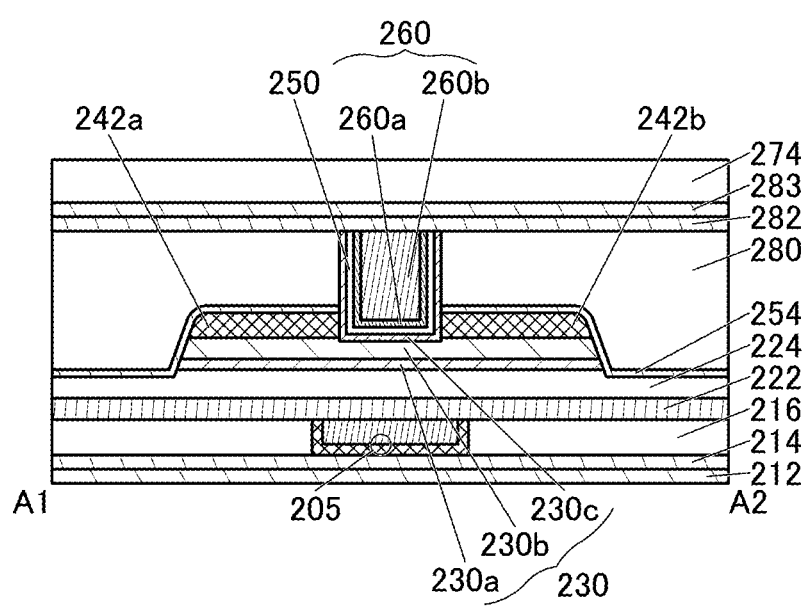

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 11A to FIG. 11C). Accordingly, the oxide 230c is placed so as to cover the inner wall (the side wall and bottom surface) of the opening reaching the oxide 230b. The insulator 250 is placed so as to cover the inner wall of the opening with the oxide 230c therebetween. The conductor 260 is placed so as to fill the opening with the oxide 230c and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280.

Next, the insulator 282 is deposited over the oxide 230c, the insulator 250, the conductor 260, and the insulator 280. The insulator 282 can be deposited by a sputtering method, a CVD method, an MBE method, a PLD method, an ALD method, or the like. Aluminum oxide is preferably deposited as the insulator 282 by a sputtering method, for example. When the insulator 282 is deposited by a sputtering method in an oxygen-containing atmosphere, oxygen can be added to the insulator 280 during the deposition. At this time, the insulator 282 is preferably deposited while the substrate is being heated. The insulator 282 is preferably formed in contact with the top surface of the conductor 260, in which case oxygen contained in the insulator 280 can be inhibited from being absorbed by the conductor 260 in a later heat treatment.

Next, the insulator 283 is deposited over the insulator 282. The insulator 283 can be deposited by a sputtering method, a CVD method, an MBE method, a PLD method, an ALD method, or the like (see FIG. 11B and FIG. 11C). As the insulator 283, silicon nitride or silicon nitride oxide is preferably deposited.

Next, heat treatment may be performed. In this embodiment, treatment is performed at 400° C. in a nitrogen atmosphere for one hour. By the heat treatment, oxygen added by the deposition of the insulator 282 can be diffused to the insulator 280 and supplied to the oxide 230a and the oxide 230b through the oxide 230c. Note that the heat treatment is not necessarily performed after the deposition of the insulator 283 and may be performed after the deposition of the insulator 282.

Next, the insulator 274 may be deposited over the insulator 283. The insulator 274 can be deposited by a sputtering method, a CVD method, an MBE method, a PLD method, an ALD method, or the like (see FIG. 11B and FIG. 11C).

Next, openings reaching the conductor 242a and the conductor 242b are formed in the insulator 254, the insulator 280, the insulator 282, the insulator 283, and the insulator 274. The openings may be formed by a lithography method.

Subsequently, an insulating film to be the insulator 241 is formed and the insulating film is subjected to anisotropic etching, so that the insulator 241 is formed. The insulating film can be formed by a sputtering method, a CVD method, an MBE method, a PLD method, an ALD method, or the like. As the insulating film, an insulating film having a function of inhibiting passage of oxygen is preferably used. For example, an aluminum oxide film or a silicon nitride film is preferably formed by an ALD method. In particular, silicon nitride is preferable because it has high blocking property against hydrogen.

For the anisotropic etching of the insulating film, a dry etching method or the like is employed, for example. When the insulator 241 is provided on the side wall portions of the openings, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is formed. The conductive film desirably has a stacked-layer structure that includes a conductor having a function of inhibiting diffusion of impurities such as water and hydrogen. For example, a stacked layer of tantalum nitride, titanium nitride, or the like and tungsten, molybdenum, copper, or the like can be employed. The conductive film can be formed by a sputtering method, a CVD method, an MBE method, a PLD method, an ALD method, or the like.

Then, CMP treatment is performed, thereby removing part of the conductive film to be the conductor 240a and the conductor 240b to expose the insulator 274. As a result, the conductive film remains only in the openings, so that the conductor 240a and the conductor 240b having flat top surfaces can be formed (see FIG. 2A and FIG. 2B). Note that the insulator 274 is partly removed by the CMP treatment in some cases.

Through the above process, the semiconductor device including the transistor 200 shown in FIG. 2A to FIG. 2D can be fabricated. As shown in FIG. 4A to FIG. 11C, the transistor 200 can be fabricated with the use of the method for manufacturing the semiconductor device described in this embodiment.

According to one embodiment of the present invention, a semiconductor device having high reliability can be provided. According to another embodiment of the present invention, a semiconductor device having excellent electrical characteristics can be provided. According to another embodiment of the present invention, a semiconductor device having a high on-state current can be provided. According to another embodiment of the present invention, a semiconductor device that can be miniaturized or highly integrated can be provided. According to another embodiment of the present invention, a semiconductor device having low power consumption can be provided.

The structure, method, and the like shown in this embodiment can be used in an appropriate combination with the structures, methods, and the like described in the other embodiments and examples.

Embodiment 3

In this embodiment, one embodiment of a semiconductor device (a memory device) is described with reference to FIG. 13 and FIG. 14.

[Memory Device 1]

Figure 13:
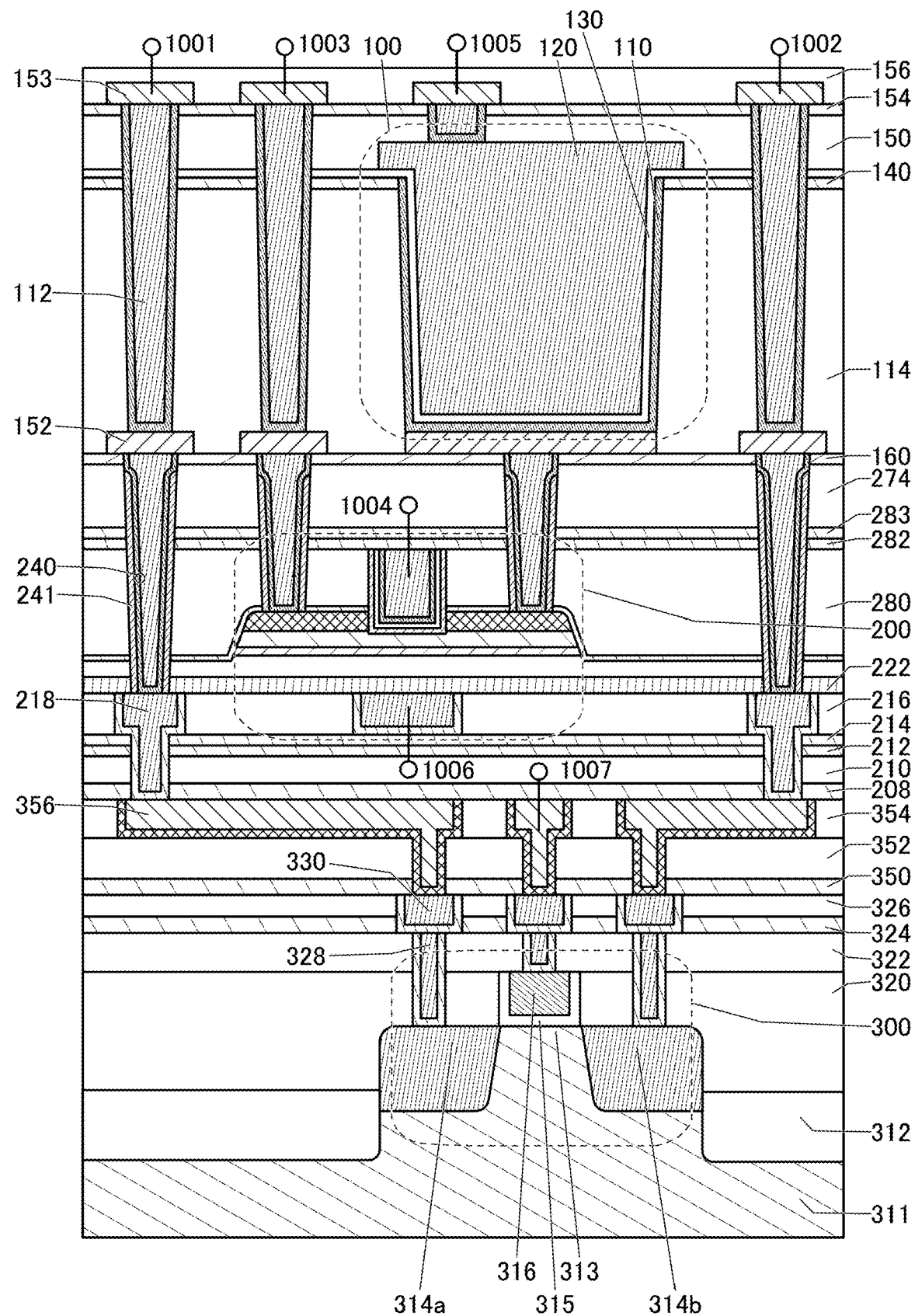
FIG. 13 is a cross-sectional view showing a structure of a memory device according to one embodiment of the present invention.

FIG. 13 shows an example of a semiconductor device (a memory device) that uses a semiconductor device of one embodiment of the present invention. In the semiconductor device of one embodiment of the present invention, the transistor 200 is provided above a transistor 300, and a capacitor 100 is provided above the transistor 200. Preferably, at least part of the capacitor 100 or the transistor 300 overlaps with the transistor 200. This can reduce the area occupied by the capacitor 100, the transistor 200, and the transistor 300 in a top view, whereby the semiconductor device of this embodiment can be miniaturized or highly integrated. The semiconductor device in this embodiment can be applied to logic circuits typified by a CPU (Central Processing Unit) and a GPU (Graphics Processing Unit) and memory circuits typified by a DRAM (Dynamic Random Access Memory) and an NVM (Non-Volatile Memory), for example.

The transistor 200 described in the above embodiment can be used as the transistor 200. Therefore, for the transistor 200 and layers including the transistor 200, the description in the above embodiment can be referred to.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of 10 digits or larger in the temperature range of 125° C. to 150° C. In other words, in comparison with a transistor including silicon in a semiconductor layer, the transistor 200 excels in characteristics such as on-state current and frequency characteristics at higher temperatures.

In the semiconductor device shown in FIG. 13, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200, a wiring 1004 is electrically connected to a first gate of the transistor 200, and a wiring 1006 is electrically connected to a second gate of the transistor 200. The other of the source and the drain of the transistor 200 is electrically connected to one electrode of the capacitor 100, and a wiring 1005 is electrically connected to the other electrode of the capacitor 100.

The semiconductor device shown in FIG. 13 has characteristics of being capable of retaining charge stored in one of the electrodes of the capacitor 100 by switching of the transistor 200; thus, writing, retention, and reading of data can be performed. The transistor 200 is an element in which a back gate is provided in addition to the source, the gate (a top gate), and the drain. That is, the transistor 200 is a four-terminal element; hence, its input and output can be controlled independently of each other in a simpler manner than that of two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, the semiconductor device shown in FIG. 13 features in high write endurance and a few structure changes because data rewriting is performed by charging or discharging of electrons with the transistor and the capacitor.

Furthermore, by arranging the semiconductor devices shown in FIG. 13 in a matrix, a memory cell array can be formed. In this case, the transistor 300 can be used in a read circuit, a driver circuit, or the like that is connected to the memory cell array. When the semiconductor device shown in FIG. 13 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is placed over the semiconductor region 313, and the conductor 316 is placed over the insulator 315. The transistors 300 formed in the same layer are electrically isolated from one another by an insulator 312 functioning as an element isolation insulating layer. The insulator 312 can be formed using an insulator similar to an insulator 326 or the like described later. The transistor 300 may be a p-channel transistor or an n-channel transistor.

In the substrate 311, a region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. It is also possible to employ a structure using silicon whose effective mass is controlled by applying stress to the crystal lattice and thereby changing the lattice spacing. Alternatively, the transistor 300 may be an HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to obtain both conductivity and embeddability, it is preferable to use stacked layers of metal materials such as tungsten and aluminum for the conductor, and it is particularly preferable to use tungsten in terms of heat resistance.

Here, in the transistor 300 shown in FIG. 13, the semiconductor region 313 (part of the substrate 311) in which the channel is formed has a convex shape. Furthermore, the conductor 316 is provided so as to cover a side surface and the top surface of the semiconductor region 313 with the insulator 315 therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Although the case where the convex portion is formed by processing part of the semiconductor substrate is described here, a semiconductor film having a convex shape may be formed by processing an SOI substrate.

Note that the transistor 300 shown in FIG. 13 is an example and the structure is not limited thereto; an appropriate transistor is used in accordance with a circuit structure or a driving method.

As shown in FIG. 13, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device shown in FIG. 13, a silicon-based semiconductor material and an oxide semiconductor can be used in different layers. The semiconductor device shown in FIG. 13 can be manufactured in a process similar to that employing a manufacturing apparatus for a semiconductor device using a silicon-based semiconductor material, and can be highly integrated.

<Capacitor>

The capacitor 100 includes an insulator 114 over an insulator 160, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. The capacitor 100 has a structure in which the upper electrode and the lower electrode face each other with the dielectric therebetween on a side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 114 and the insulator 150. The insulator 140 preferably functions as an etching stopper at the time of forming the opening in the insulator 114 and is formed using an insulator that can be used as the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 110 is placed in contact with the opening formed in the insulator 140 and the insulator 114. The top surface of the conductor 110 is preferably substantially level with the top surface of the insulator 140. A conductor 152 provided over the insulator 160 is in contact with the bottom surface of the conductor 110. The conductor 110 is preferably deposited by an ALD method, a CVD method, or the like; for example, a conductor that can be used as the conductor 205 is used.

The insulator 130 is positioned to cover the conductor 110 and the insulator 140. The insulator 130 is preferably deposited by an ALD method or a CVD method, for example. The insulator 130 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for example.

For the insulator 130, a material with high dielectric strength, such as silicon oxynitride, or a high dielectric constant (high-k) material is preferably used. Alternatively, a stacked-layer structure using a material with high dielectric strength and a high dielectric (high-k) material may be employed.

As a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride deposited by an ALD method, silicon oxide deposited by a PEALD method, and silicon nitride deposited by an ALD method are stacked in this order. The use of such an insulator having high dielectric strength can increase the dielectric strength and inhibit electrostatic breakdown of the capacitor 100.

The conductor 120 is placed to fill the opening formed in the insulator 140 and the insulator 114. The conductor 120 is electrically connected to the wiring 1005 through a conductor 112 and a conductor 153. The conductor 120 is preferably deposited by an ALD method, a CVD method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and the insulator 326 are stacked over the transistor 300 in this order as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 13, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 208, an insulator 210, the insulator 212, the insulator 214, and the insulator 216 are stacked in this order over the insulator 354 and the conductor 356. A conductor 218, a conductor (the conductor 205) included in the transistor 200, and the like are embedded in the insulator 208, the insulator 210, the insulator 212, the insulator 214, and the insulator 216. Note that the conductor 218 functions as a plug or a wiring that is electrically connected to the transistor 300.

The conductor 112, conductors included in the capacitor 100 (the conductor 120 and the conductor 110), and the like are embedded in the insulator 114, the insulator 140, the insulator 130, the insulator 150, and an insulator 154. Note that the conductor 112 functions as a plug or a wiring that electrically connects the capacitor 100, the transistor 200, or the transistor 300 to the conductor 153 functioning as a terminal.

The conductor 153 is provided over the insulator 154 and is covered with an insulator 156. Here, the conductor 153 is in contact with a top surface of the conductor 112 and functions as a terminal of the capacitor 100, the transistor 200, or the transistor 300.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material having a low relative permittivity is used for the insulator functioning as an interlayer film, the parasitic capacitance generated between wirings can be reduced. Thus, a material is preferably selected depending on the function of an insulator.

For example, an insulator with low relative permittivity is preferably used for the insulator 320, the insulator 322, the insulator 326, the insulator 352, the insulator 354, the insulator 210, the insulator 114, the insulator 150, the insulator 156, and the like. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity.

Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be higher than or equal to $1.0\times10^{12}$ $\Omega$cm and lower than or equal to $1.0\times10^{15}$ $\Omega$cm, preferably higher than or equal to $5.0\times10^{12}$ $\Omega$cm and lower than or equal to $1.0\times10^{14}$ $\Omega$cm, further preferably higher than or equal to $1.0\times10^{13}$ $\Omega$cm and lower than or equal to $5.0\times10^{13}$ $\Omega$cm. The resistivity of the insulator provided over or under the conductor 152 or the conductor 153 is preferably within the above range because the insulator can disperse charges accumulated between the transistor 200, the transistor 300, the capacitor 100, and wirings such as the conductor 152 while maintaining the insulating property, and thus, poor characteristics and electrostatic breakdown of the transistor and the semiconductor device including the transistor due to the charges can be inhibited. For such an insulator, silicon nitride or silicon nitride oxide can be used. For example, the resistivity of the insulator 160 or the insulator 154 can be set within the above range.

When a transistor using an oxide semiconductor is surrounded by insulators having a function of inhibiting passage of oxygen and impurities such as hydrogen, the electrical characteristics of the transistor can be stable. Thus, an insulator having a function of inhibiting the passage of oxygen and impurities such as hydrogen is used as the insulator 324, the insulator 350, the insulator 208, and like.

For the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

For the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, the conductor 152, the conductor 153, and the like, a single layer or stacked layers of conductive materials such as a metal material, an alloy material, a metal nitride material, and a metal oxide material that are formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the insulator 280 including excess oxygen and the conductor 240 in FIG. 13. When the insulator 241 is provided in contact with the insulator 282 and the insulator 283, the conductor 240 and the transistor 200 can be sealed by the insulators that have a barrier property.

That is, the excess oxygen contained in the insulator 280 can be inhibited from being absorbed by the conductor 240 when the insulator 241 is provided. In addition, diffusion of hydrogen, which is an impurity, into the transistor 200 through the conductor 240 can be inhibited when the insulator 241 is provided.

Here, the conductor 240 functions as a plug or a wiring that is electrically connected to the transistor 200 or the transistor 300.

The above is the description of the structure example. With the use of this structure, a semiconductor device using a transistor including an oxide semiconductor can be miniaturized or highly integrated. A change in electrical characteristics can be inhibited and reliability can be improved in a semiconductor device using a transistor including an oxide semiconductor. A transistor including an oxide semiconductor and having a high on-state current can be provided. A transistor including an oxide semiconductor and having a low off-state current can be provided. A semiconductor device with low power consumption can be provided.

[Memory Device 2]

Figure 14:
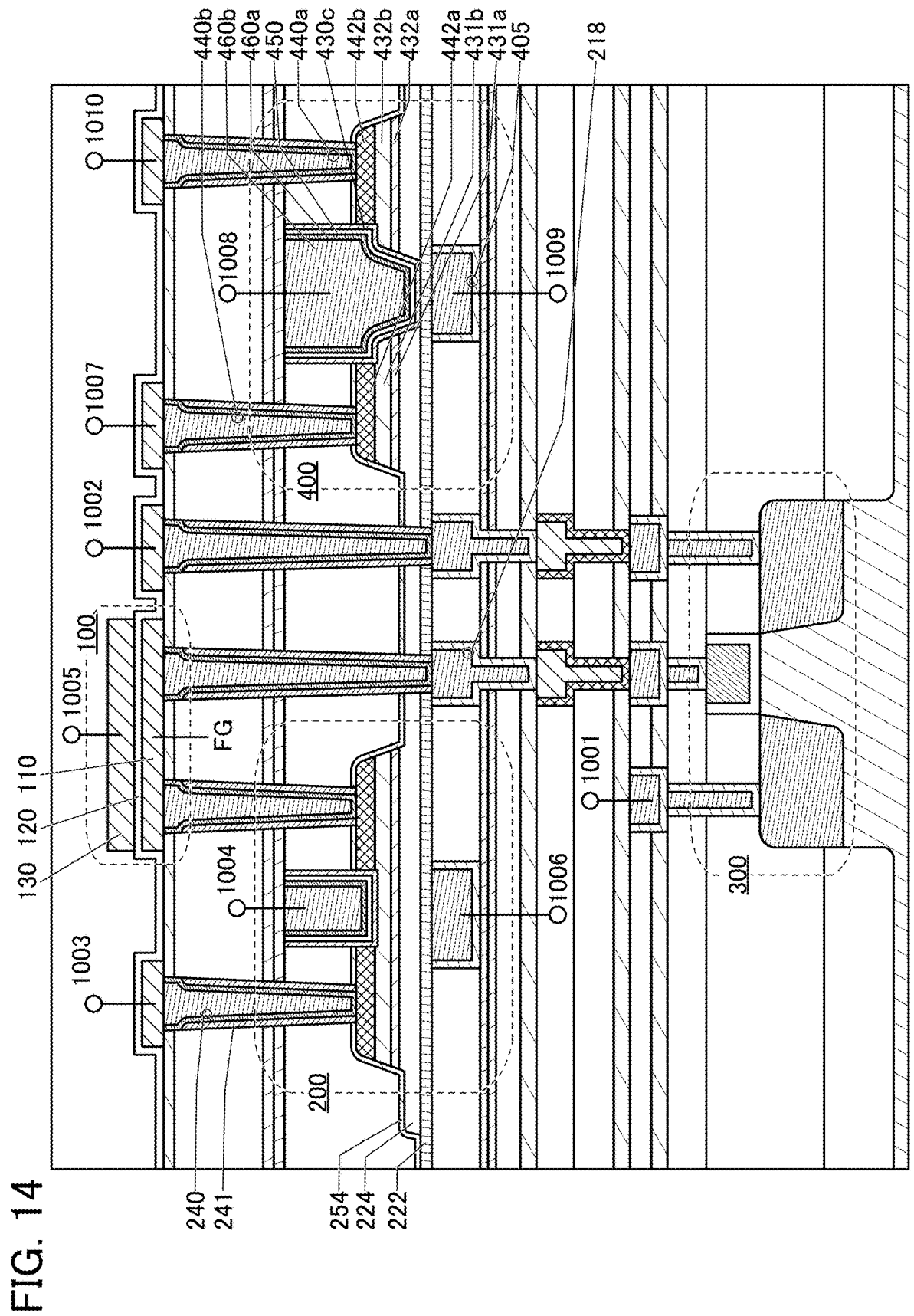
FIG. 14 is a cross-sectional view showing a structure of a memory device according to one embodiment of the present invention.

FIG. 14 shows an example of a memory device that uses the semiconductor device of one embodiment of the present invention. The memory device shown in FIG. 14 includes a transistor 400 in addition to the semiconductor device including the transistor 200, the transistor 300, and the capacitor 100 shown in FIG. 13. The memory device shown in FIG. 14 differs from the memory device shown in FIG. 13 in that the capacitor 100 is a planar capacitor and that the transistor 200 is electrically connected to the transistor 300.

In the memory device of one embodiment of the present invention, the transistor 200 is provided above the transistor 300, and the capacitor 100 is provided above the transistor 300 and the transistor 200. At least part of the capacitor 100 or the transistor 300 preferably overlaps with the transistor 200. This can reduce the area occupied by the capacitor 100, the transistor 200, and the transistor 300 in a top view, whereby the memory device of this embodiment can be miniaturized or highly integrated.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is retained in this structure, the first gate-source voltage and the second gate-source voltage of the transistor 400 become 0 V. In the transistor 400, a drain current at the time when a second gate voltage and a first gate voltage are 0 V is extremely low; thus, the negative potential of the second gate of the transistor 200 can be maintained for a long time even without power supply to the transistor 200 and the transistor 400. Accordingly, the memory device including the transistor 200 and the transistor 400 can retain stored data for a long time.

In FIG. 14, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the first gate of the transistor 200, and the wiring 1006 is electrically connected to the second gate of the transistor 200. The gate of the transistor 300 and the other of the source and the drain of the transistor 200 are electrically connected to one electrode of the capacitor 100, and the wiring 1005 is electrically connected to the other electrode of the capacitor 100. The wiring 1007 is electrically connected to the source of the transistor 400, a wiring 1008 is electrically connected to the first gate of the transistor 400, a wiring 1009 is electrically connected to the second gate of the transistor 400, and a wiring 1010 is electrically connected to the drain of the transistor 400. Here, the wiring 1006, the wiring 1007, the wiring 1008, and the wiring 1009 are electrically connected to one other.

A node where the gate of the transistor 300, the other of the source and the drain of the transistor 200, and the one electrode of the capacitor 100 are connected to one another is referred to as a node FG in some cases. The semiconductor device shown in FIG. 14 has characteristics of being capable of retaining the potential of the gate of the transistor 300 (the node FG) by switching of the transistor 200; thus, writing, retention, and reading of data can be performed.

When the memory devices shown in FIG. 14 are arranged in a matrix like the memory devices shown in FIG. 13, a memory cell array can be formed. Note that one transistor 400 can control the second gate voltages of a plurality of transistors 200. For this reason, the number of transistors 400 is preferably smaller than the number of transistors 200.

Note that as the transistor 200 and the transistor 300, those described above in Memory device 1 can be used. Therefore, the above description on Memory device 1 can be referred to for the transistor 200, the transistor 300, and the layers including them.

The conductor 218 is embedded in the insulator 208, the insulator 210, the insulator 212, the insulator 214, and the insulator 216. The conductor 218 functions as a plug or a wiring that is electrically connected to the capacitor 100, the transistor 200, the transistor 300, or the transistor 400. For example, the conductor 218 is electrically connected to the conductor 316 functioning as the gate electrode of the transistor 300.

Note that the conductor 240 functions as a plug or a wiring that is electrically connected to the capacitor 100, the transistor 200, the transistor 300, or the transistor 400. For example, the conductor 240 electrically connects the conductor 242*b* functioning as the other of the source and the drain of the transistor 200 and the conductor 110 functioning as one electrode of the capacitor 100 through the conductor 240.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in Memory device 1 can be used.

Although FIG. 14 shows an example in which a planar capacitor is used as the capacitor 100, the semiconductor device of this embodiment is not limited thereto. For example, the capacitor 100 may be a cylinder capacitor 100 like that shown in FIG. 13.

<Transistor 400>

The transistor 400 and the transistor 200 are formed in the same layer and thus can be fabricated in parallel. The transistor 400 includes a conductor 460 (a conductor 460a and a conductor 460b) functioning as a first gate; a conductor 405 functioning as a second gate; the insulator 222 and an insulator 450 functioning as gate insulators; an oxide 430c including a channel formation region; a conductor 442a, an oxide 431b, and an oxide 431a functioning as a source; a conductor 442b, an oxide 432b, and an oxide 432a functioning as a drain; and a conductor 440 (a conductor 440a and a conductor 440b) functioning as a plug.

The conductor 405 and the conductor 205 are formed in the same layer. The oxide 431a and the oxide 432a are formed in the same layer as the oxide 230a, and the oxide 431b and the oxide 432b are formed in the same layer as the oxide 230b. The conductor 442a and the conductor 442b are formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be further increased, the off-state current can be reduced, and the drain current at the time when the second gate voltage and the first gate voltage are 0 V can be extremely low.

<Dicing Line>

A dicing line (also referred to as a scribe line, a dividing line, or a cutting line in some cases), which is provided when a large-sized substrate is divided into semiconductor elements so that a plurality of semiconductor devices are each formed in a chip form, is described below. Examples of a dividing method include the case where a groove (a dicing line) for dividing the semiconductor elements is formed on the substrate, and then the substrate is cut along the dicing line to be divided (split) into a plurality of semiconductor devices.

Here, for example, a region in which the insulator 254 and the insulator 222 are in contact with each other is preferably designed to be the dicing line as shown in FIG. 14. That is, an opening is provided in the insulator 224 in the vicinity of the region to be the dicing line that is provided in an outer edge of the transistor 400 and the memory cell including a plurality of transistors 200. The insulator 254 is provided so at to cover the side surface of the insulator 224.

That is, in the opening provided in the insulator 224, the insulator 222 is in contact with the insulator 254. For example, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water, even when the substrate is divided into circuit regions each of which is provided with the semiconductor elements in this embodiment to form a plurality of chips, the entry and diffusion of impurities such as hydrogen or water from the side surface direction of the divided substrate into the transistor 200 and the transistor 400 can be prevented.

Furthermore, the structure can prevent excess oxygen in the insulator 224 from diffusing to the outside of the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be reduced and reliability can be improved.

This embodiment can be implemented in an appropriate combination with the structures described in the other embodiments, the examples, and the like.

Embodiment 4

In this embodiment, a memory device of one embodiment of the present invention including a transistor in which an oxide is used as a semiconductor (hereinafter referred to as an OS transistor in some cases) and a capacitor (hereinafter such a memory device is referred to as an OS memory device in some cases) will be described with reference to FIG. 15A, FIG. 15B, and FIG. 16A to FIG. 16H. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 15A:
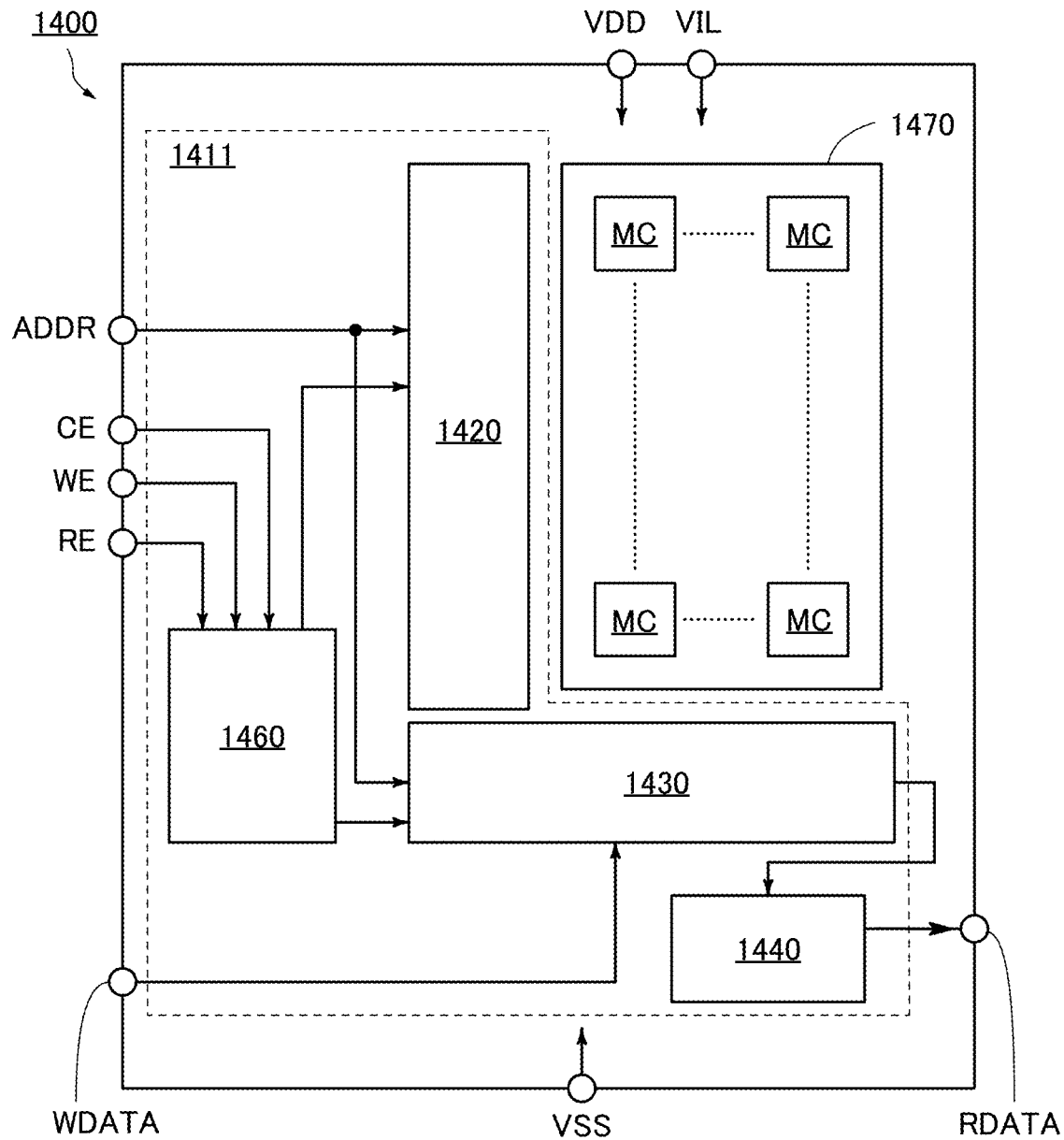
FIG. 15A is a block diagram showing a structure example of a memory device according to one embodiment of the present invention.

FIG. 15A shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 15B:
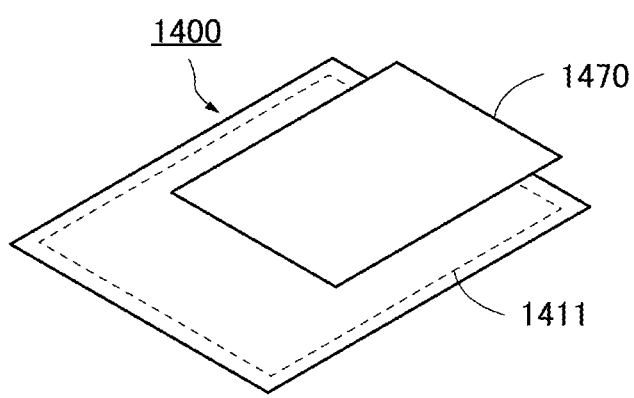
FIG. 15B is a schematic view showing a structure example of the memory device according to one embodiment of the present invention.

Note that FIG. 15A shows an example in which the peripheral circuit 1411 and the memory cell array 1470 are formed on the same plane; however, this embodiment is not limited thereto. For example, as shown in FIG. 15B, the memory cell array 1470 may be provided over the peripheral circuit 1411 so as to partly overlap with the peripheral circuit 1411. For example, the sense amplifier may be provided below the memory cell array 1470 so that they overlap with each other.

FIG. 16A to FIG. 16H show structure examples of memory cells applicable to the aforementioned memory cell MC.

[DOSRAM]

Figure 16A:
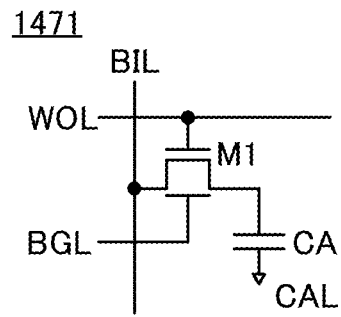
FIG. 16A to FIG. 16H are circuit diagrams showing structure examples of a memory device according to one embodiment of the present invention.
Figure 16B:
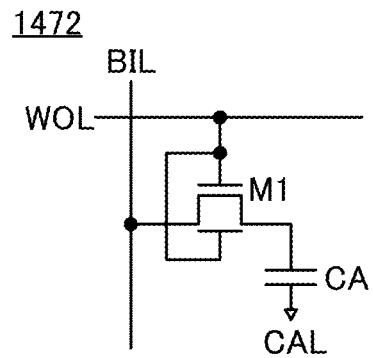
Figure 16C:
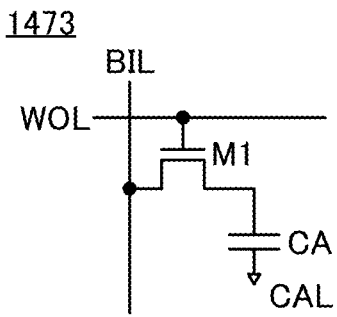

FIG. 16A to FIG. 16C each show a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 shown in FIG. 16A includes a transistor M1 and a capacitor CA. Note that the transistor M1 includes a gate (also referred to as a top gate in some cases) and a back gate.

A first terminal of the transistor M1 is connected to a first terminal of the capacitor CA; a second terminal of the transistor M1 is connected to a wiring BIL; a gate of the transistor M1 is connected to a wiring WOL; and a back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 shown in FIG. 16A corresponds to the memory device shown in FIG. 13. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 shown in FIG. 13 corresponds to a transistor provided in the peripheral circuit 1411 of the memory device 1400 shown in FIG. 15A and FIG. 15B.

The memory cell MC is not limited to the memory cell 1471, and the circuit structure can be changed. For example, as in a memory cell 1472 shown in FIG. 16B, the back gate of the transistor M1 may be connected not to the wiring BGL but to the wiring WOL in the memory cell MC. Alternatively, for example, like a memory cell 1473 shown in FIG. 16C, the memory cell MC may be a memory cell including a single-gate transistor, that is, the transistor M1 that does not include a back gate.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, and the memory cell 1473.

In the DOSRAM, when the sense amplifier is provided below the memory cell array 1470 so as to overlap with the memory cell array 1470 as described above, the bit line can be shortened. This reduces the bit line capacitance, which reduces the storage capacitance of the memory cell.

[NOSRAM]

FIG. 16D to FIG. 16G each show a circuit structure example of a gain-cell memory cell including two transistors and one capacitor. A memory cell 1474 shown in FIG. 16D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB; a second terminal of the transistor M2 is connected to a wiring WBL; the gate of the transistor M2 is connected to the wiring WOL; and the back gate of the transistor M2 is connected to the wiring BGL. A second terminal of the capacitor CB is connected to the wiring CAL. A first terminal of the transistor M3 is connected to the wiring RBL; a second terminal of the transistor M3 is connected to the wiring SL; and a gate of the transistor M3 is connected to the first terminal of the capacitor CB.

The wiring WBL functions as a write bit line; the wiring RBL functions as a read bit line; and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 16D:
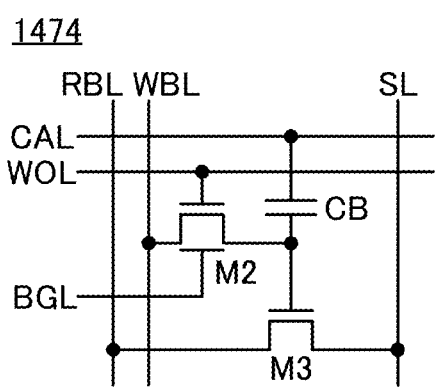
Figure 16E:
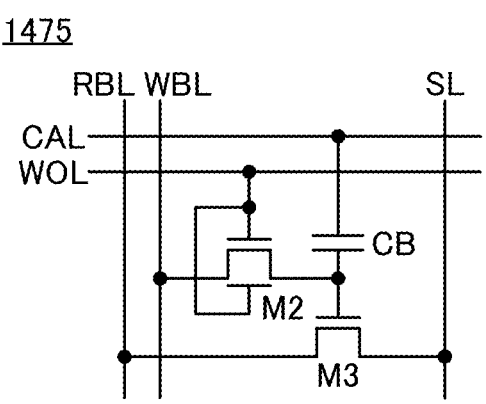
Figure 16F:
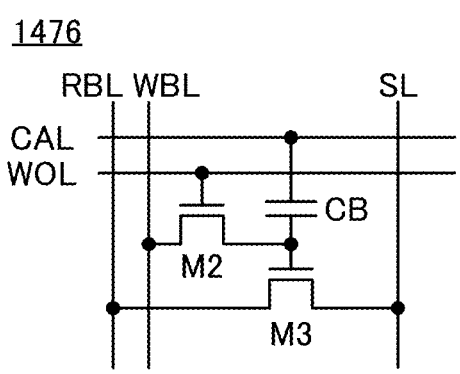
Figure 16G:
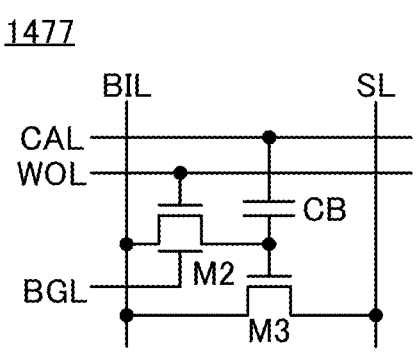

Here, the memory cell 1474 shown in FIG. 16D corresponds to the memory device shown in FIG. 14. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The memory cell MC is not limited to the memory cell 1474, and the circuit structure can be changed as appropriate. For example, like a memory cell 1475 shown in FIG. 16E, the memory cell MC may have a structure in which the back gate of the transistor M2 is connected not to the wiring BGL but to the wiring WOL. Alternatively, for example, like a memory cell 1476 shown in FIG. 16F, the memory cell MC may be a memory cell including a single-gate transistor, that is, the transistor M2 that does not include a back gate. Alternatively, for example, like a memory cell 1477 shown in FIG. 16G, the memory cell MC may have a structure where the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cell 1475 to the memory cell 1477.

Note that the transistor M3 may be a transistor containing silicon in a channel formation region (hereinafter such a transistor is referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

The transistor M3 may be an OS transistor. When OS transistors are used as the transistor M2 and the transistor M3, the circuit of the memory cell array 1470 can be formed using only n-channel transistors.

Figure 16H:
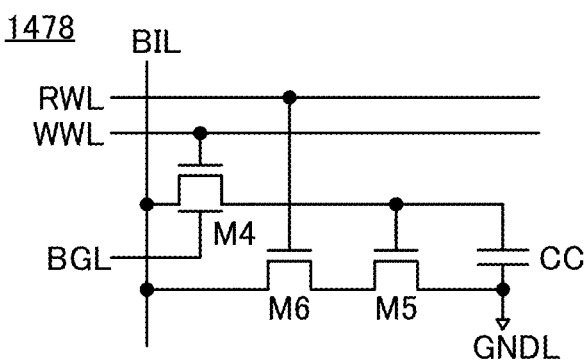

FIG. 16H shows an example of a gain-cell memory cell including three transistors and one capacitor. A memory cell 1478 shown in FIG. 16H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

In the case where the semiconductor device described in the above embodiment is used in the memory cell 1478, the transistor 200 can be used as the transistor M4, the transistors 300 can be used as the transistor M5 and the transistor M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, deleted, or added as needed.

The structure described in this embodiment can be used in an appropriate combination with the structures described in the other embodiments, examples, and the like.

Embodiment 5

In this embodiment, an example of a chip 1200 on which the semiconductor device of the present invention is mounted will be described with reference to FIG. 17A and FIG. 17B. A plurality of circuits (systems) are mounted on the chip 1200. The technique for integrating a plurality of circuits (systems) on one chip as described above is referred to as system on chip (SoC) in some cases.

Figure 17A:
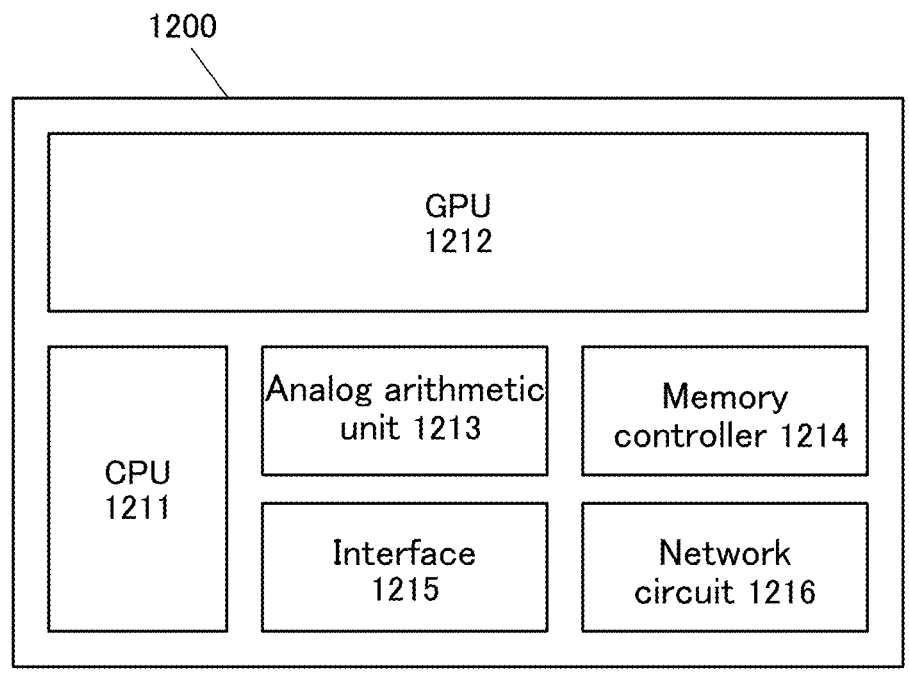
FIG. 17A is a block diagram of a semiconductor device according to one embodiment of the present invention.

As shown in FIG. 17A, the chip 1200 includes a CPU 1211, a GPU 1212, one or more of analog arithmetic units 1213, one or more of memory controllers 1214, one or more of interfaces 1215, one or more of network circuits 1216, and the like.

Figure 17B:
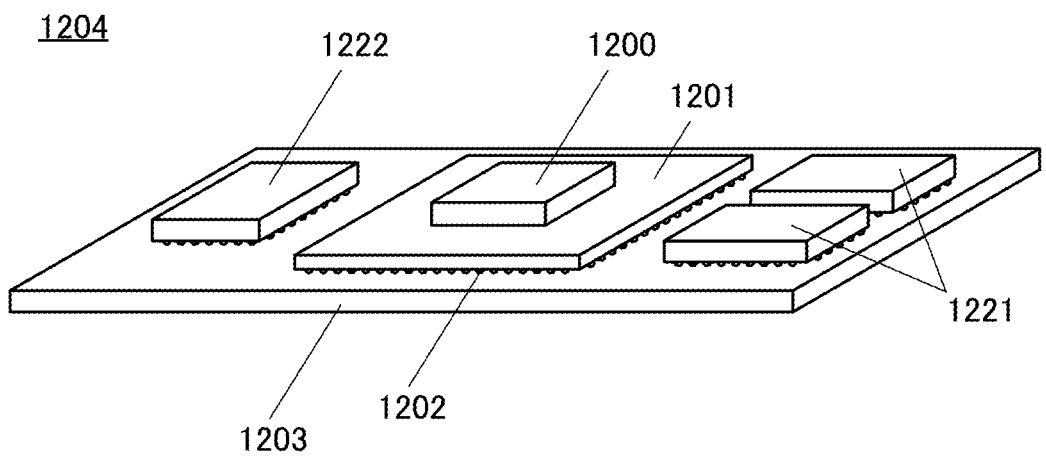
FIG. 17B is a schematic view of a semiconductor device according to one embodiment of the present invention.

The chip 1200 is provided with a bump (not illustrated), and is connected to a first surface of a printed circuit board (PCB) 1201 as shown in FIG. 17B. The rear side of the first surface of the PCB 1201 is provided with a plurality of bumps 1202, and is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute a method in a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an AI system module.

The structure described in this embodiment can be used in an appropriate combination with the structures described in the other embodiments, examples, and the like.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 18A to FIG. 18E schematically show some structure examples of removable memory devices. The semiconductor device described in the above embodiment is processed into a packaged memory chip and used in a variety of storage devices and removable memories, for example.

Figure 18A:
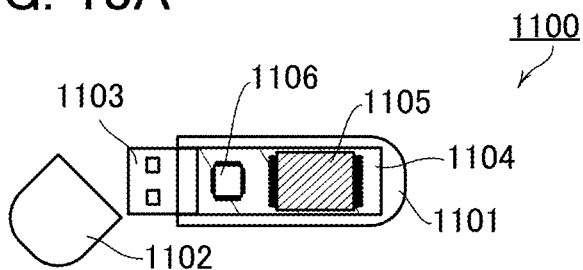
FIG. 18A to FIG. 18E are schematic views of memory devices according to one embodiment of the present invention.

FIG. 18A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figure 18B:
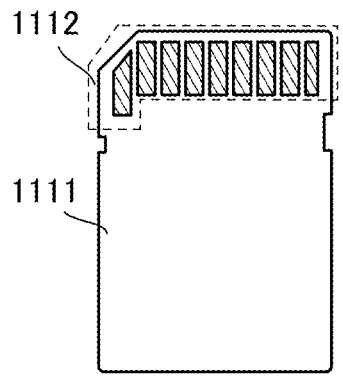
Figure 18C:
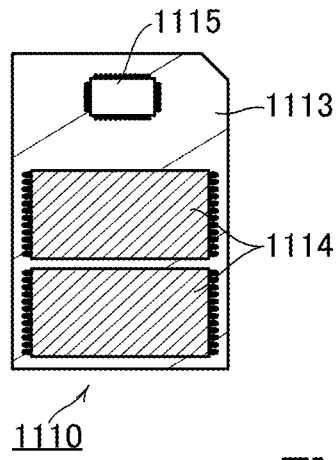

FIG. 18B is a schematic external view of an SD card, and FIG. 18C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 18D:
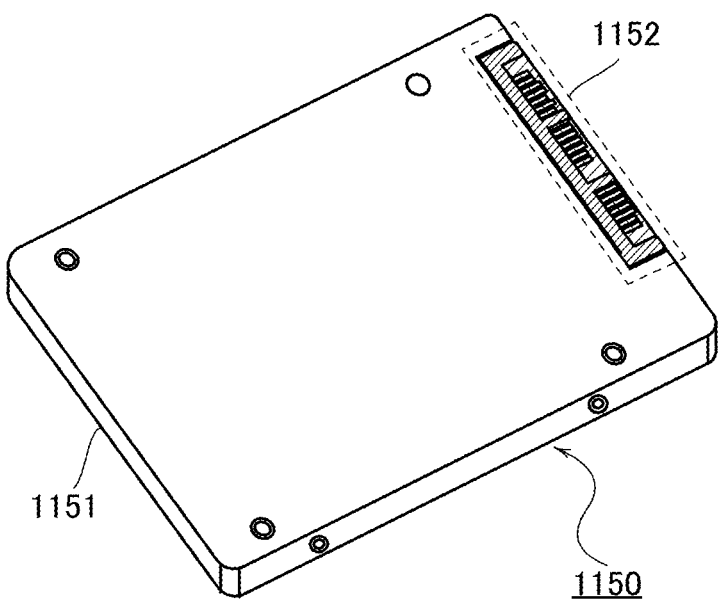
Figure 18E:
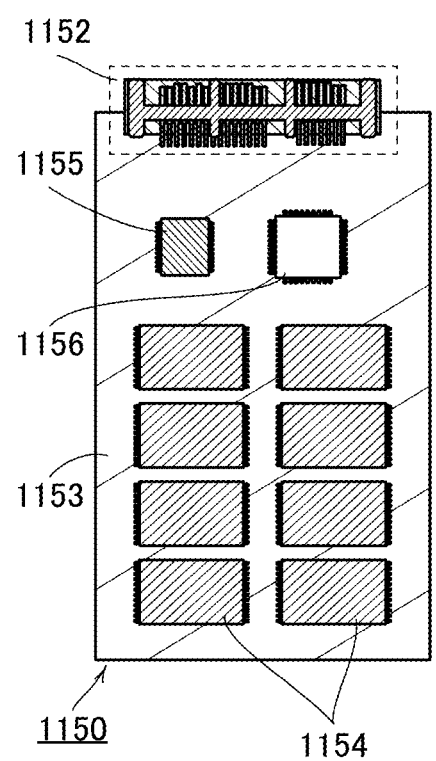

FIG. 18D is a schematic external view of an SSD, and FIG. 18E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, examples, and the like.

Embodiment 7

The semiconductor device of one embodiment of the present invention can be used for a processor such as a CPU or a GPU or a chip. FIG. 19A to FIG. 19H show specific examples of electronic devices including a processor such as a CPU or a GPU or a chip of one embodiment of the present invention.

<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 19A to FIG. 19H illustrates examples of electronic devices.

[Information Terminal]

Figure 19A:
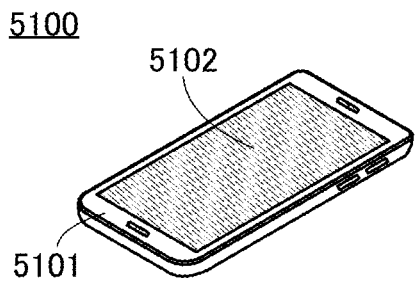
FIG. 19A to FIG. 19H are views showing electronic devices according to one embodiment of the present invention.

FIG. 19A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 19B:
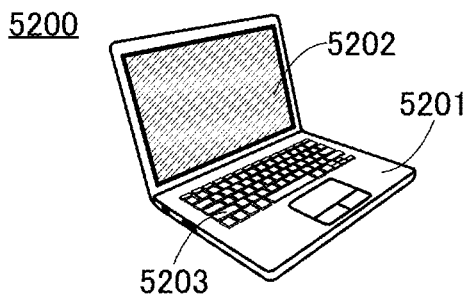

FIG. 19B illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 19A and FIG. 19B as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 19C:
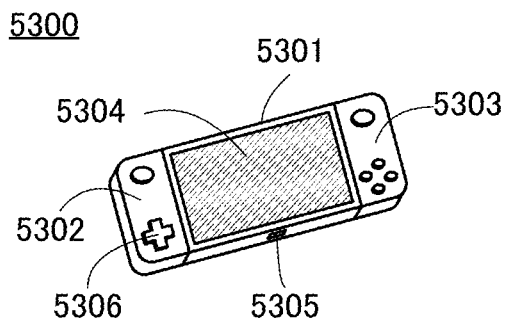

FIG. 19C shows a portable game machine 5300, which is an example of a game machine.

The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 19D:
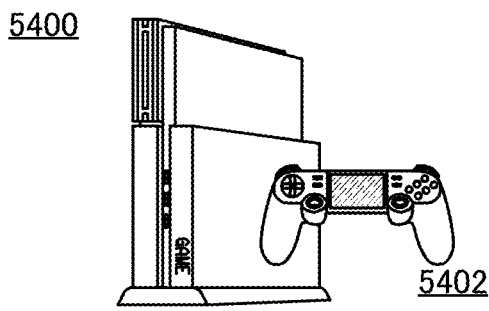

FIG. 19D shows a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, it is possible to achieve expressions in which questions posed by the player, the progress of the game, time, and the actions and words of game characters are changed.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 19C and FIG. 19D as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 19E:
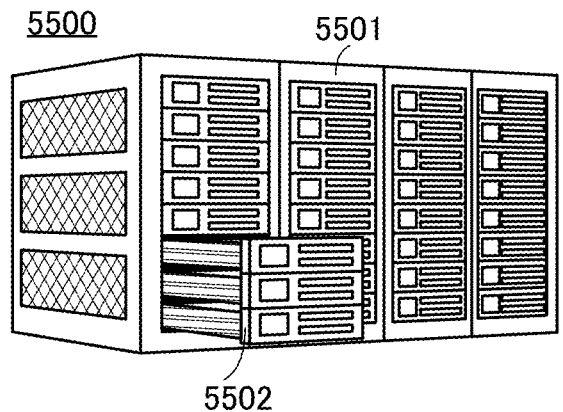
Figure 19F:
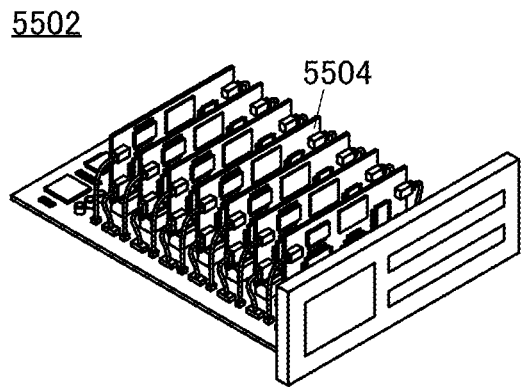

FIG. 19E shows a supercomputer 5500 as an example of a large computer. FIG. 19F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 19E and FIG. 19F, a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 19G:
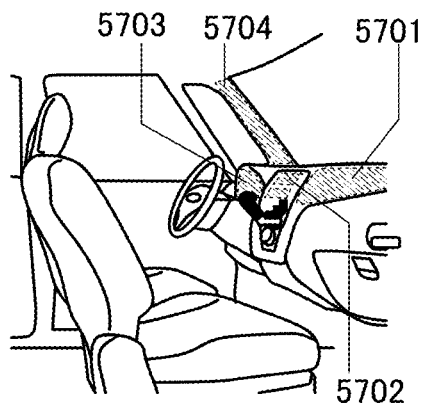

FIG. 19G illustrates the periphery of a windshield inside an automobile, which is an example of a moving vehicle. FIG. 19G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gearshift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 19H:
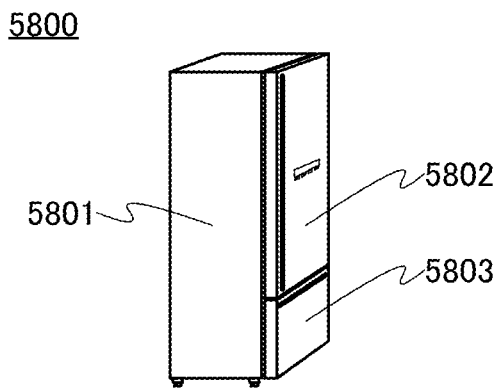

FIG. 19H shows an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electronic oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in an appropriate combination with the structures described in the other embodiments, examples, and the like.

Example 1

In this example, evaluation was made on the easiness of formation of a layer at the interface between a metal oxide and a tantalum nitride, the oxidation resistance of the tantalum nitride, and the conductivity of the tantalum nitride in a stacked-layer structure of the metal oxide and the tantalum nitride. Specifically, various analyses were performed on Samples (Sample 1A to Sample 5A) in each of which a tantalum nitride film was formed over a metal oxide film and Samples (Sample 1B to Sample 5B) in each of which a tantalum nitride film was formed over a metal oxide film and heat treatment was performed, and the thickness of an oxide film formed on a surface of the tantalum nitride film, the thickness of a layer formed at the interface between the metal oxide film and the tantalum nitride film, and the resistivity of the tantalum nitride film were calculated.

A method for fabricating Sample 1A to Sample 5A will be described below.

A surface of a substrate containing silicon was subjected to heat treatment in a hydrogen chloride (HCl) atmosphere, and a 100-nm-thick silicon oxide film was formed over the substrate. Next, a 15-nm-thick metal oxide film was formed over the silicon oxide film by a sputtering method. In the formation of the metal oxide film, an oxide target with In:Ga:Zn=4:2:4.1 [atomic ratio] was used; an oxygen gas at 45 sccm was used as a deposition gas; the deposition pressure was 0.7 Pa; the deposition power was 0.5 kW; the substrate temperature was 200° C.; and the distance between the oxide target and the substrate was 60 mm.

Next, a 100-nm-thick tantalum nitride film was formed over the metal oxide film by a sputtering method. In the formation of the tantalum nitride film, a metal tantalum target was used; the deposition pressure was 0.6 Pa; the deposition power was 1 kW; the substrate temperature was room temperature (R.T.); and the distance between the target and the substrate was 60 mm.

Note that the flow rate of the deposition gas used for forming the tantalum nitride film was different among Sample 1A to Sample 5A. Specifically, for Sample 1A, an argon gas at 55 sccm and a nitrogen gas at 5 sccm were used. For Sample 2A, an argon gas at 50 sccm and a nitrogen gas at 10 sccm were used. For Sample 3A, an argon gas at 40 sccm and a nitrogen gas at 20 sccm were used. For Sample 4A, an argon gas at 30 sccm and a nitrogen gas at 30 sccm were used. For Sample 5A, an argon gas at 10 sccm and a nitrogen gas at 50 sccm were used.

Through the above processes, Sample 1A to Sample 5A were fabricated.

Note that the higher the flow rate ratio of the nitrogen gas to the deposition gases is, the higher the atomic ratio of nitrogen to tantalum in the tantalum nitride film is. Accordingly, the atomic ratio of nitrogen to tantalum in the tantalum nitride film is the highest in Sample 5A, followed by Sample 4A, Sample 3A, Sample 2A, and Sample 1A.

A method for fabricating Sample 1B to Sample 5B is described below. Note that the steps up to the formation of the tantalum nitride film in the method for fabricating Sample 1B to Sample 5B are the same as those in the method for fabricating Sample 1A to Sample 5A.

Next, heat treatment was performed. The heat treatment was performed at a temperature of 400° C. in an oxygen atmosphere for one hour. Note that Sample 1B was obtained by performing the heat treatment on a sample with the same structure as Sample 1A. Sample 2B was obtained by performing the heat treatment on a sample with the same structure as Sample 2A. Sample 3B was obtained by performing the heat treatment on a sample with the same structure as Sample 3A. Sample 4B was obtained by performing the heat treatment on a sample with the same structure as Sample 4A. Sample 5B was obtained by performing the heat treatment on a sample with the same structure as Sample 5A.

Through the above processes, Sample 1B to Sample 5B were fabricated.

Note that as in Sample 1A to Sample 5A, the atomic ratio of nitrogen to tantalum in the tantalum nitride film is the highest in Sample 5B, followed by Sample 4B, Sample 3B, Sample 2B, and Sample 1B.

<Analysis by X-Ray Diffraction>

Results of X-ray diffraction (XRD) measurement performed on Sample 1A to Sample 5A are described.

In this example, as an XRD apparatus, D8 DISCOVER manufactured by Bruker Corporation was used. The conditions were as follows: scanning was performed by an Out-of-plane method at θ/2θ; the scanning range was 15 deg. to 80 deg.; the step width was 0.02 deg.; and the accumulation time per point was 0.1 seconds.

Figure 20A:
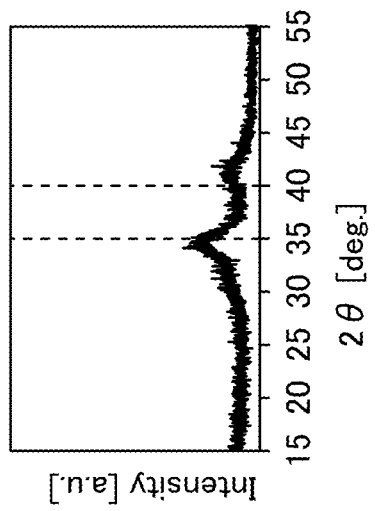
FIG. 20A to FIG. 20E are graphs illustrating the measurement results of XRD spectra of samples in Example.
Figure 20B:
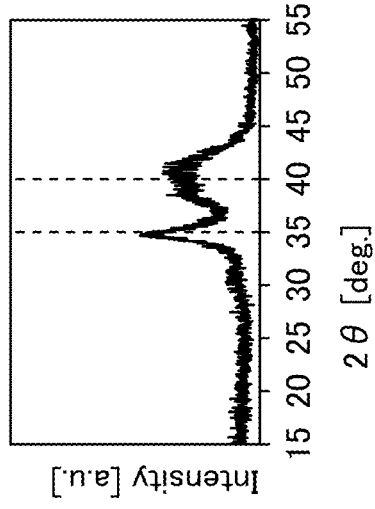
Figure 20C:
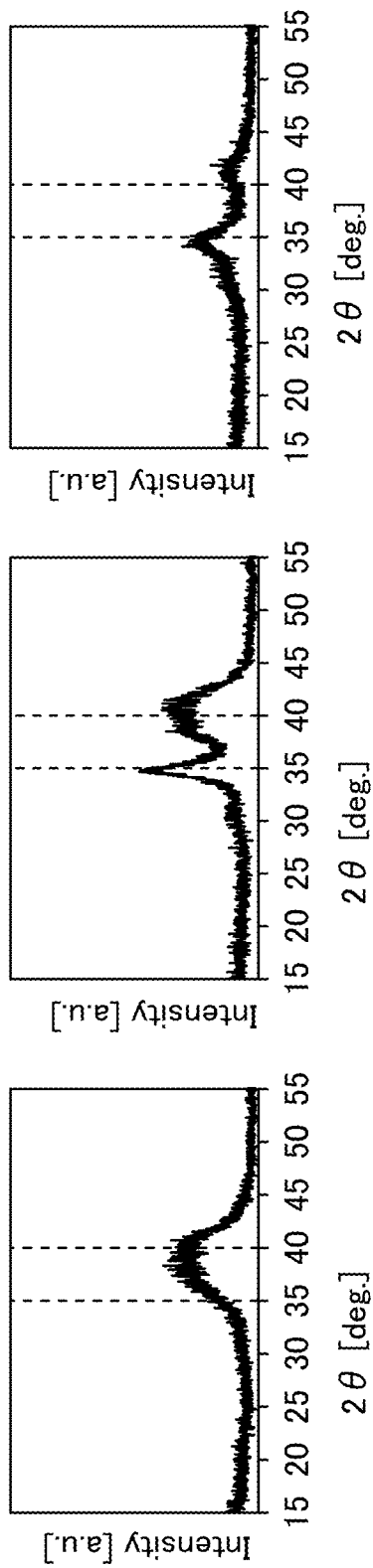
Figure 20D:
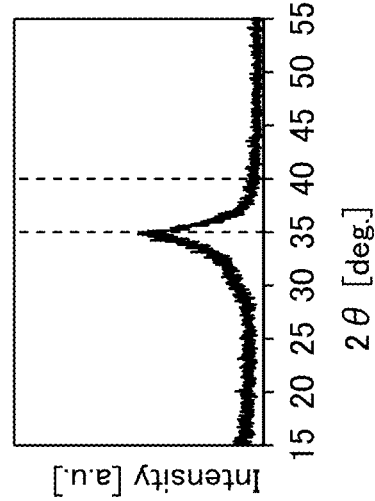
Figure 20E:
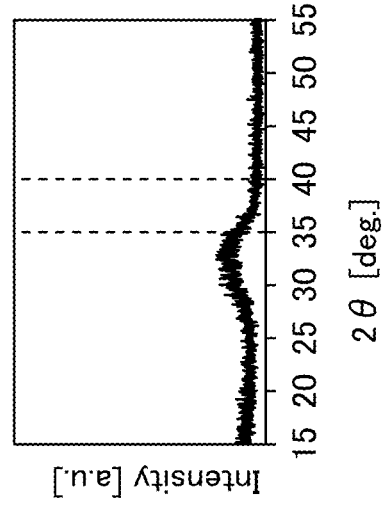

FIG. 20A to FIG. 20E show the results of XRD spectra measured by an Out-of-plane method. FIG. 20A shows an XRD spectrum of Sample 1A; FIG. 20B, an XRD spectrum of Sample 2A; FIG. 20C, an XRD spectrum of Sample 3A; FIG. 20D, an XRD spectrum of Sample 4A; and FIG. 20E, an XRD spectrum of Sample 5A. The horizontal axis represents 2θ [deg.] and the vertical axis represents intensity [a.u.]. The dashed lines shown around 2θ=35 deg. and 2θ=40 deg. represent peak positions indicating crystallinity of tantalum nitride.

FIG. 20A to FIG. 20E indicate that all the tantalum nitride films of Sample 1A to Sample 5A have crystallinity.

<Cross-Sectional STEM Images and EDX Analysis>

Next, observation results of Sample 1B to Sample 5B with a scanning transmission electron microscope (STEM) and analysis results of Sample 1B to Sample 5B with energy dispersive X-ray spectroscopy (EDX) are described.

In this example, cross-sectional STEM images were taken at an accelerating voltage of 200 kV using "HD-2700" manufactured by Hitachi High-Technologies Corporation and a composition line analysis was performed by EDX.

Note that the composition line analysis by EDX was performed to calculate the thickness of a layer formed at the interface between the metal oxide film and the tantalum nitride film. Here, the thickness of the layer is the difference between the position of the interface between the layer and the metal oxide film and the position of the interface between the bottom surface of the tantalum nitride film and the layer. Specifically, the layer and its vicinity are subjected to EDX line analysis, with the direction perpendicular to the substrate surface as the depth direction. Next, in the profile of quantitative values of elements in the depth direction, which is obtained from the analysis, the depth (position) of the interface between the layer and the metal oxide film is regarded as a depth at which the quantitative value of a metal that is the main component of the metal oxide film but is not the main component of the tantalum nitride film (in this example, gallium) becomes half. In addition, the depth (position) of the interface between the bottom surface of the tantalum nitride film and the layer is regarded as a depth at which the quantitative value of oxygen in the metal oxide film becomes half. In this manner, the thickness of the layer can be calculated.

FIG. 21A to FIG. 21E show the taken cross-sectional STEM images. FIG. 21A shows a cross-sectional STEM image of Sample 1B; FIG. 21B, a cross-sectional STEM image of Sample 2B; FIG. 21C, a cross-sectional STEM image of Sample 3B; FIG. 21D, a cross-sectional STEM image of Sample 4B; and FIG. 21E, a cross-sectional STEM image of Sample 5B. Note that the cross-sectional STEM images shown in FIG. 21A to FIG. 21E are phase contrast images (TE images). The thickness of the oxide film formed on the surface of the tantalum nitride film was measured using the cross-sectional STEM images shown in FIG. 21A to FIG. 21E.

Figure 22:
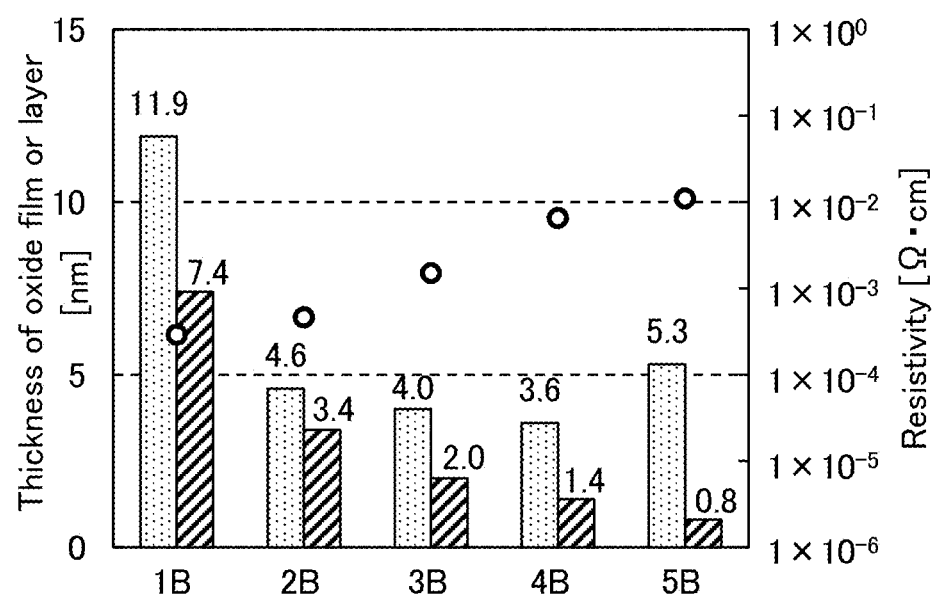
FIG. 22 is a graph illustrating the calculation results of the thicknesses and resistivities of an oxide film and a layer of samples in Example.

FIG. 22 shows calculation results of the thickness of the oxide film formed on the surface of the tantalum nitride film. In FIG. 22, a bar graph shown on the left side of each sample indicates the thickness [nm] of the oxide film. The thickness of the oxide film in Sample 1B was 11.9 nm, the thickness of the oxide film in Sample 2B was 4.6 nm, the thickness of the oxide film in Sample 3B was 4.0 nm, the thickness of the oxide film in Sample 4B was 3.6 nm, and the thickness of the oxide film in Sample 5B was 5.3 nm.

From the above, it is confirmed that the thickness of the oxide film is likely to decrease as the atomic ratio of nitrogen to tantalum in the tantalum nitride film increases. It is thus suggested that as the atomic ratio of nitrogen to tantalum in the tantalum nitride film is higher, the oxide film is less likely to be formed on the surface of the tantalum nitride film and the tantalum nitride film is less likely to be oxidized.

FIG. 22 shows the calculation results of the thickness of the layer formed at the interface between the metal oxide film and the tantalum nitride film. In FIG. 22, a bar graph shown on the right side of each sample indicates the thickness [nm] of the layer. The thickness of the layer in Sample 1B was 7.4 nm, the thickness of the layer in Sample 2B was 3.4 nm, the thickness of the layer in Sample 3B was 2.0 nm, the thickness of the layer in Sample 4B was 1.4 nm, and the thickness of the layer in Sample 5B was 0.8 nm.

From the above, it is confirmed that the thickness of the layer is likely to decrease as the atomic ratio of nitrogen to tantalum in the tantalum nitride film increases. It is thus suggested that as the atomic ratio of nitrogen to tantalum in the tantalum nitride film is higher, the layer is less likely to be formed between the tantalum nitride film and the metal oxide.

<Resistivity>

Next, the resistivity of the tantalum nitride film of each of Sample 1B to Sample 5B was calculated. Specifically, the resistivity of the tantalum nitride film was calculated by measuring sheet resistances at five points in a plane of each of Sample 1B to Sample 5B, calculating the average value of the sheet resistances obtained at the five points, and converting the calculated average value into 100 nm that is an intended thickness. Note that the resistivity processor (product name: 2-10) manufactured by NPS, INC. was used for the measurement.

FIG. 22 shows calculation results of the resistivity of the tantalum nitride film. In FIG. 22, a circle mark for each sample indicates the resistivity [Ω·cm] of the tantalum nitride film. The resistivity of the tantalum nitride film was $2.9\times10^{-4}$ Ω·cm in Sample 1B; $4.6\times10^{-4}$ Ω·cm in Sample 2B; $1.5\times10^{-3}$ Ω·cm in Sample 3B; $6.5\times10^{-3}$ Ω·cm in Sample 4B; and $1.1\times10^{-2}$ Ω·cm in Sample 5B.

From the above, it is confirmed that the resistivity of the tantalum nitride film is likely to decrease as the atomic ratio of nitrogen to tantalum in the tantalum nitride film decreases. It is thus suggested that as the atomic ratio of nitrogen to tantalum in the tantalum nitride film decreases, the conductivity of the tantalum nitride film increases.

At least part of the structure, the method, and the like shown in this example can be implemented in appropriate combination with other embodiments and examples described in this specification.

Example 2

In this example, hydrogen-transmitting properties of insulating films were evaluated. Specifically, samples (Sample 2C to Sample 5C) in each of which an insulating film whose hydrogen-transmitting property was to be evaluated was provided between an insulating film containing deuterium and an insulating film functioning as a quantification layer and a sample (Sample 1C) in which the insulating film was not provided were fabricated, and the deuterium concentrations in the insulating films functioning as quantification layers were measured by secondary ion mass spectrometry (SIMS).

First, a method for fabricating Sample 1C to Sample 5C is described.

A method for fabricating Sample 1C is described. A surface of a substrate containing silicon was subjected to heat treatment in a hydrogen chloride (HCl) atmosphere, and a 100-nm-thick silicon oxide film was formed over the substrate. Next, a 100-nm-thick first silicon oxynitride film was formed over the silicon oxide film by a CVD method. Note that the first silicon oxynitride film was formed using a silane ($SiH_4$) gas, a dinitrogen monoxide ($N_2O$) gas, and an argon gas containing 5% deuterium ($D_2$), whereby the first silicon oxynitride film was able to contain deuterium at a proportion higher than or equal to the natural abundance.

Next, a 100-nm-thick second silicon oxynitride film was formed over the first silicon oxynitride film by a CVD method. Note that the second silicon oxynitride film was formed using a silane ($SiH_4$) gas and a dinitrogen monoxide ($N_2O$) gas, so that deuterium was mixed into the second silicon oxynitride film at approximately the natural abundance. Through the above process, Sample 1C was fabricated.

Next, a method for fabricating Sample 2C is described. As in Sample 1C, a silicon oxide film and a first silicon oxynitride film were formed over a substrate containing silicon. Next, a 10-nm-thick silicon nitride film was formed over the first silicon oxynitride film by a sputtering method. Next, a 100-nm-thick second silicon oxynitride film was formed over the silicon nitride film by a method similar to that for Sample 1C. Through the above process, Sample 2C was fabricated.

Next, a method for fabricating Sample 3C is described. As in Sample 2C, a silicon oxide film, a first silicon oxynitride film, a silicon nitride film, and a second silicon oxynitride film were formed over a substrate containing silicon. Next, heat treatment was performed at 400° C. in a nitrogen atmosphere for 4 hours. Through the above process, Sample 3C was fabricated.

Next, a method for fabricating Sample 4C is described. As in Sample 1C, a silicon oxide film and a first silicon oxynitride film were formed over a substrate containing silicon. Next, a 10-nm-thick silicon nitride film was formed over the first silicon oxynitride film by a CVD method. Next, a 100-nm-thick second silicon oxynitride film was formed over the silicon nitride film by a method similar to that for Sample 1C. Through the above process, Sample 4C was fabricated.

Next, a method for fabricating Sample 5C is described. As in Sample 4C, a silicon oxide film, a first silicon oxynitride film, a silicon nitride film, and a second silicon oxynitride film were formed over a substrate containing silicon. Next, heat treatment was performed at 400° C. in a nitrogen atmosphere for 4 hours. Through the above process, Sample 5C was fabricated.

Through the above processes, Sample 1C to Sample 5C were fabricated. Table 1 summarizes the processing conditions of the samples.

TABLE 1

| Sample No. | 1C | 2C | 3C | 4C | 5C |
|---|---|---|---|---|---|
| Heat treatment | No | No | Yes | No | Yes |
| Second silicon oxynitride film | | | 100 nm | | |
| Silicon nitride film (CVD method) | | | | 10 nm | |
| Silicon nitride film (sputtering method) | | | 10 nm | | |
| First silicon oxynitridefilm | | | 100 nm | | |
| Silicon oxide film | | | 100 nm | | |

Figure 23A:
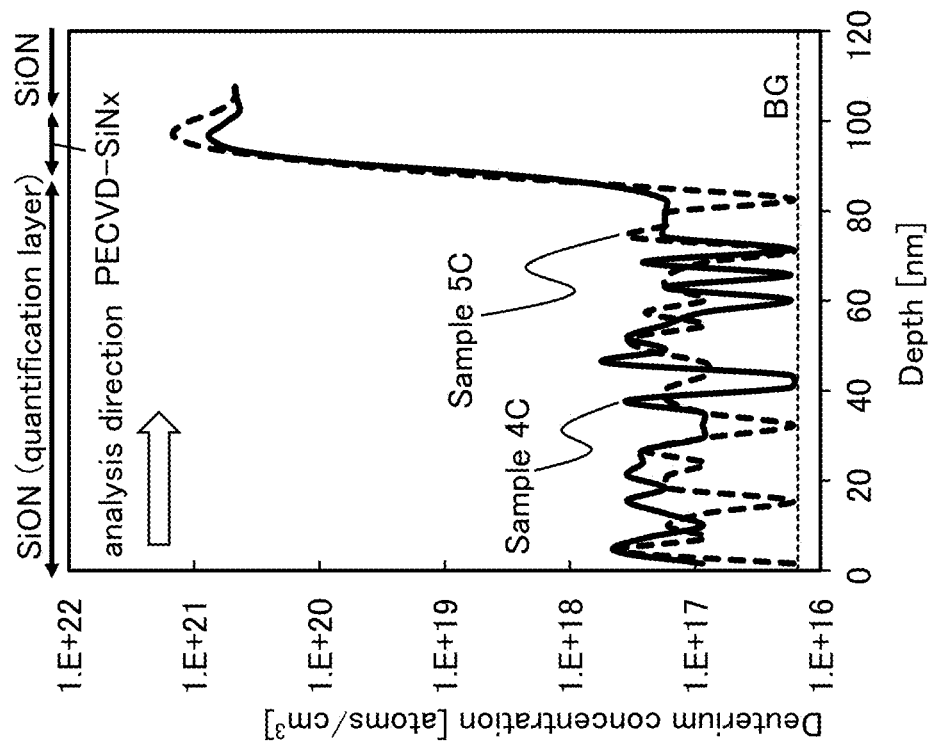
FIG. 23A and FIG. 23B are graphs showing the SIMS analysis results in Example.
Figure 23B:
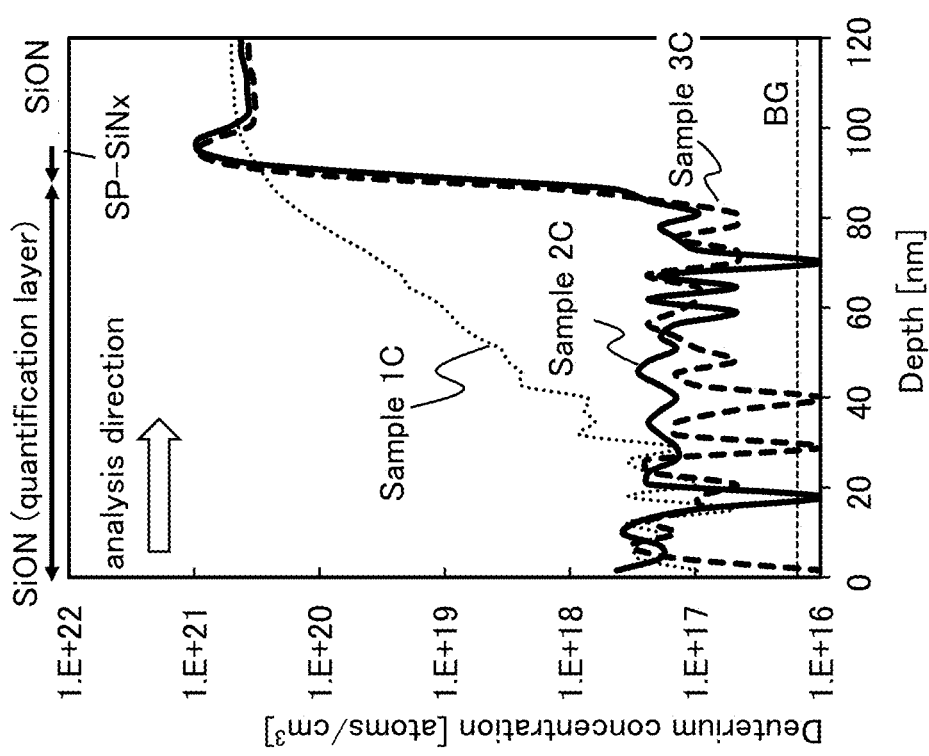

The deuterium concentration in the second silicon oxynitride film in each of Sample 1C to Sample 5C fabricated above was evaluated with a SIMS analysis apparatus. Note that the analysis was performed on the surface of each sample. FIG. 23A and FIG. 23B show the SIMS analysis results. In FIG. 23A and FIG. 23B, the horizontal axis represents depth [nm] in the direction perpendicular to the film surface of the sample, and the vertical axis represents the deuterium concentration [atoms/cm$^3$] in the film. In FIG. 23A and FIG. 23B, the deuterium concentration in the second silicon oxynitride film (SiON (quantification layer) in FIG. 23A and FIG. 23B) is quantified.

FIG. 23A shows the SIMS analysis results of Sample 1C, Sample 2C, and Sample 3C, and shows deuterium concentration profiles in the depth direction of the second silicon oxynitride film. In FIG. 23A, the dotted line represents the deuterium concentration profile of Sample 1C, the solid line represents the deuterium concentration profile of Sample 2C, and the dashed line represents the deuterium concentration profile of Sample 3C.

FIG. 23A indicates that the deuterium concentration in the second silicon oxynitride film in Sample 1C becomes higher toward the interface between the second silicon oxynitride film and the first silicon oxynitride film. This reveals that deuterium contained in the first silicon oxynitride film is diffused into the second silicon oxynitride film by the temperature applied to the substrate during the formation of the second silicon oxynitride film.

FIG. 23A reveals that the deuterium concentration in the second silicon oxynitride film in Sample 3C is substantially the same as the deuterium concentration in the second silicon oxynitride film in Sample 2C. This indicates that providing the silicon nitride film formed by a sputtering method between the first silicon oxynitride film and the second silicon oxynitride film inhibits diffusion of deuterium contained in the first silicon oxynitride film into the second silicon oxynitride film even when heat treatment is performed. That is, it is found that the silicon nitride film formed by a sputtering method has a low hydrogen-transmitting property.

FIG. 23B shows the SIMS analysis results of Sample 4C and Sample 5C, and shows deuterium concentration profiles in the depth direction of the second silicon oxynitride film over the silicon nitride film formed by a CVD method. In FIG. 23A, the solid line represents the deuterium concentration profile of Sample 4C, and the dashed line represents the deuterium concentration profile of Sample 5C.

FIG. 23B reveals that the deuterium concentration in the second silicon oxynitride film in Sample 5C is substantially the same as the deuterium concentration in the second silicon oxynitride film in Sample 4C. This indicates that providing the silicon nitride film formed by a CVD method between the first silicon oxynitride film and the second silicon oxynitride film inhibits diffusion of deuterium contained in the first silicon oxynitride film into the second silicon oxynitride film even when heat treatment is performed. That is, it is found that the silicon nitride film formed by a CVD method has a low hydrogen-transmitting property.

At least part of the structure, the method, and the like shown in this example can be implemented in appropriate combination with other embodiments and examples described in this specification.

Example 3

In this example, the ease of diffusion of hydrogen and oxygen from a metal oxide to a tantalum nitride in a stacked-layer structure of the metal oxide and the tantalum nitride was evaluated. Specifically, SIMS analysis was performed on samples that included a tantalum nitride film over a metal oxide film and were subjected to heat treatment (Sample 1D to Sample 4D and Sample 1E to Sample 4E).

A method for fabricating Sample 1D to Sample 4D will be described below.

A surface of a substrate containing silicon was subjected to heat treatment in a hydrogen chloride (HCl) atmosphere, and a 100-nm-thick silicon oxide film was formed over the substrate. Next, a 50-nm-thick metal oxide film was formed over the silicon oxide film by a sputtering method. In the formation of the metal oxide film, an In—Ga—Zn oxide target with In:Ga:Zn=4:2:4.1 [atomic ratio] was used; an argon gas at 30 sccm containing 5% deuterium ($D_2$) and an oxygen gas at 15 sccm were used as a deposition gas; the deposition pressure was 0.4 Pa; the deposition power was 200 W; and the substrate temperature was room temperature (R.T.). Thus, a metal oxide film containing deuterium (D) can be formed.

Next, a 100-nm-thick tantalum nitride film was formed over the metal oxide film by a sputtering method. In the formation of the tantalum nitride film, a metal tantalum target was used; an argon gas at 50 sccm and a nitrogen gas at 10 sccm were used as a deposition gas; the deposition pressure was 0.6 Pa; the deposition power was 1 kW; the substrate temperature was room temperature (R.T.); and the distance between the target and the substrate was 60 mm.

Next, heat treatment was performed. Note that the temperature of the heat treatment was different among Sample 1D to Sample 4D. Specifically, Sample 1D was not subjected to the heat treatment. Sample 2D was subjected to heat treatment in a nitrogen atmosphere at 300° C. for one hour. Sample 3D was subjected to heat treatment at 350° C. in a nitrogen atmosphere for one hour. Sample 4D was subjected to heat treatment at 400° C. in a nitrogen atmosphere for one hour.

Through the above processes, Sample 1D to Sample 4D were fabricated.

Next, a method for fabricating Sample 1E to Sample 4E will be described.

A surface of a substrate containing silicon was subjected to heat treatment in a hydrogen chloride (HCl) atmosphere, and a 100-nm-thick silicon oxide film was formed over the substrate. Next, a 300-nm-thick silicon oxynitride film was formed over the silicon oxide film by a CVD method. In the formation of the silicon oxynitride film, a silane ($SiH_4$) gas at 2.3 sccm and a nitrous oxide ($N_2O$) gas at 800 sccm were used as a deposition gas; the deposition pressure was 40 Pa; the deposition power was 50 W (27.12 MHz); the substrate temperature was 400° C.; and the distance between the electrodes was 15 mm.

Next, an oxygen ion ($^{16}O^+$) was implanted into the silicon oxynitride film by an ion implantation method. The conditions for the oxygen ion implantation were as follows: the acceleration voltage was 60 keV; the dosage was $2.0 \times 10^{16}$ ions/cm$^2$; the tilt angle was 0°; and the twist angle was 0°.

Next, a 20-nm-thick metal oxide film was formed over the silicon oxynitride film by a sputtering method. In the formation of the metal oxide film, an In—Ga—Zn oxide target with In:Ga:Zn=4:2:4.1 [atomic ratio] was used; an oxygen ($^{18}O_2$) gas at 45 sccm was used as a deposition gas; the deposition pressure was 0.7 Pa; the deposition power was 500 W; the substrate temperature was 200° C.; and the distance between the target and the substrate was 60 mm. Thus, a metal oxide film containing 18O can be formed.

Next, first heat treatment was performed. In the first heat treatment, treatment was performed at 400° C. in a nitrogen atmosphere for one hour, and treatment was successively performed at 400° C. in an oxygen atmosphere for one hour.

Next, a 50-nm-thick tantalum nitride film was formed over the metal oxide film by a sputtering method. In the formation of the tantalum nitride film, a metal tantalum target was used; an argon gas at 50 sccm and a nitrogen gas at 10 sccm were used as a deposition gas; the deposition pressure was 0.6 Pa; the deposition power was 1 kW; the substrate temperature was room temperature (R.T.); and the distance between the target and the substrate was 60 mm.

Next, second heat treatment was performed. Note that the temperature of the second heat treatment was different among Sample 1E to Sample 4E. Specifically, Sample 1E was not subjected to the second heat treatment. Sample 2E was subjected to heat treatment in a nitrogen atmosphere at 300° C. for one hour. Sample 3E was subjected to heat treatment at 350° C. in a nitrogen atmosphere for one hour. Sample 4E was subjected to heat treatment at 400° C. in a nitrogen atmosphere for one hour.

Through the above processes, Sample 1E to Sample 4E were fabricated.

The hydrogen (H) concentration and the deuterium (D) concentration in tantalum nitride in each of Sample 1D to Sample 4D were evaluated with a SIMS analysis apparatus. Note that the SIMS analysis was performed on the surface of each sample. The oxygen (18O) concentration in tantalum nitride in each of Sample 1E to Sample 4E was also evaluated with a SIMS analysis apparatus. Note that the SIMS analysis was performed on the surface of each sample.

Figure 24A:
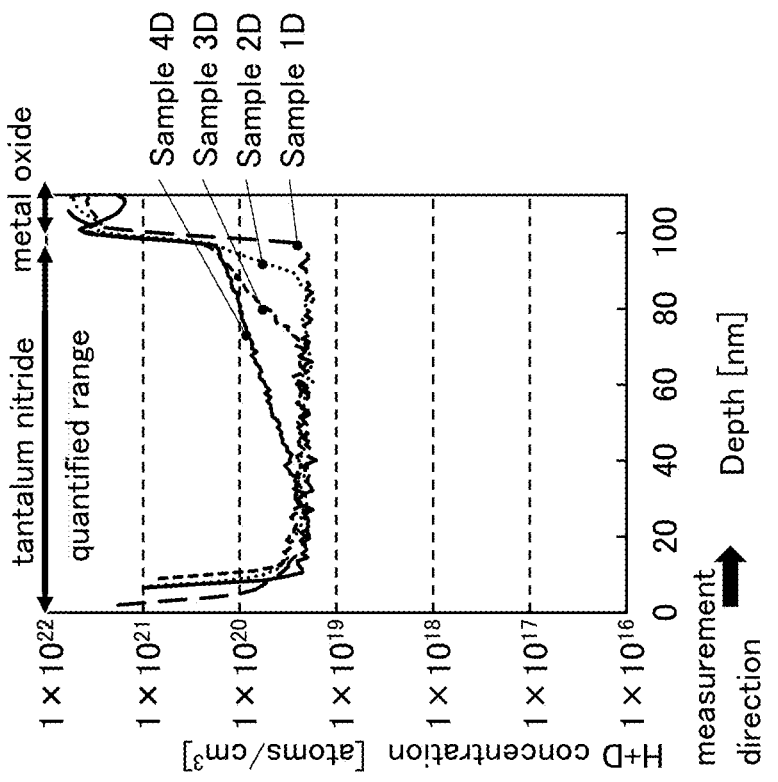
FIG. 24A shows the deuterium D concentration profile in tantalum nitride in the Example.
Figure 24B:
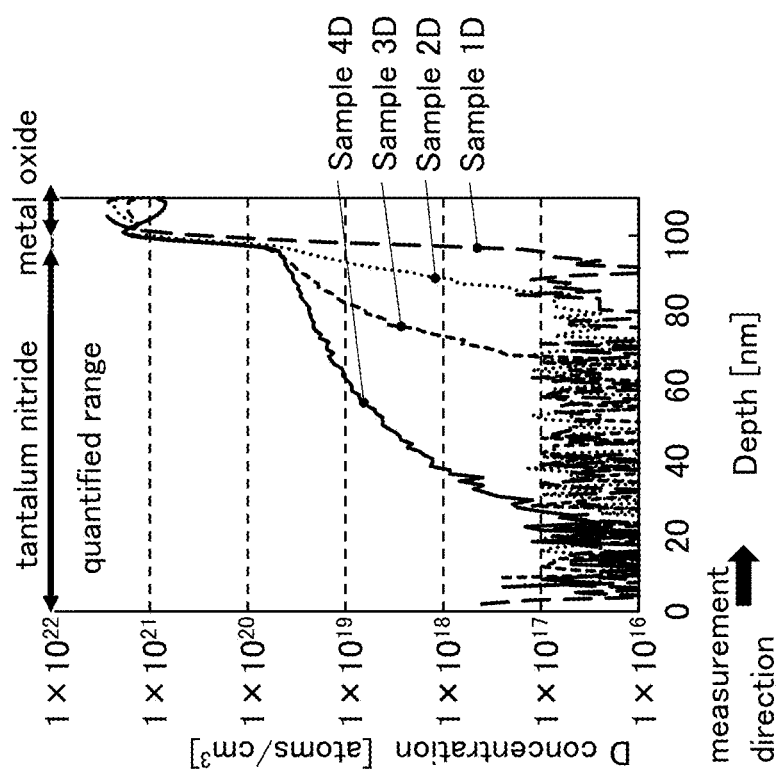
FIG. 24B shows the profile of the sum of the hydrogen H concentration and the deuterium D concentration in tantalum nitride in the Example.

FIG. 24A and FIG. 24B respectively show the deuterium (D) concentration and the sum of the hydrogen (H) concentration and the deuterium (D) concentration in tantalum nitride in each sample, which were obtained by the SIMS analysis.

FIG. 24A shows the deuterium (D) concentration in the tantalum nitride film in each of Sample 1D to Sample 4D. In FIG. 24A, the horizontal axis represents depth [nm] in the direction perpendicular to the film surface of the sample, and the vertical axis represents the deuterium (D) concentration [atoms/cm$^3$] in tantalum nitride. The long dashed line in FIG. 24A represents the deuterium (D) concentration profile in the tantalum nitride film of Sample 1D; the dotted line in FIG. 24A represents the deuterium (D) concentration profile in the tantalum nitride film of Sample 2D; the dashed line in FIG. 24A represents the deuterium (D) concentration profile in the tantalum nitride film of Sample 3D; and the solid line in FIG. 24A represents the deuterium (D) concentration profile in the tantalum nitride film of Sample 4D.

According to FIG. 24A, the diffusion (length) of deuterium (D) from the metal oxide film to the tantalum nitride film was the largest in Sample 4D followed by Sample 3D and Sample 2D. In particular, in Sample 4D, deuterium (D) in the metal oxide film was diffused into the tantalum nitride film within a range of approximately several tens of nanometers. These results reveal that as the temperature of the heat treatment became higher, a larger amount of deuterium (D) was diffused into the tantalum nitride film. That is, hydrogen in the metal oxide is likely to diffuse into tantalum nitride.

FIG. 24B shows the sum of the hydrogen (H) concentration and the deuterium (D) concentration in the tantalum nitride film in each of Sample 1D to Sample 4D. In FIG. 24B, the horizontal axis represents depth [nm] in the direction perpendicular to the film surface of the sample, and the vertical axis represents the sum of the hydrogen (H) concentration and the deuterium (D) concentration (H+D concentration) [atoms/cm$^3$] in tantalum nitride. The long dashed line in FIG. 24B represents the profile of the sum of the hydrogen (H) concentration and the deuterium (D) concentration in the tantalum nitride film of Sample 1D; the dotted line in FIG. 24B represents the profile of the sum of the hydrogen (H) concentration and the deuterium (D) concentration in the tantalum nitride film of Sample 2D; the dashed line in FIG. 24B represents the profile of the sum of the hydrogen (H) concentration and the deuterium (D) concentration in the tantalum nitride film of Sample 3D; and the solid line in FIG. 24B represents the profile of the sum of the hydrogen (H) concentration and the deuterium (D) concentration in the tantalum nitride film of Sample 4D.

FIG. 24B indicates that the heat treatment allows the tantalum nitride film to have a region with a hydrogen concentration higher than or equal to $2.0 \times 10^{19}$ atoms/cm$^3$.

Figure 25:
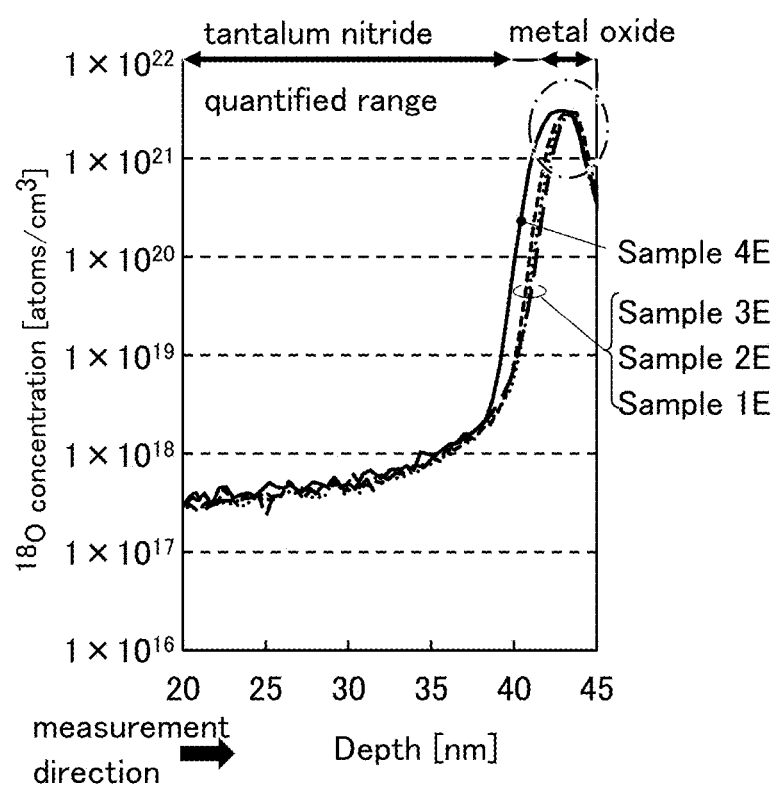
FIG. 25 shows the oxygen (18O) concentration profile in tantalum nitride in the Example.

Next, FIG. 25 shows the oxygen (180) concentration in tantalum nitride in each sample, which was obtained by the SIMS analysis.

FIG. 25 shows the oxygen (180) concentration in the tantalum nitride film in each of Sample 1E to Sample 4E. In FIG. 25, the horizontal axis represents depth [nm] in the direction perpendicular to the film surface of the sample, and the vertical axis represents the oxygen (180) concentration [atoms/cm$^3$] in tantalum nitride. The long dashed line in FIG. 25 represents the oxygen (180) concentration profile in the tantalum nitride film of Sample 1E; the dotted line in FIG. 25 represents the oxygen (180) concentration profile in the tantalum nitride film of Sample 2E; the dashed line in FIG. 25 represents the oxygen (180) concentration profile in the tantalum nitride film of Sample 3E; and the solid line in FIG. 25 represents the oxygen (180) concentration profile in the tantalum nitride film of Sample 4E. In a region (depth) surrounded by a dashed-dotted line in FIG. 25, the amount of detected 180 is saturated.

According to FIG. 25, in comparison with Sample 1E, oxygen (180) in the metal oxide film of Sample 4E was diffused into the tantalum nitride film within a range of approximately several nanometers by the second heat treatment. Also in comparison with Sample 1E, oxygen (180) in the metal oxide films of Sample 2E and Sample 3E was not much diffused into the tantalum nitride film even by the second heat treatment, i.e., the profiles of the oxygen (180) concentration in the tantalum nitride film were substantially the same among Sample 1E to Sample 3E.

The above results demonstrate that, when heat treatment at low temperatures (e.g., 350° C. or lower) is performed on the stacked-layer structure including a metal oxide and a tantalum nitride, hydrogen in the metal oxide diffuses into the tantalum nitride, oxygen in the metal oxide is less likely to diffuse into the tantalum nitride, and oxidation of the tantalum nitride or formation of a layer between the metal oxide and the tantalum nitride is less likely to progress. It is probable that at high temperatures (e.g., 400° C. or higher), hydrogen in the metal oxide first diffuses into the tantalum nitride and then oxygen in the metal oxide diffuses into the tantalum nitride, and oxidation of the tantalum nitride or formation of a layer between the metal oxide and the tantalum nitride progresses.

At least part of the structure, the method, and the like shown in this example can be implemented in appropriate combination with other embodiments and examples described in this specification.

REFERENCE NUMERALS

20: insulator, 20a: insulator, 20b: insulator, 30: oxide, 40: conductor, 40a: conductor, 40b: conductor, 42: conductor, 42a: conductor, 42b: conductor, 60: conductor, 100: capacitor, 101: region, 102: region, 110: conductor, 112: conductor, 114: insulator, 120: conductor, 130: insulator, 140: insulator, 150: insulator, 152: conductor, 153: conductor, 154: insulator, 156: insulator, 160: insulator, 200: transistor, 205: conductor, 208: insulator, 210: insulator, 212: insulator, 214: insulator, 216: insulator, 218: conductor, 222: insulator, 224: insulator, 230: oxide, 230a: oxide, 230A: oxide film, 230b: oxide, 230B: oxide film, 230c: oxide, 230C: oxide film, 231: region, 231a: region, 231b: region, 234: region, 240: conductor, 240a: conductor, 240b: conductor, 241: insulator, 241a: insulator, 241b: insulator, 242: conductor, 242a: conductor, 242a1: conductor, 242a2: conductor, 242A: conductive film, 242b: conductor, 242b1: conductor, 242b2: conductor, 242B: conductive layer, 250: insulator, 250A: insulating film, 254: insulator, 254A: insulating film, 260: conductor, 260a: conductor, 260A: conductive film, 260b: conductor, 260B: conductive film, 274: insulator, 275: insulator, 280: insulator, 282: insulator, 283: insulator, 284: insulator, 300: transistor, 311: substrate, 312: insulator, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a:

conductor, 440b: conductor, 442a: conductor, 442b: conductor, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring

What is claimed is:

1. A semiconductor device comprising:
a first gate electrode;
a first gate insulator over the first gate electrode;
an oxide semiconductor comprising a channel of a transistor over the first gate insulator;
a first conductor and a second conductor each over and in contact with the oxide semiconductor;
a first insulator over the first conductor and the second conductor;
a second insulator over the first insulator;
a second gate insulator in a first opening of the first insulator and the second insulator;
a second gate electrode over the second gate insulator and in the first opening; and
a third insulator in contact with a top surface of the second gate electrode, a top surface of the second gate insulator, and a top surface of the second insulator,
wherein the top surface of the second insulator, the top surface of the second gate insulator, and the top surface of the second gate electrode are aligned with each other,
wherein a first side surface of the first conductor is aligned with a first side surface of the oxide semiconductor,
wherein a first side surface of the second conductor is aligned with a second side surface of the oxide semiconductor, and
wherein each of the first conductor and the second conductor includes tantalum nitride.

2. The semiconductor device according to claim 1, wherein the oxide semiconductor includes indium.

3. The semiconductor device according to claim 1, wherein the oxide semiconductor comprises a first oxide semiconductor layer and a second oxide semiconductor layer over the first oxide semiconductor layer.

4. The semiconductor device according to claim 1, wherein the tantalum nitride has crystallinity.

5. The semiconductor device according to claim 1, wherein the first insulator covers a top surface and the first side surface of the first conductor, a top surface and the first side surface of the second conductor, and the first side surface and the second side surface of the oxide semiconductor.

6. The semiconductor device according to claim 1, wherein the first insulator includes aluminum oxide.

7. A semiconductor device comprising:
a first gate electrode;
an oxide semiconductor comprising a channel of a transistor over the first gate electrode;
a first conductor and a second conductor each over and in contact with the oxide semiconductor;
a first insulator over the first conductor and the second conductor;
a second insulator over the first insulator;
a second gate electrode in a first opening of the first insulator and the second insulator;
a third conductor electrically connected to the first conductor through a second opening of the first insulator and the second insulator;
a fourth conductor electrically connected to the second conductor through a third opening of the first insulator and the second insulator; and
a third insulator over the second insulator,
wherein a first side surface of the first conductor is aligned with a first side surface of the oxide semiconductor,
wherein a first side surface of the second conductor is aligned with a second side surface of the oxide semiconductor, and
wherein each of the first conductor and the second conductor includes tantalum nitride.

8. The semiconductor device according to claim 7, wherein the oxide semiconductor includes indium.

9. The semiconductor device according to claim 7, wherein the oxide semiconductor comprises a first oxide semiconductor layer and a second oxide semiconductor layer over the first oxide semiconductor layer.

10. The semiconductor device according to claim 7, wherein the tantalum nitride has crystallinity.

11. The semiconductor device according to claim 7, wherein the first insulator covers a top surface and the first side surface of the first conductor, a top surface and the first side surface of the second conductor, and the first side surface and the second side surface of the oxide semiconductor.

12. The semiconductor device according to claim 7, wherein the first insulator includes aluminum oxide.

* * * * *